US012757494B2

(12) United States Patent
Jeong et al.

(10) Patent No.: US 12,757,494 B2
(45) Date of Patent: Oct. 6, 2026

(54) LIGHT EMITTING DISPLAY DEVICE

(71) Applicant: Samsung Display Co., LTD., Yongin-si (KR)

(72) Inventors: Jun Ki Jeong, Yongin-si (KR); Hyun Joon Kim, Hwaseong-si (KR); Mee Hye Jung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/802,785

(22) Filed: Aug. 13, 2024

(65) Prior Publication Data

US 2024/0405031 A1 Dec. 5, 2024

Related U.S. Application Data

(63) Continuation of application No. 17/737,707, filed on May 5, 2022, now Pat. No. 12,080,724.

(30) Foreign Application Priority Data

May 6, 2021 (KR) ........................ 10-2021-0058692

(51) Int. Cl.
*H10D 86/60* (2025.01)
*G09G 3/32* (2016.01)
(Continued)

(52) U.S. Cl.
CPC ............... *H10D 86/60* (2025.01); *G09G 3/32* (2013.01); *H10D 86/451* (2025.01);
(Continued)

(58) Field of Classification Search
CPC ... H01L 27/1248; H01L 25/167; H01L 24/05; H01L 33/62; H01L 2224/05027;
(Continued)

(56) References Cited

U.S. PATENT DOCUMENTS 8,279,145 B2 10/2012 Cok et al.
9,575,241 B2 2/2017 Park
(Continued)

FOREIGN PATENT DOCUMENTS

CN 110010779 A 7/2019
CN 111129045 A 5/2020
(Continued)

OTHER PUBLICATIONS

U.S. Appl. No. 17/737,707, filed May 5, 2022.
(Continued)

*Primary Examiner* — Kenneth B Lee, Jr.
(74) *Attorney, Agent, or Firm* — Womble Bond Dickinson (US) LLP

(57) ABSTRACT

A light emitting display device includes a pixel circuit unit, a data distribution unit, a plurality of signal generating units, a unit light emitting diode, and a dummy opening. The pixel circuit unit is configured to generate an output current. The data distribution unit is configured to apply a data voltage to the pixel circuit unit through a data line. The plurality of signal generating units are respectively configured to apply a scan signal and a light emission control signal to the pixel circuit unit through a plurality of signal lines. The unit light emitting diode is configured to receive the output current of the pixel circuit unit and is attached to the pixel circuit unit. The dummy opening is formed in the region where the pixel circuit unit, the data distribution unit, and a plurality of signal generating units are not positioned.

13 Claims, 29 Drawing Sheets

(51) Int. Cl.
*H10D 86/40* (2025.01)
*H10W 90/00* (2026.01)
*H10H 20/857* (2025.01)
*H10W 72/90* (2026.01)

(52) U.S. Cl.
CPC .... *H10W 90/00* (2026.01); *G09G 2300/0439* (2013.01); *G09G 2300/0819* (2013.01); *G09G 2300/0842* (2013.01); *G09G 2310/0243* (2013.01); *G09G 2310/08* (2013.01); *G09G 2330/04* (2013.01); *G09G 2330/12* (2013.01); *H10H 20/857* (2025.01); *H10W 72/90* (2026.01); *H10W 72/923* (2026.01); *H10W 72/9415* (2026.01); *H10W 72/942* (2026.01)

(58) Field of Classification Search
CPC . H01L 2224/05073; H01L 2224/00562; H01L 2224/05573; G09G 3/32; G09G 2300/0439; G09G 2300/0819; G09G 2300/0842; G09G 2310/0243; G09G 2310/08; G09G 2330/04; G09G 2330/12
See application file for complete search history.

(56) References Cited

U.S. PATENT DOCUMENTS

| | | | | |
|---|---|---|---|---|
| 10,128,308 | B1 | 11/2018 | Shin et al. | |
| 10,983,381 | B2 | 4/2021 | Jeong et al. | |
| 11,348,963 | B2 | 5/2022 | Kim et al. | |
| 11,514,834 | B2 | 11/2022 | Jeong et al. | |
| 2010/0090340 | A1 | 4/2010 | Summerfelt et al. | |
| 2015/0108482 | A1 | 4/2015 | Kim | |
| 2016/0217735 | A1* | 7/2016 | Park | G09G 3/2003 |
| 2016/0233253 | A1 | 8/2016 | Kim | |
| 2018/0151660 | A1* | 5/2018 | Kim | H10K 59/88 |
| 2018/0322831 | A1* | 11/2018 | Kim | G09G 3/3266 |
| 2019/0198811 | A1 | 6/2019 | Choi et al. | |
| 2019/0280072 | A1 | 9/2019 | Jeong et al. | |
| 2020/0135796 | A1 | 4/2020 | Kim et al. | |
| 2020/0159054 | A1 | 5/2020 | Jeong et al. | |
| 2020/0258453 | A1* | 8/2020 | Im | H10K 59/1213 |
| 2020/0350340 | A1 | 11/2020 | Zhang et al. | |
| 2021/0050403 | A1 | 2/2021 | Lee et al. | |
| 2021/0319750 | A1 | 10/2021 | Ueno | |

FOREIGN PATENT DOCUMENTS

| | | | |
|---|---|---|---|
| CN | 111210750 | A | 5/2020 |
| CN | 111554736 | A | 8/2020 |
| CN | 112397538 | A | 2/2021 |
| EP | 3736870 | | 11/2020 |
| KR | 10-2016-0099999 | | 8/2016 |
| KR | 10-2017-0080962 | | 7/2017 |
| KR | 10-2017-0094930 | | 8/2017 |
| KR | 10-2018-0119273 | | 11/2018 |
| KR | 10-2019-0107254 | A | 9/2019 |
| KR | 10-2019-0113535 | | 10/2019 |
| KR | 10-2020-0049311 | | 5/2020 |
| KR | 10-2020-0060595 | | 6/2020 |
| KR | 10-2020-0098750 | | 8/2020 |
| WO | 2020/059071 | A1 | 3/2020 |

OTHER PUBLICATIONS

Korean Office Action for Korean Patent Application or Patent No. 10-2021-0058692, dated Oct. 23, 2024.
Extended European Partial Search Report dated Sep. 19, 2022, issued to European Patent Application No. 22171876.0.
European Search Report dated Dec. 22, 2022, issued to European Patent Application No. 22171876.

* cited by examiner

LIGHT EMITTING DISPLAY DEVICE

CROSS-REFERENCE TO RELATED APPLICATIONS

This is a continuation application of U.S. patent application Ser. No. 17/737,707 filed May 5, 2022, the disclosure of which is incorporated herein by reference in its entirety. U.S. patent application Ser. No. 17/737,707 claims priority to and the benefit of Korean Patent Application No. 10-2021-0058692, filed May 6, 2021, which is hereby incorporated by reference for all purposes as if fully set forth herein.

BACKGROUND

Field

One or more embodiments generally relate to a light emitting display device, and, more particularly, to a light emitting display device using a light emitting diode (LED).

Discussion

A display device is a device for displaying an image, and a liquid crystal display and a light emitting display device are examples of display devices. However, various display devices have been developed, and a display device including an inorganic light emitting diode (LED) is also being developed. A display device using an inorganic LED has a merit in that it does not have a drawback of a light emitting display device, in which the lifespan decreases sharply when exposed to moisture or air. As such, it is not necessary to form an encapsulation layer, and accordingly, an inorganic LED may be used in an outdoor environment where temperature(s) may be high or low in the space where it is used or precipitation (e.g., rain, snow, etc.) may be present. In addition, a large-screen display device is being developed, and may be developed to be used in outdoor advertisements or performance halls so that images may be recognized from a distance.

The above information disclosed in this section is only for understanding the background of the inventive concepts, and, therefore, may contain information that does not form prior art.

SUMMARY

One or more embodiments are capable of providing a light emitting display device in which a thin film transistor does not have different characteristics depending on its position.

One or more embodiments are capable of providing a light emitting display device that can be used without issues typically associated with an outdoor environment.

Additional aspects will be set forth in the detailed description which follows, and, in part, will be apparent from the disclosure, or may be learned by practice of the inventive concepts.

According to an embodiment, a light emitting display device includes a pixel circuit unit, a data distribution unit, a plurality of signal generating units, a unit light emitting diode, and a dummy opening. The pixel circuit unit is configured to generate an output current. The data distribution unit is configured to apply a data voltage to the pixel circuit unit through a data line. The plurality of signal generating units are respectively configured to apply a scan signal and a light emission control signal to the pixel circuit unit through a plurality of signal lines. The unit light emitting diode is configured to receive the output current of the pixel circuit unit and is attached to the pixel circuit unit. The dummy opening is formed in the region where the pixel circuit unit, the data distribution unit, and a plurality of signal generating units are not positioned.

According to an embodiment, a light emitting display device includes a plurality of light emitting display devices attached to each other. At least of the plurality of the light emitting display devices includes a pixel circuit unit, a data distribution unit, a plurality of signal generating units, a unit light emitting diode, and a dummy opening. The pixel circuit unit is configured to generate an output current. The data distribution unit is configured to apply a data voltage to the pixel circuit unit through a data line. The plurality of signal generating units are respectively configured to apply a scan signal and a light emission control signal to the pixel circuit unit through a plurality of signal lines. The unit light emitting diode is configured to receive the output current of the pixel circuit unit and is attached to the pixel circuit unit. The dummy opening is formed in a region where the pixel circuit unit, the data distribution unit, and a plurality of signal generating units are not positioned.

According to various embodiments, by forming the dummy opening in a region where the pixel circuit unit for driving the light emitting diode (LED) or the driver unit for driving the pixel circuit unit are not positioned in the light emitting display device, when forming a semiconductor layer included in a thin film transistor, an issue that hydrogen does not fall (or expel) out depending on the position of the thin film transistor is eliminated (or at least mitigated) so that the characteristics of the thin film transistor are not different depending on its position and may be uniform (or relatively uniform) throughout the light emitting display device. In addition, in the light emitting display device, the characteristics of the thin film transistor may be uniform (or relatively uniform) even at positions with different integration degrees of components.

According to various embodiments, even if the light emitting display device having uniform thin film transistors depending on their positions is installed in an outdoor environment where a temperature may be high or low, where it may rain or snow, deterioration of display quality due to characteristic deterioration of the thin film transistor does not appear or is at least mitigated.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF SOME EMBODIMENTS

Figure 1:
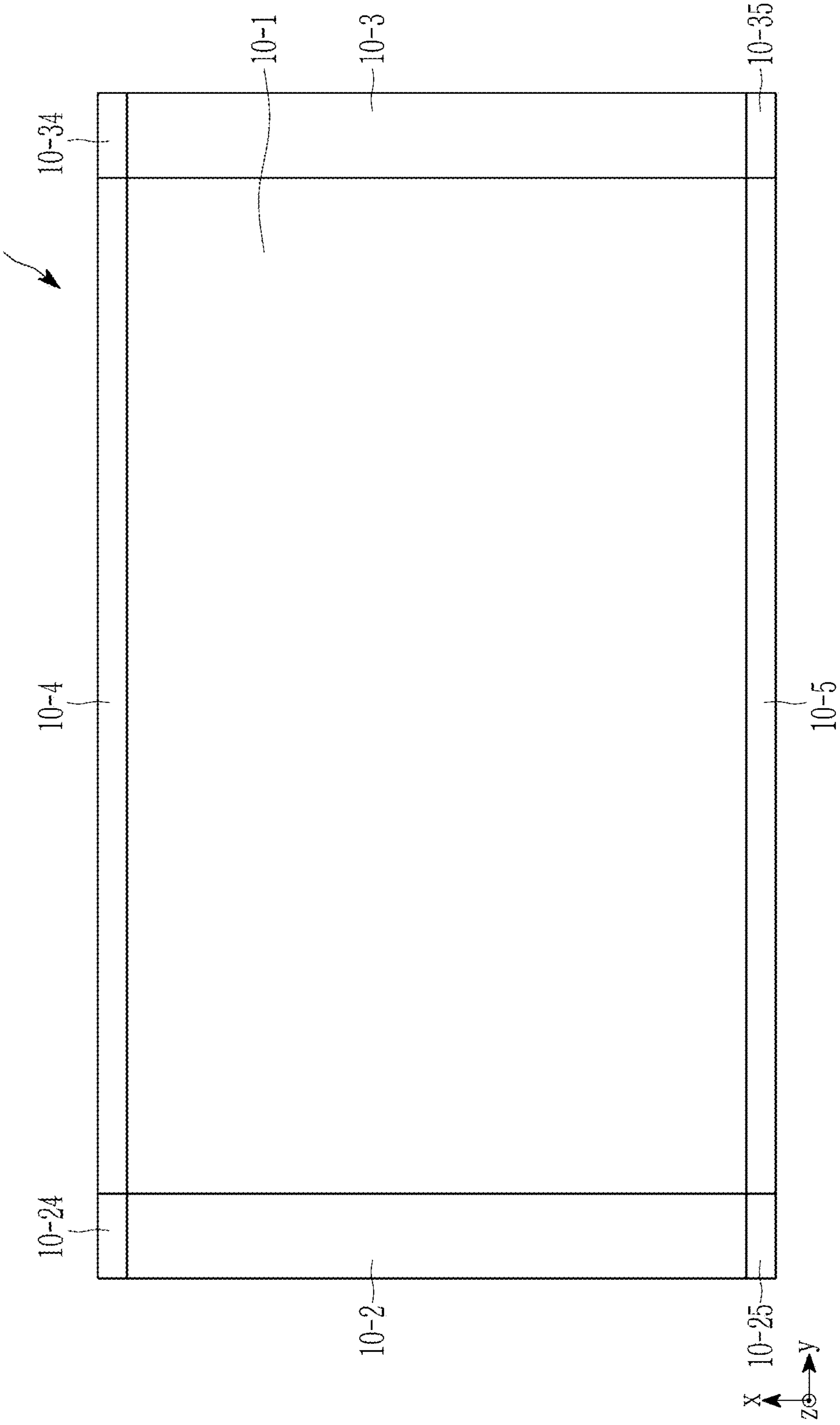
FIG. 1 is a division region diagram of a light emitting display device according to an embodiment.

In the following description, for the purposes of explanation, numerous specific details are set forth to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Further, throughout the disclosure, the phrase "in a plan view" means viewing a target portion from the top, and the phrase "in a cross-sectional view" means viewing a cross-section formed by vertically cutting a target portion from the side.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

First, regions of a divided light emitting display device are described with reference to FIG. 1, and a structure of each region is described in more detail with reference to FIGS. 2 to 6.

FIG. 1 is a division region diagram of a light emitting display device according to an embodiment.

One light emitting display device 10 may be divided into five regions, and may be divided into a central region 10-1, a left region 10-2, a right region 10-3, an upper region 10-4, and a lower region 10-5. In addition, a corner region where various regions meet each other is further included, and an upper left region 10-24 of a corner region where the left region 10-2 and the upper region 10-4 meet each other, an upper right region 10-34 of a corner region where the right region 10-3 and the upper region 10-4 meet each other, a lower left region 10-25 of a corner region where the left region 10-2 and the lower region 10-5 meet each other, and a lower right region 10-35 of a corner region where the right region 10-3 and the lower region 10-5 meet each other are further included. Each corner region has all characteristics of both regions by having each characteristic of the overlapping region among the left region 10-2, the right region 10-3, the upper region 10-4, and the lower region 10-5.

In FIG. 1, although the left region 10-2, the right region 10-3, the upper region 10-4, the lower region 10-5, and each corner regions 10-24, 10-25, 10-34, and 10-35 are shown relatively large, they may be sized in any suitable manner, such as very narrow regions. For instance, the upper region 10-4 and the lower region 10-5 may be very narrow and may include only one pixel row or two pixel rows. The left region 10-2 and the right region 10-3 may include more than two pixel columns and only about five pixel columns. Here, the pixel (referring to PX in FIG. 2), which is a standard for a pixel column and a pixel row, may be based on a unit light emitting diode (LED) including a light emitting diode (LED) of three primary colors (referring to LDU in FIG. 2) or a plurality of pixel circuit units (referring to PXC in FIG. 2) for driving the unit light emitting diode (LED), or may also be based on a structure in which a unit light emitting diode (LED) LDU and a plurality of pixel circuit units PXC are combined.

The left region 10-2 and the right region 10-3 are also referred to as driving regions, and the upper region 10-4 is also referred to as a data distribution region. Here, the central region 10-1 is a region in which only the pixel PX is positioned so that the unit light emitting diode (LED) LDU and a plurality of pixel circuit units PXC are arranged. In the upper region 10-4, the data distribution unit is formed with the pixel PX. The data distribution unit may include a demuxer (Demux) that distributes and applies the data voltage Dm applied to the pixel circuit unit PXC to a plurality of data lines 171 (see, e.g., FIG. 5). In the left region 10-2 and the right region 10-3, together with the pixel PX, a plurality of signal generating units for generating signals other than the data voltage Dm applied to the pixel circuit unit PXC are formed. A plurality of signal generating units may include various signal generating units for each of various embodiments, and the following embodiment includes a light emission signal generating unit and a scan signal generating unit. In addition, the following embodiment is focused on an embodiment including three scan signal generating units.

Since the corner region includes the characteristics of both regions, the left upper region 10-24, where the upper region 10-4 and the left region 10-2 meet, includes both the data distribution unit and the signal generating unit along with the pixel PX.

Also, in the following embodiment, at the region where a plurality of unit light emitting diodes (LED) LDU are not attached (or otherwise formed) and positioned, an opening (referring to 60 of FIG. 5 and FIG. 6) is additionally formed along with the pixel circuit unit PXC and the signal generating unit. Hereinafter, a region in which the dummy opening 60 can be positioned is referred to as an opening forming region 60A. According to the embodiment, the dummy opening 60 may be positioned even in a part other than the opening forming region 60A. The part where the dummy opening 60 is positioned may be the region where the pixel circuit unit PXC, the data distribution unit, and a plurality of signal generating units are positioned.

Hereinafter, the structure of each region is described with reference to FIGS. 2 to 4, and the arrangement structure of the pixel PX in the central region 10-1 is first described with reference to FIG. 2.

Figure 2:
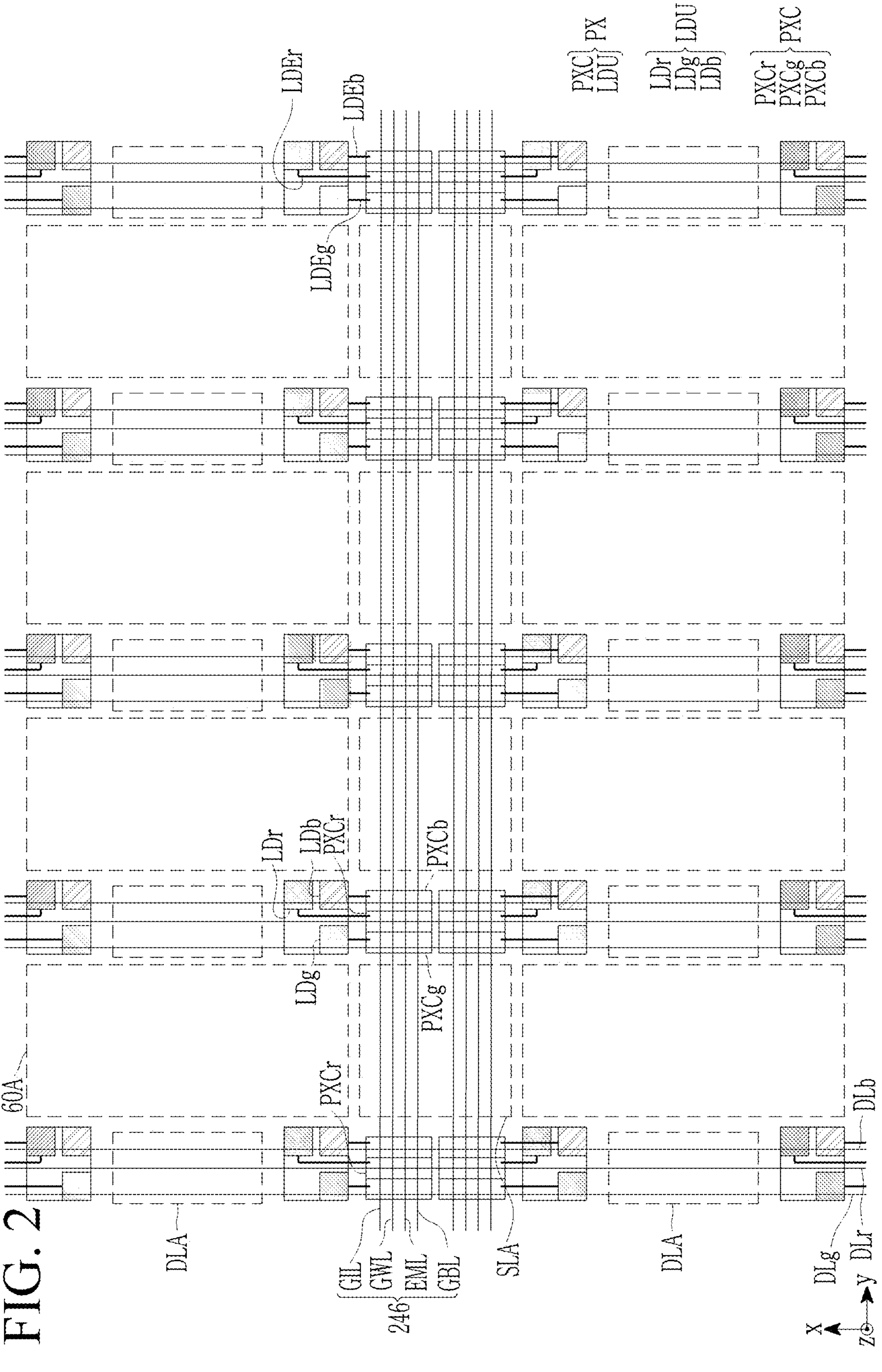
FIG. 2 is a layout view of a center region of a light emitting display device according to an embodiment.

FIG. 2 is a layout view of a central region of a light emitting display device according to an embodiment.

In the central region 10-1 of the light emitting display device 10, the unit light emitting diode (LED) LDU and the pixel circuit unit PXC configuring the pixel PX are only formed, and the data distribution unit and/or the signal generating unit are not included.

The pixel PX includes one unit light emitting diode (LED) LDU and three pixel circuit units PXC. The unit light emitting diode (LED) LDU includes the light emitting diodes (LEDs) LDr, LDg, and LDb of red, green, and blue. According to an embodiment, the unit light emitting diode (LED) LDU may include the light emitting diode (LED) of various color combinations. The light emitting diode (LED) of each color included in the unit light emitting diode (LED) LDU receives current from one pixel circuit unit PXC and displays the luminance depending on a magnitude of the current. As a result, the pixel circuit unit PXC and the light emitting diode (LED) correspond one-to-one, and the unit light emitting diode (LED) LDU has three light emitting diodes (LED), thereby including three pixel circuit units PXC (PXCr, PXCg, and PXCb). However, the number of the light emitting diodes (LED) and the pixel circuit units PXC included in one pixel PX may be various for each embodiment. Also, each light emitting diode (LED) LDr, LDg, and LDb included in the unit light emitting diode (LED) LDU may be a light emitting diode (LED) including an inorganic emission layer. The inorganic light emitting diode (LED) has a merit of maintaining a characteristic even when being exposed to moisture or air compared to an embodiment using an organic emission layer, thereby having a characteristic that is suitable for the light emitting display device to be used outdoors.

In the light emitting display device 10, a plurality of unit light emitting diodes (LED) LDU may be arranged along a row and a column with a predetermined interval. One unit light emitting diode (LED) LDU may have a square shape and may be arranged in a 2×2 matrix, and in some embodiments, the light emitting diode (LED) is not arranged in the first row and the first column, the red light emitting diode (LED) LDr is positioned in the first row and the second column, the green light emitting diode (LED) LDg is positioned in the second row and the first column, and the blue light emitting diode (LED) LDb is positioned in the second row and the second column. The unit light emitting diode (LED) LDU may be integrally formed as one by gathering the light emitting diodes (LED) LDr, LDg, and LDb of red, green, and blue, and an anode pad and a cathode pad connected to each unit light emitting diode (LED) LDr, LDg, and LDb may be positioned on the lower surface. The anode pad may be formed for each light emitting diode (LED) LDr, LDg, and LDb, and the cathode pad may be formed as one such that the cathode pad is associated with each light emitting diode (LED) LDr, LDg, and LDb. The anode pad of the unit light emitting diode (LED) LDU is formed on the panel and is electrically connected one-to-one to a diode connection part LDEr, LDEg, and LDEb extending from each pixel circuit unit PXCr, PXCg, and PXCb, thereby receiving the output current of each pixel circuit unit PXCr, PXCg, and PXCb.

The pixel circuit unit PXC includes the red pixel circuit unit PXCr, the green pixel circuit unit PXCg, and the blue pixel circuit unit PXCb, and is electrically connected to the red light emitting diode (LED) LDr, the green light emitting diode (LED) LDg, and the blue light emitting diode (LED) LDb through the diode connection parts LDEr, LDEg, and LDEb, respectively. For instance, referring to red as an example, the output current generated from the red pixel circuit unit PXCr is transmitted to a red anode pad positioned on the back of the unit light emitting diode (LED) LDU through the red diode connection part (LDEr), and as a result, the output current is transmitted to the red light emitting diode (LED) LDr. The current is transmitted in the same way for other colors. Here, the red diode connection part LDEr, the green diode connection part LDEg, and the blue diode connection part LDEb include the red anode corresponding pad, the green anode corresponding pad, and the blue anode corresponding pad, respectively, thereby being electrically connected to the red anode pad, the green anode pad, and the blue anode pad positioned on the back of the unit light emitting diode (LED) LDU, respectively. For reference, each red anode corresponding pad, green anode corresponding pad, and blue anode corresponding pad included in the red diode connection part LDEr, the green diode connection part LDEg, and the blue diode connection part LDEb may have a structure exposed to the uppermost layer like the anode corresponding pads LDA1 and LDA2 of FIG. 6.

The pixel circuit unit PXC must receive a signal from the outside to generate the output current, and in some embodiments, the pixel circuit unit PXC is connected to data lines DLr, DLg, and DLb and signal lines GIL, GWL, EML, and GBL. According to an embodiment, the number and kind of the signal lines may be changed and a voltage, such as a driving voltage ELVDD, may also be transmitted to the pixel circuit unit PXC.

The data lines DLr, DLg, and DLb, as shown in FIG. 2, are connected to each pixel circuit unit PXCr, PXCg, and PXCb on a one-to-one basis while extending along the first direction (the x-axis direction). For example, the red data line DLr is only electrically connected to the red pixel circuit unit PXCr, the green data line DLg is only electrically connected to the green pixel circuit unit PXCg, and the blue data line DLb is only electrically connected to the blue pixel circuit unit PXCb. As a result, each pixel circuit unit PXCr, PXCg, and PXCb may receive different data voltages. On the other hand, the signal lines GIL, GWL, EML, and GBL extend along a second direction (a y-axis direction) and are commonly connected to all pixel circuit units PXCr, PXCg, and PXCb disposed in one row. As a result, all pixel circuit units PXCr, PXCg, and PXCb disposed in one row may receive the signal at (or substantially at) the same timing.

The data lines DLr, DLg, and DLb pass not only through the region where the pixel circuit unit PXC and the unit light emitting diode (LED) LDU are formed, but also pass through the region where the pixel circuit unit PXC and the unit light emitting diode (LED) LDU are not formed, and this region is referred to as a data line extending region DLA hereinafter. In the data line extending region DLA, the pixel circuit unit PXC and the unit light emitting diode (LED) LDU are not positioned and the data lines DLr, DLg, and DLb may only be positioned.

Also, the signal lines GIL, GWL, EML, and GBL pass through the region where the pixel circuit unit PXC is formed, but also pass through the region where the pixel circuit unit PXC is not positioned, and this region is referred to as a signal line extending region SLA hereinafter. In the signal line extending region SLA, the pixel circuit unit PXC is not positioned and only the signal lines GIL, GWL, EML, and GBL may be positioned.

Based on such a basic structure, the arrangement relationship of the central region 10-1 of the light emitting display device 10 shown in FIG. 2 will now be described in more detail.

According to FIG. 2, along the first direction (the x-axis direction) in which the data lines DLr, DLg, and DLb extend, the unit light emitting diode (LED) LDU, the pixel circuit unit PXC, the pixel circuit unit PXC of the next row, the unit light emitting diode (LED) LDU of the next row, and the data line extending region DLA are sequentially positioned. The equally repeated structure from the unit light emitting diode (LED) LDU is formed. For example, a unit pixel arrangement structure in which the unit light emitting diode (LED) LDU of one row is positioned on both sides based on the pixel circuit unit PXC of two rows is formed, the unit pixel arrangement structure is formed repeatedly in the first direction (the x-axis direction), and the data line extending region DLA is positioned between the unit pixel arrangement structures. The unit pixel arrangement structure has a structure in which the pixel circuit unit PXC is arranged in two rows, and the unit light emitting diode (LED) LDU electrically connected to the pixel circuit unit PXC of one row is positioned one row by one row on both sides of the pixel circuit unit PXC of two rows. As a result, the data line extending region DLA is respectively positioned outside the unit light emitting diode (LED) LDU of one row on both sides of the pixel circuit unit PXC of two rows.

Also, in the central region 10-1 of the light emitting display device 10, the pixel circuit unit PXC and the signal line extending region SLA are repeatedly formed along the second direction (the y-axis direction) in which the signal lines GIL, GWL, EML, and GBL extend. For reference, the signal applied to each signal line GIL, GWL, EML, and GBL may be generated from the left region 10-2 and/or the right region 10-3 of the light emitting display device 10.

Referring to FIG. 2, in the central region 10-1, an opening forming region 60A where the dummy opening (referring to 60 of FIG. 5/FIG. 6) may be formed may be positioned at the region where the unit light emitting diode (LED) LDU, the pixel circuit unit PXC, the data line extending region DLA, and the signal line extending region SLA are not positioned.

The dummy opening 60 is formed to prevent the characteristic of the semiconductor layer of the thin film transistor included in the pixel circuit unit PXC from being different depending on the position. For instance, by the dummy opening 60 positioned around the pixel circuit unit PXC, when forming the semiconductor layer included in the thin film transistor, it is formed to remove the characteristic change that occurs while hydrogen, etc., is not discharged depending on the position. As a result, hydrogen is properly eliminated in the semiconductor layer manufacturing process so that the characteristics of the thin film transistor are uniform and not different depending on the position.

Figure 3:
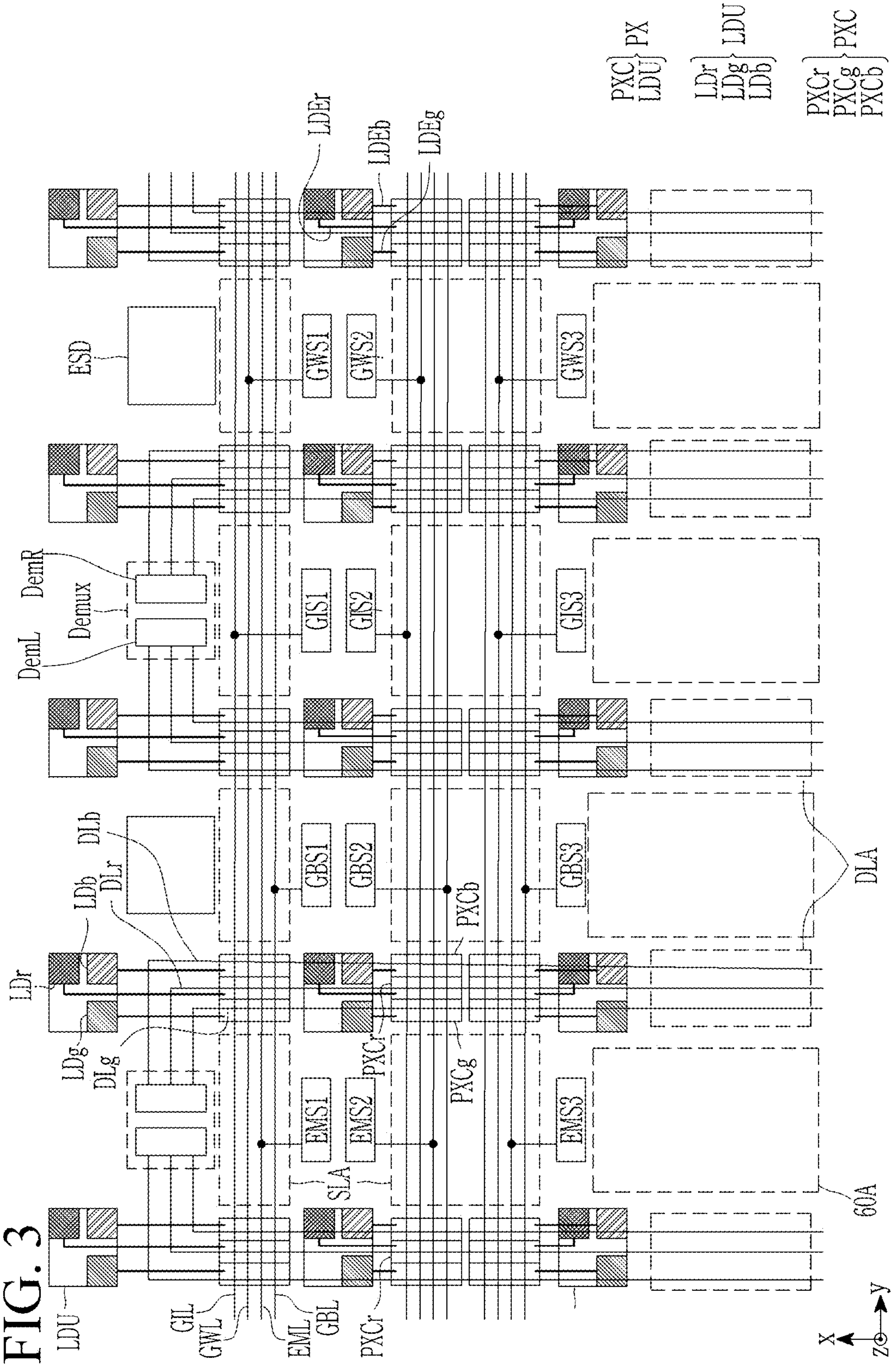
FIG. 3 is an upper layout view of a driving region of a light emitting display device according to an embodiment.
Figure 4:
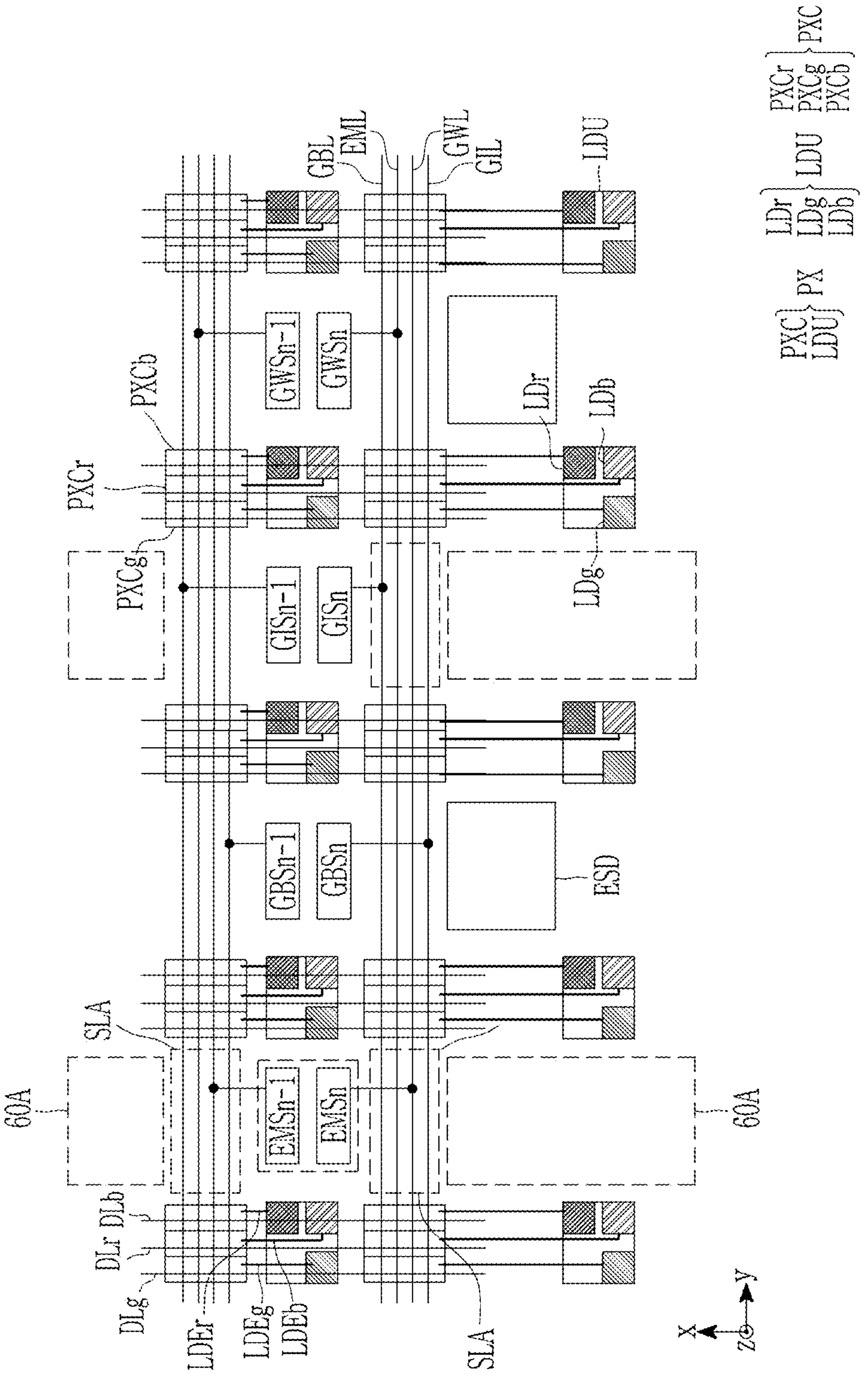
FIG. 4 is a lower layout view of a driving region of a light emitting display device according to an embodiment.

When referring to FIGS. 3 and 4 rather than the central region 10-1 shown in FIG. 2, the left region 10-2, the upper region 10-4, the lower region 10-5, and the right region 10-3 have a relatively high degree of device integration. If there is such a difference in the degree of the integration, the difference in hydrogen accumulated in the semiconductor may be revealed more clearly. However, in various embodiments, the dummy opening 60 is formed so that hydrogen does not accumulate in the semiconductor, so that even if there is the difference in the degree of the integration, the characteristic of the transistor does not differ.

According to an embodiment, the dummy opening 60 may be formed in the data line extending region DLA or the signal line extending region SLA (referring to FIG. 5) in addition to the opening forming region 60A of FIG. 2, and according to an embodiment, the dummy opening 60 may also be positioned at the lower part of the part where the unit light emitting diode (LED) LDU is attached.

Also, the size and interval of each part shown in FIG. 2 may be variously changed according to the embodiment. For example, the size and interval of each part shown in FIG. 2 are different from the actual part such that the size and interval may be different from that of FIG. 2 in the actual structure.

According to an embodiment, the unit light emitting diode (LED) LDU is positioned with the constant interval of the first direction (the x-axis direction) and the second direction (the y-axis direction) so that four adjacent unit light emitting diodes (LED) LDU may be arranged in a square. The interval of the adjacent unit light emitting diodes (LED) LDU in the first direction (the x-axis direction) and/or the second direction (the y-axis direction) may be one time or more to less than 2.5 times based on the width of the unit light emitting diode (LED) LDU in the first direction (the x-axis direction) or the second direction (the y-axis direction). In this case, the unit light emitting diode (LED) LDU may have a length/width of several μm to several tens of μm.

The width of the pixel circuit unit PXC and the data line extending region DLA in the second direction (the y-axis direction) may be the same as the width of the unit light emitting diode (LED) LDU in the second direction (the y-axis direction). The width of the pixel circuit unit PXC in the first direction (the x-axis direction) may be more than 0.5 times and less than 1.25 times of the width of the unit light emitting diode (LED) LDU in the first direction (the x-axis direction) so that if the widths of the first direction (the x-axis direction) of the pixel circuit unit PXC in the two rows are summed, it may be 1 time or more to 2.5 times or less of the width of the unit light emitting diode (LED) LDU in the first direction (the x-axis direction). The width of the first direction (the x-axis direction) of the data line extending region DLA may be greater than or equal to 1 time and less than or equal to 2.5 times the width of the first direction (the x-axis direction) of the unit light emitting diode (LED) LDU.

The width of the signal line extending region SLA in the first direction (the x-axis direction) and the second direction (the y-axis direction) may be greater than or equal to 1 time and less than or equal to 2.5 times based on the width of the unit light emitting diode (LED) LDU in the first direction (the x-axis direction) and the second direction (the y-axis direction).

However, according to an embodiment, the unit light emitting diode (LED) LDU may have a nanometer (nm) unit, that is, a length/width of several nm or more and several hundred nm, and the size relationships and the intervals of the unit light emitting diode (LED) LDU from the other parts may be variously changed.

In the above, the structure of the central region 10-1 was examined using FIG. 2.

Hereinafter, the structure of the upper region of the left upper region 10-24, that is, the left driving region 10-2, is described in more detail with reference to FIG. 3.

FIG. 3 is an upper layout view of a driving region of a light emitting display device according to an embodiment.

The left upper region 10-24 of the display device 10 includes each of the characteristics of the left region 10-2 and the upper region 10-4 in the opening forming region 60A of the central region 10-1 in addition to the structure of the central region 10-1. For instance, the left upper region 10-24, in addition to the unit light emitting diode (LED) LDU, the pixel circuit unit PXC, the data line extending region DLA, and the signal line extending region SLA formed in the central region 10-1 shown in FIG. 2, includes a plurality of signal generating units formed in the left region 10-2 and a data distribution unit including the demuxer Demux and a static electricity prevention unit ESD, which are formed in the upper region 10-4. Here, a plurality of signal generating units are parts for generating signals applied to each signal line GIL, GWL, EML, and GBL, and includes stages GWS1, GWS2, and GWS3 for a first scan signal for generating a signal applied to the first scan line GWL, stages GIS1, GIS2, and GIS3 for a second scan signal for generating a signal applied to the second scan line GIL, stages GBS1, GBS2, and GBS3 for a bypass signal for generating a signal applied to a bypass control line GBL, and stages EMS1, EMS2, and EMS3 for a light emission signal for generating a signal applied to a light emission signal line EML, and the stages for each signal are formed along the first direction (the x-axis direction).

First, the data distribution unit including the demuxer Demux and the static electricity prevention unit ESD, which are formed in the upper region 10-4, will be described.

The demuxer Demux and the static electricity prevention unit ESD are positioned in the row between the first row unit light emitting diode (LED) LDU and the first row pixel circuit unit PXC in the second direction (the y-axis direction) and positioned in the column between two adjacent unit light emitting diodes (LED) LDU in the first direction (the x-axis direction). Also, the demuxer Demux and the static electricity prevention unit ESD are alternately disposed in the first direction (the x-axis direction) so that the static electricity prevention unit ESD is positioned between the second column unit light emitting diode (LED) LDU and the third column unit light emitting diode (LED) LDU if the demuxer Demux is positioned between the first column unit light emitting diode (LED) LDU and the second column unit light emitting diode (LED) LDU.

A plurality of demuxers Demux are referred to as data distribution units, one demuxer Demux includes two sub-demuxers DemL and DemR, and each sub-demuxer DemL and DemR is connected to three data line data lines DLr, DLg, and DLb. One of sub-demuxers DemL and DemR may divide the data voltage transmitted through one wire connected to the input side depending on a time to be divided and transmitted into three data lines DLr, DLg, and DLb. As a result, one demuxer Demux may transmit the data voltage to the pixel circuit unit PXC in two columns.

The static electricity prevention unit ESD is connected to the data lines DLr, DLg, and DLb or other voltage lines so that elements such as the thin film transistors of the display panel are not damaged by static electricity generated during the manufacturing process. After that, when the manufacturing process is completed, the static electricity prevention unit ESD is electrically separated from the connected lines.

Hereinafter, a plurality of signal generating units according to some embodiments will be described.

A plurality of signal generating units are disposed on the same row as the unit light emitting diode (LED) LDU in the second direction (the y-axis direction) and disposed between the adjacent signal line extending regions SLA in the first direction (the x-axis direction). One or more stages may be formed in the signal generating unit formed in the position corresponding to one unit light emitting diode (LED) LDU, and are each connected to the adjacent signal lines GIL, GWL, EML, and GBL.

For example, referring to FIG. 2, along the first direction (the x-axis direction) in which the data lines DLr, DLg, and DLb extend, since the data line extending region DLA, the unit light emitting diode (LED) LDU, the pixel circuit unit PXC, the next row pixel circuit unit PXC, the next row unit light emitting diode (LED) LDU, and the data line extending region DLA are sequentially positioned, the stage is formed one-by-one beside the unit light emitting diode (LED) LDU and the next row unit light emitting diode (LED) LDU, respectively. As a result, the stage adjacent to the side of the unit light emitting diode (LED) LDU positioned thereon is connected to the signal line connected to the pixel circuit unit PXC disposed upward among the pixel circuit units PXC, and the stage adjacent to the side of the next row unit light emitting diode (LED) LDU positioned below is connected to the signal line connected to the next row pixel circuit unit PXC. Therefore, in the basic structure, only one stage may be positioned next to the unit light emitting diode (LED) LDU.

However, again referring to FIG. 3, in the left upper region 10-24, the first row pixel circuit unit PXC is formed to apply the signal to the first row unit light emitting diode (LED) LDU positioned in the upper region 10-4, but the first row unit light emitting diode (LED) LDU and the first row pixel circuit unit PXC are not positioned adjacent to each other like the other pixels. For instance, to reduce the non-display area by forming the first row unit light emitting diode (LED) LDU before the demuxer Demux and the static electricity prevention unit ESD, the first row pixel circuit unit PXC is positioned directly above the second row unit light emitting diode (LED) LDU. In this case, the diode connection parts LDEr, LDEg, and LDEb connecting the first row pixel circuit unit PXC and the first row unit light emitting diode (LED) LDU are extended.

In addition, since the signal lines GIL, GWL, EML, and GBL connected to the first row pixel circuit unit PXC also pass directly above the second row unit light emitting diode (LED) LDU in the second direction (the y-axis direction), the stage that generates the signal applied to the pixel circuit unit PXC of the first row is positioned right next to the second row unit light emitting diode (LED) LDU. As a result, as shown in FIG. 3, the stage of the first row and the stage of the second row are formed next to one unit light emitting diode (LED) LDU. This means that even in the lower region 10-5 of the display device 10, two stages may be positioned next to one unit light emitting diode (LED) LDU, and this is described in more detail in association with FIG. 4.

On the other hand, a plurality of signal generating units of some embodiments include the first scan signal generating unit, the second scan signal generating unit, the bypass signal generating unit, and the light emission signal generating unit, and the stages EMS1, EMS2, and EMS3 for the light emission signal of the light emission signal generating unit, the stages GBS1, GBS2, and GBS3 for the bypass signal of the bypass signal generating unit, the stages GIS1, GIS2, and GIS3 for the second scan signal of the second scan signal generating unit, and the stages GWS1, GWS2, and GWS3 for the first scan signal of the first scan signal generating unit being sequentially formed from the far left (outermost) toward the center. The same stage is arranged along the first direction (the x-axis direction). As such, stages EMS1, EMS2, and EMS3 may be considered as one of a plurality of signal generating units, and stages GBS1, GBS2, and GBS3 may be considered as another of the plurality of signal generating units, and stages GIS1, GIS2, and GIS3 may be considered as yet another of the plurality of signal generating units. Some of the signal generating units are designated by label 246 in FIG. 2

The stages EMS1, EMS2, and EMS3 for the light emission signal are positioned between the first column unit light emitting diode (LED) LDU and the second column unit light emitting diode (LED) LDU. The stages GBS1, GBS2, and GBS3 for the bypass signal are positioned between the second column unit light emitting diode (LED) LDU and the third column unit light emitting diode (LED) LDU. The stages GIS1, GIS2, and GIS3 for the second scan signal are positioned between the third column unit light emitting diode (LED) LDU and the fourth column unit light emitting diode (LED) LDU. The stages GWS1, GWS2, and GWS3 for the first scan signal are positioned between the fourth column unit light emitting diode (LED) LDU and the fifth column unit light emitting diode (LED) LDU.

After the unit light emitting diode (LED) LDU of the fifth column, as shown in FIG. 2, each stage is not formed in the central region 10-1 and between the unit light emitting diodes (LED) LDU.

Also, each stage may be included even in the right region 10-3 of the display device 10, and each stage may be formed with a structure symmetrical to the structure of FIG. 3. For instance, from the most right (an outermost) toward the center, the stages EMS1, EMS2, and EMS3 for light emission signals of the light emission signal generating unit, the stages GBS1, GBS2, and GBS3 for the bypass signal of the bypass signal generating unit, the stages GIS1, GIS2, and GIS3 for the second scan signal of the second scan signal generating unit, and the stages GWS1, GWS2, and GWS3 for the first scan signal of the first scan signal generating unit may be formed in the order. The same stage is arranged along the first direction (the x-axis direction). For example, each of the signal lines GIL, GWL, EML, and GBL may have a structure in which the same signal is applied from two stages positioned in the left region 10-2 and the right region 10-3.

Therefore, in the left region 10-2 or the right region 10-3, each of the stages GWS1, GWS2, and GWS3 for the first scan signal, the stages GIS1, GIS2, and GIS3 for the second scan signal, the stages GBS1, GBS2, and GBS3 for the bypass signal, and the stages EMS1, EMS2, and EMS3 for the light emission signal is positioned between two adjacent unit light emitting diodes (LED) LDU, and each stage for the same signal may be arranged along the first direction (the x-axis direction). Also, for the stage for each signal, in the left region 10-2 or the right region 10-3, the stages EMS1, EMS2, and EMS3 for the light emission signal are positioned on the outermost side, and the stages GBS1, GBS2, and GBS3 for bypass, the stages GIS1, GIS2, and GIS3 for the second scan signal, and the stages GWS1, GWS2, and GWS3 for the first scan signal may be positioned sequentially toward the inside.

Also, FIG. 3 shows an opening forming region 60A in which a dummy opening (referring to 60 of FIG. 5/FIG. 6) may be formed. In some embodiments, the portion where the opening forming region 60A is positioned may be the left region 10-2, not the upper region 10-4 in the left upper region 10-24. For instance, even in the upper region 10-4, if there is a space to form a dummy opening 60, it may be added, but it may not be appropriate, in the embodiment of FIG. 3, an embodiment in which the opening forming region 60A is positioned in the left region 10-2 with free space is provided.

According to an embodiment, in the left upper region 10-24 of the display device 10, the opening forming region 60A may be positioned in the region where the unit light emitting diode (LED) LDU, the pixel circuit unit PXC, the data line extending region DLA, the signal line extending region SLA, the demuxer Demux, the static electricity prevention unit ESD, and each stage EMS, GBS, GIS, and GWS are not positioned. Also, according to an embodiment, the dummy opening may be positioned in the data line extending region DLA or the signal line extending region SLA, and the dummy opening may be positioned if there is also a space between each part.

In the above, the structure of the left upper region 10-24 was examined using FIG. 3. The structure of the left lower region 10-25 symmetric to that of FIG. 3, e.g., the lower side of the left driving region, will be described in more detail with reference to FIG. 4.

FIG. 4 is a lower layout view of a driving region of a light emitting display device according to an embodiment.

The lower region 10-5 according to some embodiments does not include the data distribution unit unlike the upper region 10-4 so that a plurality of demuxers Demux are not formed. However, the lower region 10-5 also includes the static electricity prevention unit ESD. As a result, the demuxer Demux is not included in the left lower region 10-25, and only the static electricity prevention unit ESD is formed.

Due to the static electricity prevention unit ESD, the last row unit light emitting diode (LED) LDU and the last row pixel circuit unit PXC are separated from each other like the unit light emitting diode (LED) LDU in the first row and the pixel circuit unit PXC. For instance, the last row unit light emitting diode (LED) LDU is positioned below the static electricity prevention unit ESD to reduce the non-display area, and the last row pixel circuit unit PXC is positioned just below the unit light emitting diode (LED) LDU in the second row from the last. At this time, the diode connection parts LDer, LDEg, and LDEb connecting the pixel circuit unit PXC in the last row and the unit light emitting diode (LED) LDU in the last row are extended.

In addition, since the signal lines GIL, GWL, EML, and GBL connected to the pixel circuit unit PXC in the last row also pass directly below the unit light emitting diode (LED) LDU in the second row from the last in the second direction (the y-axis direction), the stage that generates the signal applied to the pixel circuit unit PXC in the last row is positioned right next to the unit light emitting diode (LED) LDU in the second row from the last. As a result, as shown in FIG. 4, the stage of the last row and the stage of the second row from the last are formed next to one unit light emitting diode (LED) LDU.

Since the left lower region 10-25 also has the characteristics of the left region 10-2, the signal generating unit is positioned between the unit light emitting diodes (LED) LDU. A plurality of signal generating units include the first scan signal generating unit, the second scan signal generating unit, the bypass signal generating unit, and the light emission signal generating unit, and from the leftmost (the outermost) toward the center, the stages EMS1, EMS2, and EMS3 for the light emission signal of the light emission signal generating unit, the stages GBS1, GBS2, and GBS3 for the bypass signal of the bypass signal generating unit, the stages GIS1, GIS2, and GIS3 for the second scan signal of the second scan signal generating unit, and the stages GWS1, GWS2, and GWS3 for the first scan signal of the first scan signal generating unit are formed in order. The same stage is arranged along the first direction (the x-axis direction).

FIG. 4 also shows the opening forming region 60A where the dummy opening (referring to 60 of FIG. 5/FIG. 6) may be formed. In some embodiments, the part where the opening forming region 60A is positioned may be the lower region 10-5 or the left region 10-2 in the left lower region 10-25. For instance, in the lower region 10-5, as shown in FIG. 4, the opening forming region 60A forming the dummy opening 60 may be positioned, this is the reason that there is no demuxer Demux, so the space may be used.

Also, in the left lower region 10-25 of the display device 10, the opening forming region 60A may be positioned in the region where the unit light emitting diode (LED) LDU, the pixel circuit unit PXC, the data line extending region DLA, the signal line extending region SLA, the static electricity prevention unit ESD, and each stage EMS, GBS, GIS, and GWS are not positioned. Also, according to an embodiment, the dummy opening may be positioned in the data line extending region DLA or the signal line extending region SLA, and if there is a space between each part, the dummy opening 60 may be positioned.

Next, the structure of the dummy opening 60 positioned around the pixel circuit unit PXC will be described in more detail with reference to FIGS. 5 and 6.

Figure 5:
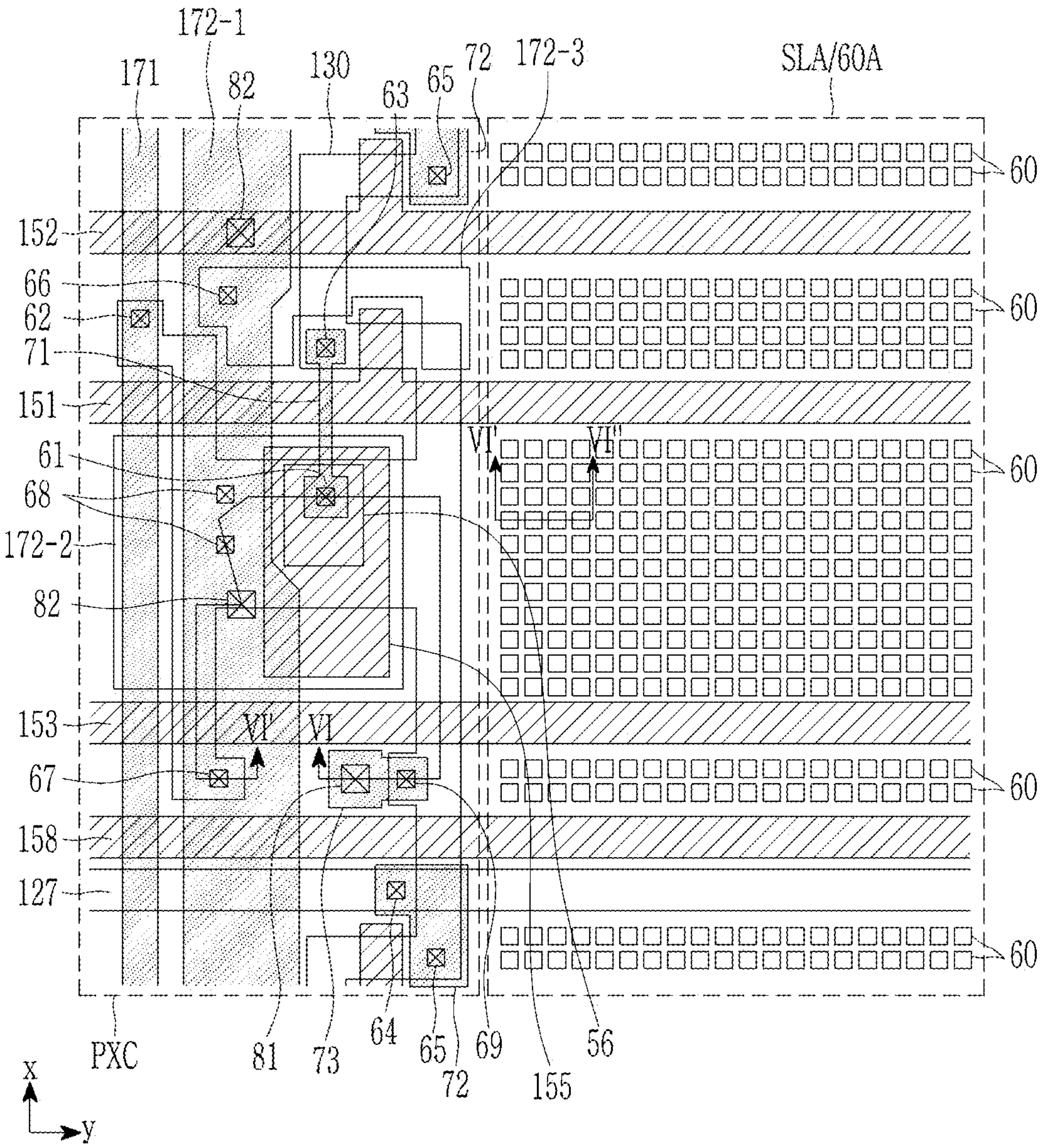
FIG. 5 is a layout view of a pixel circuit unit and surroundings thereof of a light emitting display device according to an embodiment.

FIG. 5 is a layout view of a pixel circuit unit and surroundings thereof of a light emitting display device according to an embodiment. FIG. 6 is a cross-sectional view of a cross-section line of VI-VI'-VI" of FIG. 5 and surroundings of a pixel circuit unit according to an embodiment.

The pixel circuit unit PXC according to an embodiment is shown in more detail in FIGS. 7 and 8, as well as FIG. 5, so it will be described in more detail in the description of the following drawing. Accordingly, the structure according to an embodiment of the dummy opening 60 is described based on FIGS. 5 and 6.

In FIG. 5, the signal lines GIL, GWL, EML, and GBL are changed into numbers as a reference numeral, and respectively, the first scan line GWL is numbered 151, the second scan line GIL is numbered 152, and the bypass control line GBL is numbered 158, while the light emission signal line EML is numbered 153.

In addition, the data lines DLr, DLg, and DLb are illustrated as a number 171, and below, may be separately illustrated and described as data lines 171R, 171G, and 171B, respectively.

Referring to FIG. 5, the dummy opening 60 is formed between the second scan line 152 and the first scan line 151, between the first scan line 151 and the light emission signal line 153, and between the light emission signal line 153 and the bypass signal line 158. As a result, the dummy opening 60 is formed at the part represented by the signal line extending region SLA in the FIG. 2 to FIG. 4.

Also, referring to FIG. 5, the dummy opening 60 is also formed on the upper side of the second scan line 152 and the lower side of the bypass signal line 158. This portion is the opening forming region 60A in FIGS. 2 to 4 so that the dummy opening 60 is also formed in the opening forming region 60A of FIGS. 2 to 4.

In FIG. 5, in addition to the opening forming region 60A, an embodiment in which the dummy opening 60 is formed in the signal line extending region SLA is shown. Also, according to an embodiment, the dummy opening 60 may also be formed between the data lines DLr, DLg, and DLb in the data line extending region DLA. On the other hand, referring to FIG. 6, it is shown that the dummy opening 60 may also be positioned under the unit light emitting diode (LED) LDU. For instance, in FIG. 6, it is shown that the dummy opening 60 is also positioned in the part under the cathode corresponding pad LDC1 and LDC2 to which the unit light emitting diode (LED) LDU is attached. Also, unlike FIG. 6, the dummy opening 60 may be positioned below the anode corresponding pad LDA1 and LDA2 to which the unit light emitting diode (LED) LDU is attached.

Hereinafter, the cross-sectional structure of the dummy opening 60 will be described with reference to FIG. 6.

Figure 6:
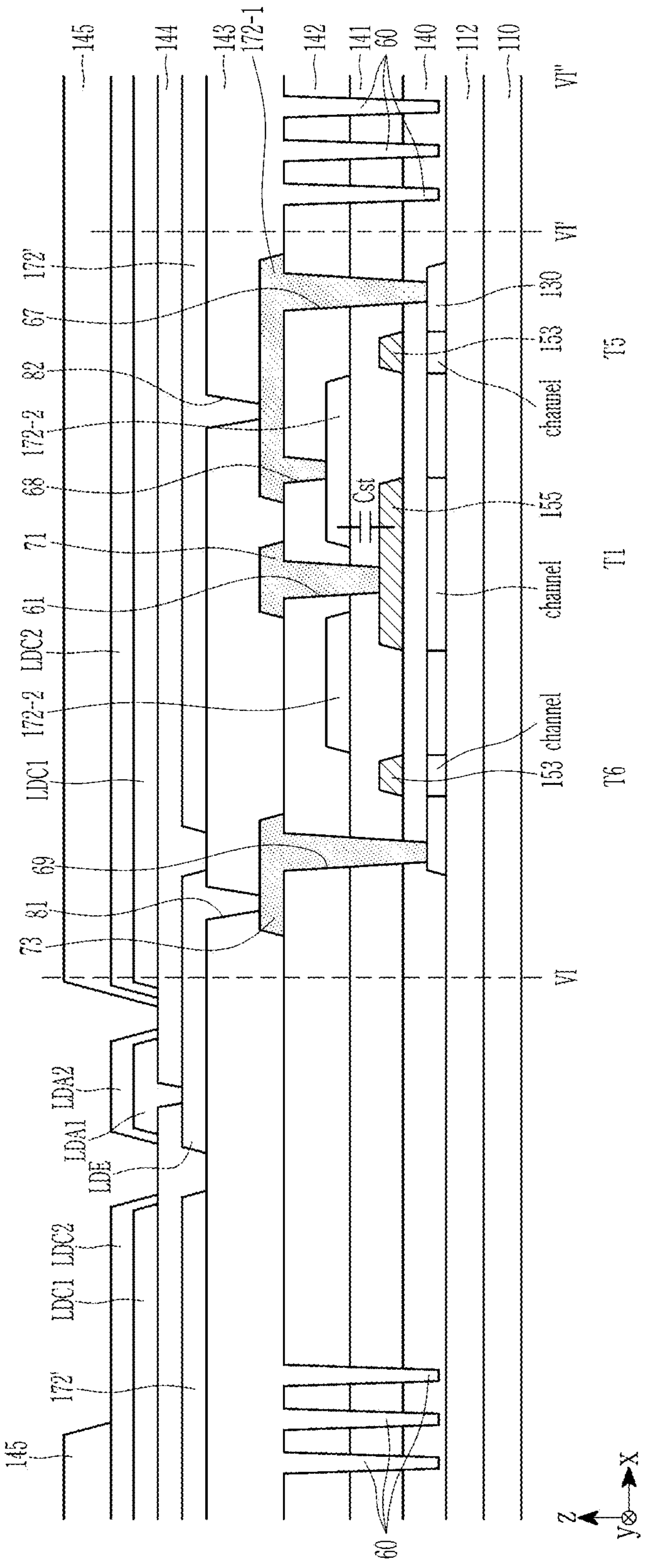
FIG. 6 is a cross-sectional view of a cross-section line VI-VI'-VI" of FIG. 5 and surroundings of a pixel circuit unit according to an embodiment.

FIG. 6 shows the cross-section structure of the pixel circuit unit PXC and the dummy opening 60 around thereof in the display device 10 according to an embodiment.

A buffer layer 112 may be positioned on a substrate 110, and a semiconductor layer 130 may be positioned on the buffer layer 112. Here, the substrate 110 may use a substrate formed of a flexible material, such as plastic or polyimide (PI). In case of using the substrate 110 of the flexible material, when the semiconductor layer 130 is formed, impurities may flow into the semiconductor layer 130 from the substrate 110, but the buffer layer 112 may be formed to prevent such impurity flow. The buffer layer 112 may include at least one inorganic insulating material among materials, such as a silicon oxide (SiOx), a silicon nitride such as (SiNx), and a silicon oxynitride (SiON). In addition, according to an embodiment, a barrier layer may be further formed between the substrate 110 and the buffer layer 112 by using at least at least one inorganic insulating material among materials, such as a silicon oxide (SiOx), a silicon nitride (SiNx), and a silicon oxynitride (SiON). According to an embodiment, the substrate 110 may be formed of a glass substrate. In this case, the buffer layer 112 may be omitted and the semiconductor layer 130 may be positioned directly on the substrate 110.

A first insulating layer 140 is positioned on the semiconductor layer 130, and the first insulating layer 140 may include at least one inorganic insulating material among materials, such as a silicon oxide (SiOx), a silicon nitride (SiNx), and a silicon oxynitride (SiON).

A first gate conductive layer is disposed on the first insulating layer 140, and the first gate conductive layer may include a gate electrode of a thin film transistor and one electrode of a capacitor. In FIG. 6, one electrode of the capacitor is formed of the gate electrode 155 of the driving transistor so that they are indicated by the same reference numeral. In addition, various wiring of the signal generating unit and/or the demuxer Demux may be included in the first gate conductive layer, which is discussed in the detailed description of each part. The first gate conductive layer is formed of a conductive material, and may be formed of a plurality of conductive layers according to an embodiment.

The first gate conductive layer is covered by a second insulating layer 141, and the second insulating layer 141 may include at least one inorganic insulating material among materials, such as a silicon oxide (SiOx), a silicon nitride (SiNx), and a silicon oxynitride (SiON).

A second gate conductive layer is positioned on the second insulating layer 141 and the second gate conductive layer may include a storage electrode 172-2 of the capacitor. Also, the second gate conductive layer may include one electrode of a capacitor included in the signal generating unit and/or the demuxer Demux, or may include various parts. This is discussed in the detailed description of each part. The second gate conductive layer may be formed of a conductive material, and according to an embodiment, it may be formed a plurality of conductive layers.

The second gate conductive layer is covered by a third insulating layer 142, and the third insulating layer 142 may include at least one inorganic insulating material among materials, such as a silicon oxide (SiOx), a silicon nitride (SiNx), and a silicon oxynitride (SiON).

A first data conductive layer is positioned on the third insulating layer 142, and the first data conductive layer may include a data line 171, a driving voltage line 172-1, and a data connecting member 73. In addition, the first data conductive layer may include various wiring of the signal generating unit and/or the demuxer Demux, which will be described in the detailed description of each part. The first data conductive layer is formed of a conductive material, and may be formed of a plurality of conductive layers according to an embodiment.

The first data conductive layer is covered with a fourth insulating layer 143. The fourth insulating layer 143 may include an organic material.

A second data conductive layer is positioned on the fourth insulating layer 143, and a diode connection part LDE and power application wiring 172' may be included in the second data conductive layer. Here, the power application wiring 172' is electrically connected to the driving voltage line 172-1 through an opening 82 to transmit a driving voltage ELVDD. The power application wiring 172' is electrically separated from the diode connection part LDE and may be positioned entirely in the remaining part except for the region where the diode connection part LDE is positioned. In addition, according to an embodiment, the second data conductive layer may include various wiring of the signal generating unit and/or the demuxer Demux. The second data conductive layer is formed of a conductive material, and may be formed of a plurality of conductive layers according to an embodiment.

The second data conductive layer is covered by a fifth insulating layer 144, and the fifth insulating layer 144 may include an organic material.

A partition wall 145 is positioned on the fifth insulating layer 144, and the partition wall 145 includes an opening, anode corresponding pads LDA1 and LDA2 and cathode corresponding pads LDC1 and LDC2 to which an anode pad and a cathode pad positioned on the bottom surface of the unit light emitting diode (LED) LDU are attached are formed therein. The anode corresponding pads LDA1 and LDA2 and the cathode corresponding pads LDC1 and LDC2 may be positioned in different openings of the partition wall 145. The anode corresponding pads LDA1 and LDA2 receive the output current of the pixel circuit unit PXC, and the cathode corresponding pads LDC1 and LDC2 receive a driving low voltage ELVSS. The cathode corresponding pads LDC1 and LDC2 are electrically separated from the anode corresponding pads LDA1 and LDA2, and may be positioned entirely in the remaining portions except for the region where the anode corresponding pads LDA1 and LDA2 are positioned. The partition wall 145 may include an organic material. The partition wall 145 may cover the cathode corresponding pads LDC1 and LDC2 except for a portion where the cathode corresponding pads LDC1 and LDC2 are opened to be in contact with the cathode pad of the unit light emitting diode (LED) LDU.

The anode corresponding pads LDA1 and LDA2 and the cathode corresponding pads LDC1 and LDC2 may be formed as a double layer, the second anode corresponding pad LDA2 and second cathode corresponding pad LDC2 positioned thereon may be formed of a transparent conductive material, such as ITO, and the first anode corresponding pad LDA1 and the first cathode corresponding pad LDC1 positioned thereunder may be formed of a non-transparent conductive material or a plurality of conductive layers. According to an embodiment, the anode corresponding pads LDA1 and LDA2 and the cathode corresponding pads LDC1 and LDC2 may be formed as a single layer, and in this case, the second anode corresponding pad LDA2 and the second cathode corresponding pad LDC2 may be omitted.

In FIG. 6, the dummy opening 60 is shown, and the dummy opening 60 according to some embodiments is formed on the first insulating layer 140, the second insulating layer 141, and the third insulating layer 142. In addition, according to some embodiments, the dummy opening 60 may overlap the cathode corresponding pads LDC1 and LDC2 so that the dummy opening 60 may also be positioned under the portion where the unit light emitting diode (LED) LDU is attached.

The dummy opening 60 may be formed up to the first insulating layer 140 and may be formed to a depth equivalent to the openings 67 and 69 exposing the semiconductor layer 130. The dummy opening 60 serves to allow hydrogen to escape from the semiconductor layer 130 during at least one manufacturing process. If hydrogen does not escape from the semiconductor layer 130 after various processes (e.g., a crystallization process, an annealing process, etc.) in which the semiconductor layer 130 is formed, hydrogen gathers at a specific position in the semiconductor layer 130 and the characteristic may be changed. For instance, as shown in FIGS. 2 to 4, where the pixel circuit unit PXC is sparsely positioned, there is not a sufficient number of the openings in the part adjacent to the semiconductor layer 130 so hydrogen cannot escape and some transistors may have unwanted characteristics. However, when the dummy opening 60 is formed as in various embodiments, a dehydrogenation phenomenon easily occurs in the semiconductor layer 130 so that the characteristics of the semiconductor layer 130 and the transistors are constant. The dummy opening 60 may be covered by an organic material, and in FIG. 6, it is covered by the fourth insulating layer 143 formed of the organic material.

Figure 26:
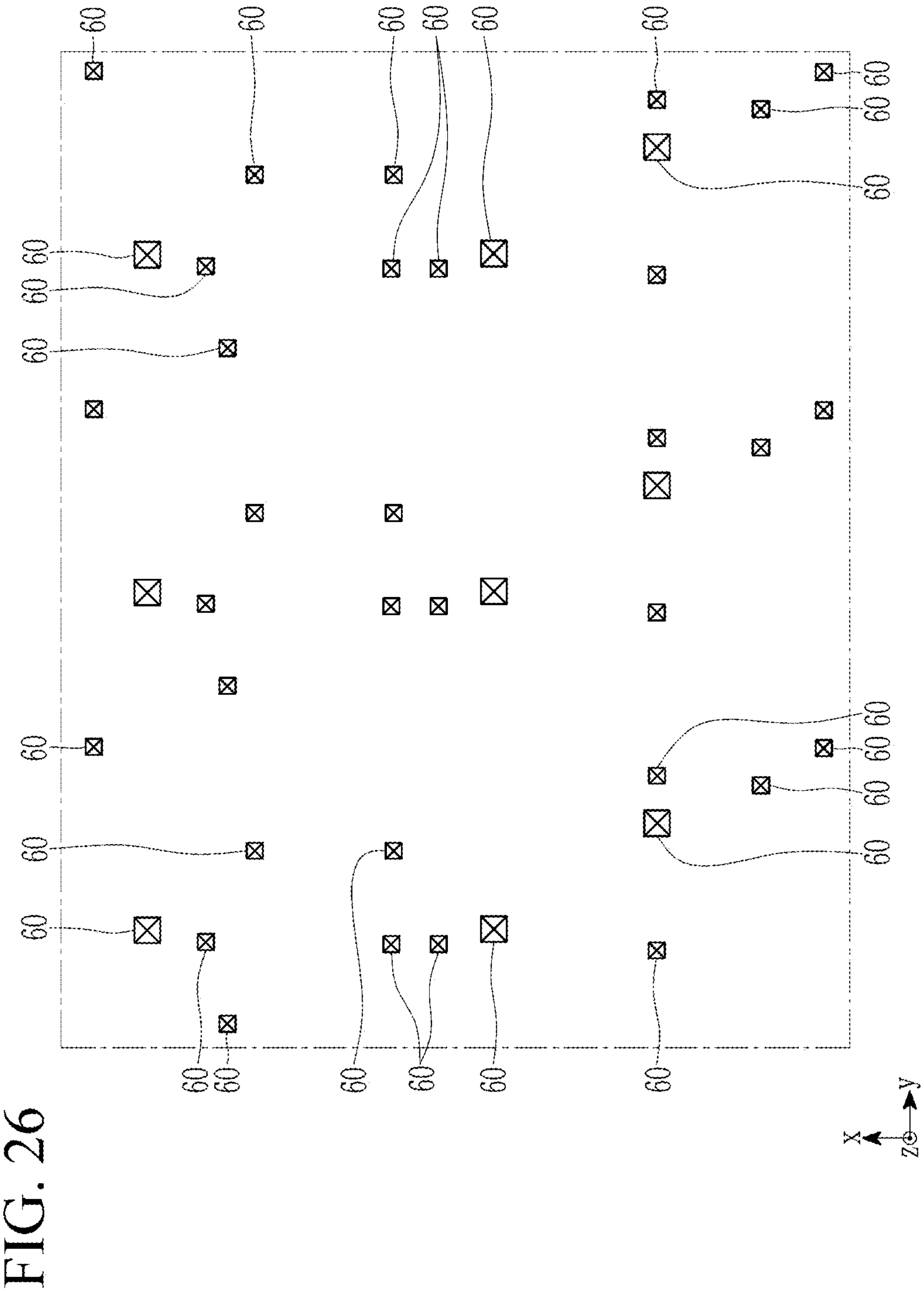
FIGS. 26, 27, and 28 are views showing various arrangements of a dummy opening according to various embodiments.
Figure 27:
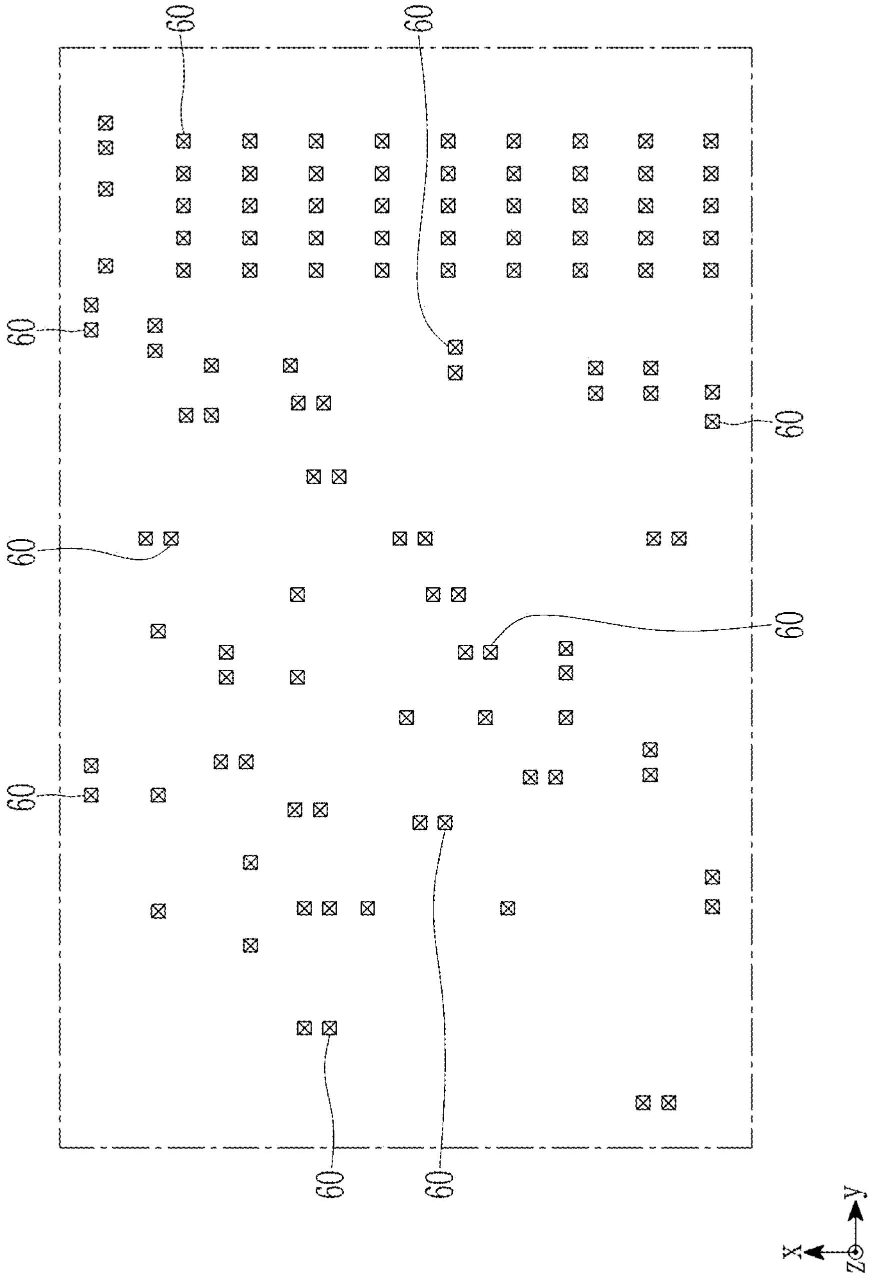
Figure 28:
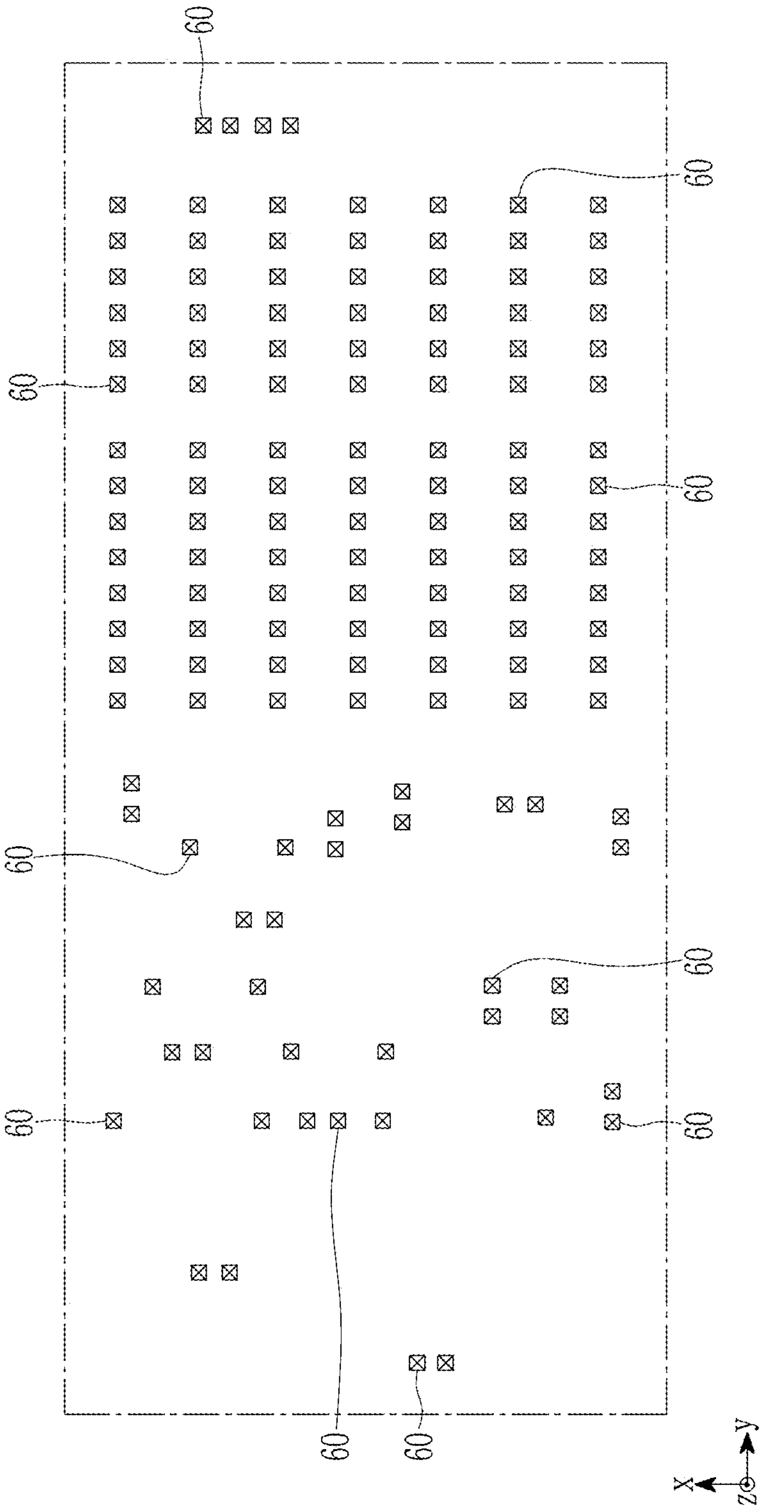

In the embodiment described in association with FIG. 5, a structure in which the dummy opening 60 is arranged at a regular interval in a quadrangle shape of a constant size is shown, but it may be formed in various sizes in various shapes according to some embodiments. Also, a single dummy opening may be formed over a wide region. Also, according to an embodiment, such as shown in FIGS. 26 to 28, the dummy opening 60 may be formed using a mask used in a specific pattern.

Hereinafter, a more detailed structure of the pixel circuit unit PXC according to some embodiments will be described with reference to FIG. 7.

Figure 7:
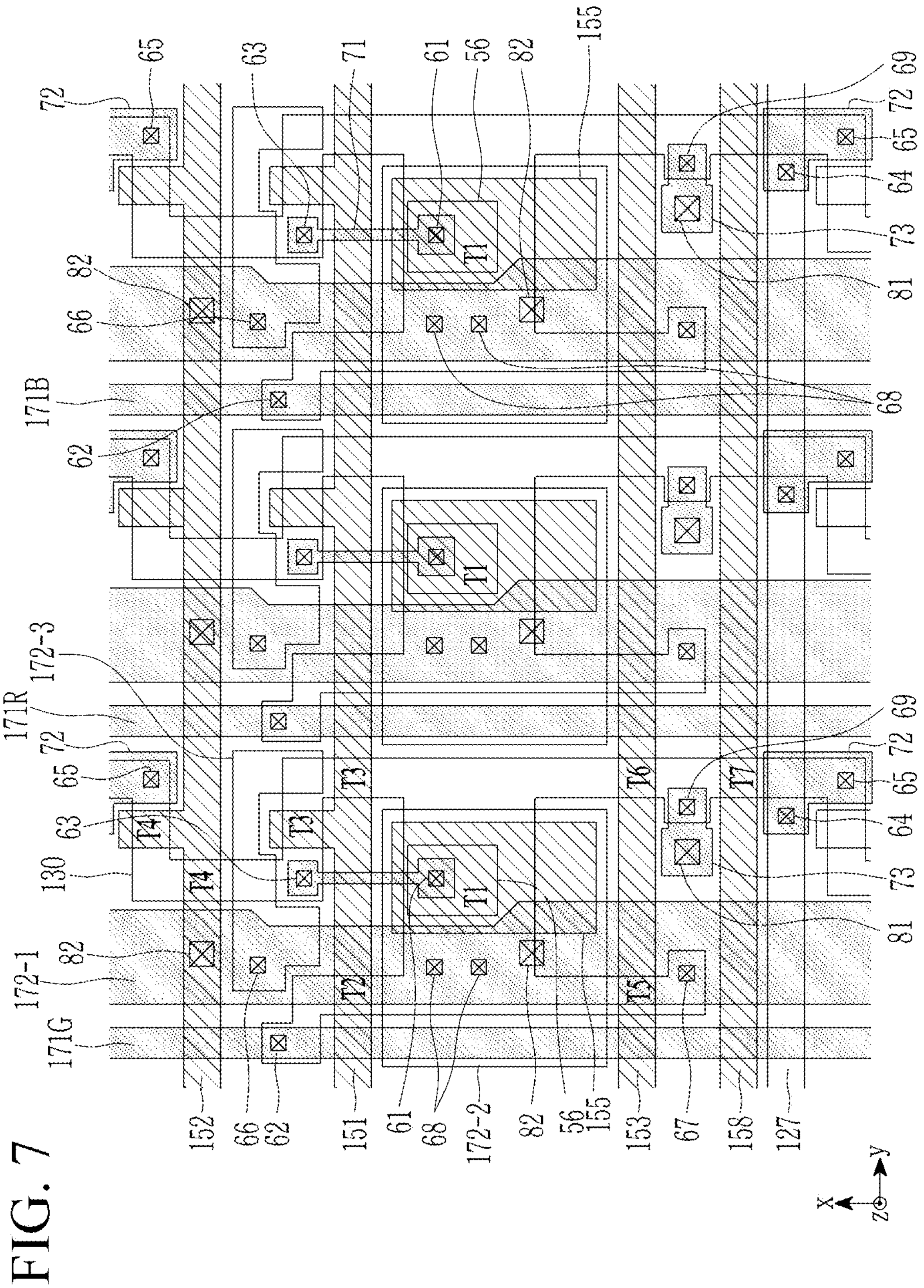
FIG. 7 is a layout view of a pixel circuit unit of a light emitting display device according to an embodiment.

FIG. 7 is a layout view of a pixel circuit unit of a light emitting display device according to an embodiment.

FIG. 7 shows the structure in which three pixel circuit units PXC formed in the display device 10 are disposed to be adjacent. One pixel circuit unit PXC of them is described below.

The pixel circuit unit PXC of the light emitting display device 10 according to an embodiment includes a first scan line 151, a second scan line 152, a light emission signal line 153, and a bypass signal line 158, which extend along the second direction (the y-axis direction) and transmit a first scan signal GW(n), a second scan signal GI(n), a light emission control signal EM (n), and a bypass signal GB(n). The light emitting display device 10 includes a data line (171R, 171G, and 171B) and a driving voltage line 172-1, which extend along the first direction (the x-axis direction) and the second direction (the y-axis direction), and transmit a data voltage Dm and a driving voltage ELVDD, respectively.

The light emitting display device 10 includes a driving transistor T1 (also referred to a first transistor), a second transistor T2, a third transistor T3, a fourth transistor T4, a fifth transistor T5, a sixth transistor T6, a seventh transistor T7, and a storage capacitor Cst.

Each channel of the driving transistor T1, the second transistor T2, the third transistor T3, the fourth transistor T4, the fifth transistor T5, the sixth transistor T6 and the seventh transistor T7 is disposed in the semiconductor layer 130 extending to be elongated. Both sides of the channel of the semiconductor layer 130 are formed with the same characteristic as a conductor through plasma processing, and may be connected directly to the adjacent transistor through the semiconductor layer 130. The semiconductor layer 130 may be formed to be curved in various shapes and to include a polycrystalline semiconductor, such as polysilicon or an oxide semiconductor.

Each channel of a plurality of transistors T1, T2, T3, T4, T5, T6, and T7 overlaps the gate electrode of each transistor T1, T2, T3, T4, T5, T6, and T7. A plurality of transistors T1, T2, T3, T4, T5, T6, and T7 may have substantially the same stacked structure and have the same layered structure as the part represented by T1 in FIG. 6. Hereinafter, the driving transistor T1 is mainly described in detail and the rest of the transistors T2, T3, T4, T5, T6, and T7 are simply described.

The driving transistor T1 including the channel and the gate electrode 155 may further include a first region and a second region disposed on respective sides of the channel. The channel of the driving transistor T1 is between the first region and the second region and overlaps the gate electrode 155 on a plane. As seen in FIG. 7, the channel of the driving transistor T1 has a straight shape extending in the row direction, however, it may have various shapes (for example, a "Ω" shape).

A storage electrode 172-2 is positioned on the gate electrode 155 to be insulated. The storage electrode 172-2 overlaps the gate electrode 155 via the second insulating layer 141 on a plane to configure the storage capacitor Cst. The storage electrode 172-2 has an opening 56 so that the gate electrode 155 may be connected to the first data connecting member 71. In the opening 56, the upper surface of the gate electrode 155 and the first data connecting member 71 are electrically connected through the opening 61. The first data connecting member 71 is connected to the third transistor T3 and the fourth transistor T4, thereby the gate electrode 155 of the driving transistor T1 connects the third transistor T3 and the fourth transistor T4. Also, the storage electrode 172-2 is connected to the driving voltage line 172-1 through an opening 68, thereby receiving the driving voltage ELVDD.

The gate electrode of the second transistor T2 may be a part of the first scan line 151. The first region of the second transistor T2 is connected to the data line 171 through the opening 62, and the first region and the second region may be disposed on the semiconductor layer 130.

The third transistor T3 may be composed of two transistors adjacent to each other. For example, in FIG. 7, the mark T3 is shown on the left and below with respect to the part where the semiconductor layer 130 is bent. These two parts play the role of the third transistor T3 and have a structure in which the first region of one third transistor T3 is connected to the second region of the other third transistor T3. The gate electrode of two transistors T3 may be a part of the first scan line 151 or a part protruded upward from the first scan line 151. Such a structure may be referred to as a dual gate structure and may serve to block a leakage current from flowing. The third transistor T3 is connected to the sixth transistor T6 and the driving transistor T1. The third transistor T3 is connected to the first data connecting member 71 through the opening 63.

The fourth transistor T4 may also have a structure blocking the leakage current by having a dual gate structure made up of two fourth transistors T4. Two fourth transistors T4 are formed at the intersection of the second scan line 152 and the semiconductor layer 130. The gate electrode of the fourth transistor T4 may be a part of the second scan line 152. The second data connecting member 72 is connected to the first region of the fourth transistor T4 through the opening 65, and the first data connecting member 71 is connected to the second region of the fourth transistor T4 through the opening 63.

The gate electrode of the fifth transistor T5 may be a part of the light emission signal line 153. The driving voltage line 172-1 is connected to the first region of the fifth transistor T5 through the opening 67, and the second region is connected to the driving transistor T1 through the semiconductor layer 130.

The gate electrode of the sixth transistor T6 may be a part of the light emission signal line 153. The third data connecting member 73 is connected to the second region of the sixth transistor T6 through the opening 69, and the first region is connected to the driving transistor T1 through the semiconductor layer 130.

The gate electrode of the seventh transistor T7 may be a part of the bypass signal line 158. The third data connecting member 73 is connected to the first region of the seventh transistor T7 through the opening 81, and the second region is connected to the second data connecting member 72 through the opening 65. The second data connecting member 72 is connected to the initialization voltage line 127 through the opening 64, and the seventh transistor T7 and the fourth transistor T4 receive the initialization voltage $V_{INT}$ (see FIG. 8).

A parasitic capacitor control pattern 172-3 may be positioned between the dual gate electrodes of the compensation transistor T3. The parasitic capacitor exists in the pixel, and if the voltage applied to the parasitic capacitor changes, the image quality characteristic may be changed. The driving voltage line 172-1 is connected to the parasitic capacitor control pattern 172-3 through the opening 66. For this reason, it is possible to prevent the image quality characteristic from being changed by applying the driving voltage ELVDD of a constant DC voltage to the parasitic capacitor. The parasitic capacitor control pattern 172-3 may be formed differently from the illustrated shape and position.

In FIG. 7, the part marked with hatching is the first gate conductive layer, and the part marked with dots is the first data conductive layer. The semiconductor layer 130 and the second gate conductive layer are not shown separately. Based on this, the cross-sectional structure of the light emitting display device according to an embodiment is described in the stacking order with reference to FIG. 6 as follows.

In the light emitting display device according to an embodiment, the buffer layer 112 may be positioned on the substrate 110, and the semiconductor layer 130 including the channel, the first region, and the second region of a plurality of transistors T1, T2, T3, T4, T5, T6, and T7 is positioned on the buffer layer 112.

The first insulating layer 140 covering the semiconductor layer 130 is positioned thereon. The first gate conductive layer including the gate electrode 155 of a plurality of transistors T1, T2, T3, T4, T5, T6, and T7, the first scan line 151, the second scan line 152, the light emission signal line 153, and the bypass signal line 158 is positioned on the first insulating layer 140.

The second insulating layer 141 covering the first gate conductive layer is positioned thereon. The first insulating layer 140 and the second insulating layer 141 may be formed of at least one inorganic insulating material among materials, such as a silicon oxide (SiOx), a silicon nitride (SiNx), and a silicon oxynitride (SiON). The second gate conductive layer including the first storage electrode 172-2, the initialization voltage line 127, and the parasitic capacitor control pattern 172-3 is positioned on the second insulating layer 141.

The third insulating layer 142 covering the second gate conductive layer is positioned thereon. The third insulating layer 142 may be formed of at least one inorganic insulating material among materials, such as a silicon oxide (SiOx), a silicon nitride (SiNx), and a silicon oxynitride (SiON).

On the third insulating layer 142, the first data conductive layer including the data line 171, the driving voltage line 172-1, the first data connecting member 71, the second data connecting member 72, and the third data connecting member 73 is positioned.

The fourth insulating layer 143 covering the first data conductive layer is positioned thereon. The fourth insulating layer 143, which is also called a planarization film, may include an organic insulating material.

On the fourth insulating layer 143, according to an embodiment, the second data conductive layer and the fifth insulating layer 144 may be positioned, and the partition wall 145, the anode corresponding pads LDA1 and LDA2 and the cathode corresponding pads LDC1 and LDC2 may be positioned thereon. According to an embodiment, the second data conductive layer and the fifth insulating layer 144 may be omitted.

The data line 171 is connected to the first electrode of the second transistor T2 through the opening 62 formed in the first insulating layer 140, the second insulating layer 141, and the third insulating layer 142.

The driving voltage line 172-1 is connected to the first region of the fifth transistor T5 through the opening 67 formed in the first insulating layer 140, the second insulating layer 141, and the third insulating layer 142, is connected to the storage electrode 172-2 through the opening 68 formed in the third insulating layer 142, and is connected to the parasitic capacitor control pattern 172-3 through the opening 66 formed in the third insulating layer 142.

One end of the first data connecting member 71 is connected to the gate electrode 155 through the opening 61 formed in the second insulating layer 141 and the third insulating layer 142, and the other end thereof is connected to the third transistor T3 and the fourth transistor T4 through the opening 63 formed in the first insulating layer 140, the second insulating layer 141, and the third insulating layer 142.

One end of the second data connecting member 72 is connected to the fourth transistor T4 through the opening 65 formed in the first insulating layer 140, the second insulating layer 141, and the third insulating layer 142, and the other end thereof is connected to the initialization voltage line 127 through the opening 64 formed in the third insulating layer 142.

The third data connecting member 73 is connected to the sixth transistor T6 through the opening 69 formed in the first insulating layer 140, the second insulating layer 141, and the third insulating layer 142. The third data connecting member 73 is connected to the diode connection part LDE through the opening 81, and the anode corresponding pads LDA1 and LDA2 are positioned at the end of the diode connection part LDE to transmit the output current to the unit light emitting diode (LED) LDU.

Hereinafter, an example circuit diagram and input signal of the pixel PX including the light emitting diode (LED) are described with reference to FIGS. 8 and 9. It is noted that an embodiment of FIG. 8 shows an embodiment further including a pixel output test unit PXCT capable of testing whether the output current is generated from the pixel circuit unit PXC.

Figure 8:
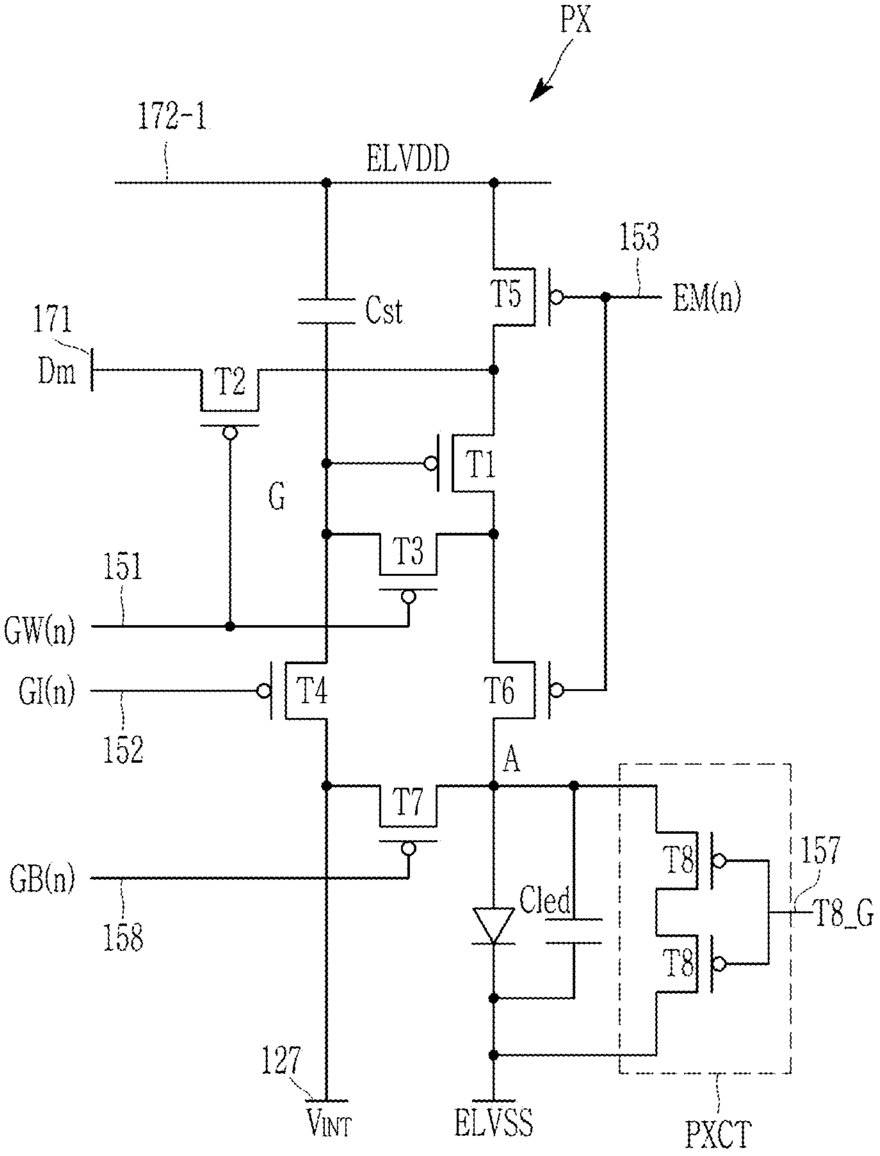
FIG. 8 is a circuit diagram of a pixel of a light emitting display device according to an embodiment.

FIG. 8 is a circuit diagram of a pixel of a light emitting display device according to an embodiment. FIG. 9 is a waveform diagram of a signal applied to a pixel of FIG. 8 according to an embodiment.

Referring to FIG. 8, the pixel PX of the light emitting display device 10 includes a plurality of transistors T1, T2, T3, T4, T5, T6, and T7, a storage capacitor Cst, and a light emitting diode (LED), which are connected to the several signal lines 127, 151, 152, 153, 158, 171, and 172-1. Also, the pixel output test unit PXCT further includes an eighth transistor T8 and a test signal line 157 controlling the eighth transistor T8. However, according to an embodiment, the light emitting display device 10 may not include the pixel output test unit PXCT.

First, the pixel circuit unit PXC except for the pixel output test unit PXCT and light emitting diode (LED) is described.

A plurality of transistors T1, T2, T3, T4, T5, T6, and T7 include the driving transistor T1 and the second transistor T2, and other transistors may include the third transistor T3, the fourth transistor T4, the fifth transistor T5, the sixth transistor T6, and the seventh transistor T7 for operating the light emitting diode (LED).

A plurality of signal lines 127, 151, 152, 153, 158, 171, and 172-1 may include the first scan line 151, the second scan line 152, the light emission signal line 153, the bypass signal line 158, the data line 171, the driving voltage line 172-1, and the initialization voltage line 127.

The first scan line 151 is connected to the stage GWS for the first scan signal of FIG. 3 to transmit the scan signal GW(n) to the second transistor T2 and the third transistor T3. The second scan line 152 is connected to the stage GIS for the second scan signal to transmit the second scan signal GI(n) to the fourth transistor T4. The light emission signal line 153 is connected to the stage EMS for the light emission signal to transmit the light emission control signal EM(n) controlling a time that the light emitting diode (LED) is emitted to the fifth transistor T5 and the sixth transistor T6. The bypass signal line 158 is connected to the stage EMS for the light emission signal to transmit the bypass signal GB(n) to the seventh transistor T7.

The data line 171 is connected to the demuxer Demux as the wiring that transmits the data voltage Dm, and the luminance of the light emitting diode (LED) (also called a light-emitting element) changes according to the data voltage Dm. The driving voltage line 172-1 applies the driving voltage ELVDD, and the initialization voltage line 127 transmits the initialization voltage $V_{INT}$ for initializing the voltages of the gate electrode of the driving transistor T1, one electrode of the storage capacitor, and the anode of the light emitting diode (LED). The driving low voltage ELVSS is applied to the cathode of the light emitting diode (LED). A constant voltage may be applied to the voltages applied to the driving voltage ELVDD, the initialization voltage $V_{INT}$, and the driving low voltage ELVSS.

Hereinafter, a connection relationship between a plurality of transistors included in the pixel circuit unit PXC will be described.

First, the driving transistor T1 is a transistor that adjusts the magnitude of the output current according to the applied data voltage Dm, and the output current of the driving transistor T1 is applied to the light emitting diode (LED) so that the brightness of the light emitting diode (LED) is adjusted according to the data voltage Dm. For this purpose, the driving transistor T1 receives the driving voltage ELVDD at the input side terminal through the fifth transistor T5, and the data voltage Dm is also applied through the second transistor T2. The output side terminal of the driving transistor T1 is disposed to output the current toward the light emitting diode (LED), and is connected to the anode of the light emitting diode (LED) via the sixth transistor T6. Also, the output side terminal of the driving transistor T1 is connected to the third transistor T3. The gate electrode 155 of the driving transistor T1 is connected to one electrode of the storage capacitor Cst. Accordingly, the voltage of the gate electrode 155 changes according to the voltage stored in the storage capacitor Cst, and the output current output by the driving transistor T1 is changed accordingly.

The second transistor T2 is a transistor that receives the data voltage Dm into the pixel PX. The gate electrode of the second transistor T2 is connected to the first scan line 151, the input side terminal of the second transistor T2 is connected to the data line 171, and the output side terminal is connected to the input side terminal of the driving transistor T1. When the second transistor T2 is turned on according to the scan signal GW(n) transmitted through the first scan line 151, the data voltage Dm transmitted through the data line 171 is transmitted to the input side terminal of the driving transistor T1.

The third transistor T3 is a transistor in which the data voltage Dm is output from the driving transistor T1 and transferred back to the gate electrode 155 of the driving transistor T1 and one electrode of the storage capacitor Cst. The gate electrode of the third transistor T3 is connected to the first scan line 151, and the input side terminal of the third transistor T3 is connected to the output side terminal of the driving transistor T1. The output side terminal of the third transistor T3 is connected to one electrode of the storage capacitor Cst and the gate electrode 155 of the driving transistor T1. The third transistor T3 is turned on according to the scan signal GW(n) received through the first scan line 151 to connect the gate electrode 155 of the driving transistor T1 and the output side terminal of the driving transistor T1 to each other.

The fourth transistor T4 has a function for initializing the gate electrode 155 of the driving transistor T1 and one electrode of the storage capacitor Cst. The gate electrode of the fourth transistor T4 is connected to the second scan line 152, and the input side terminal of the fourth transistor T4 is connected to the output side terminal of the third transistor T3, one electrode of the storage capacitor Cst, and the gate electrode 155 of the driving transistor T1. The output side terminal of the fourth transistor T4 is connected to the initialization voltage line 127. The fourth transistor T4 transmits the initialization voltage $V_{INT}$ to the gate electrode 155 of the driving transistor T1 and one electrode of the storage capacitor Cst depending on the second scan signal GI(n) transmitted through the second scan line 152. Accordingly, the gate voltage of the gate electrode 155 of the driving transistor T1 and the storage capacitor Cst are initialized. The initialization voltage $V_{INT}$ has a low voltage value and may be a voltage capable of turning on the driving transistor T1.

The fifth transistor T5 serves to transfer the driving voltage ELVDD to the driving transistor T1. The gate electrode of the fifth transistor T5 is connected to the light emission signal line 153, and the input side terminal of the fifth transistor T5 is connected to the driving voltage line 172-1. The output side terminal of the fifth transistor T5 is connected to the input side terminal of the driving transistor T1.

The sixth transistor T6 serves to transfer the output current output from the driving transistor T1 to the light emitting diode (LED). The gate electrode of the sixth transistor T6 is connected to the light emission signal line 153, and the input side terminal of the sixth transistor T6 is connected to the output side terminal of the driving transistor T1. The output side terminal of the sixth transistor T6 is electrically connected to the anode pad of the light emitting diode (LED) through the diode connection part LDE. As a result, the output current output from the driving transistor T1 is transmitted to the anode of the light emitting diode (LED).

The fifth transistor T5 and the sixth transistor T6 are turned on simultaneously depending on the light emission control signal EM(n) transmitted through the light emission signal line 153, if the driving voltage ELVDD is applied to the input side terminal of the driving transistor T1 through the fifth transistor T5, and the driving transistor T1 outputs the output current according to the voltage of the gate electrode 155 of the driving transistor T1 (e.g., the voltage at one terminal of the storage capacitor Cst). The output current is transmitted to the light emitting diode (LED)

through the sixth transistor T6. As the current flows through the light emitting diode (LED), the light emitting diode (LED) emits light.

The seventh transistor T7 serves to initialize the anode of the light emitting diode (LED). The gate electrode of the seventh transistor T7 is connected to the bypass signal line 158, the input side terminal of the seventh transistor T7 is connected to the anode of the light emitting diode (LED), and the output side terminal of the seventh transistor T7 is connected to the initialization voltage line 127. When the seventh transistor T7 is turned on depending on the bypass signal GB(n) transmitted through the bypass signal line 158, the initialization voltage $V_{INT}$ is applied to the anode of the light emitting diode (LED) and initialized.

One electrode of the storage capacitor Cst is connected to the gate electrode 155 of the driving transistor T1, the third transistor T3, and the fourth transistor T4, and the other electrode is connected to the driving voltage line 172-1. As a result, the storage capacitor Cst has a function for storing and maintaining the voltage of the gate electrode 155 of the driving transistor T1.

In some embodiments, the anode of each light emitting diode (LED) included in the unit light emitting diode (LED) LDU is electrically connected to the output side terminal of the sixth transistor T6 and the input side terminal of the seventh transistor T7 through the anode corresponding pad LDA1 and LDA2 and the diode connection part LDE, and the cathode receives the common voltage ELVSS through the cathode corresponding pad LDC1 and LDC2.

As seen in FIG. 8, the pixel circuit includes seven transistors T1-T7 and one capacitor Cst; however, embodiments are not limited thereto, and the number of the transistors, the number of the capacitors, and the connection thereof may be variously changed.

The operation of one pixel of the light emitting display device according to an embodiment will be described with reference to FIGS. 8 and 9.

A period in which the light emission control signal EM(n) has a low voltage is a light emission period, and the fifth transistor T5 and the sixth transistor T6 are turned on so that the driving voltage ELVDD is applied to the driving transistor T1 and the output current of the driving transistor T1 is transmitted to the anode of the light emitting diode (LED).

After that, while the light emission control signal EM(n) is changed to a high voltage, an initialization period and a writing period are performed.

The initialization period may be divided into a first initialization period for initializing the voltage of the gate electrode 155 of the driving transistor T1 and a second initialization period for initializing the anode voltage of the light emitting diode (LED).

First, the first initialization period is controlled by the second scan signal GI(n), the fourth transistor T4 is turned on by the low voltage of the second scan signal GI(n), and the voltage of the gate electrode 155 of the driving transistor T1 is initialized into the initialization voltage $V_{INT}$.

Next, a writing period in which the data voltage Dm is applied to the pixel circuit unit PXC proceeds. The writing period is controlled by the first scan signal GW(n), the second transistor T2 is turned on by the low voltage of the first scan signal GW(n), and the data voltage Dm is transmitted to the input side terminal of the driving transistor T1. At this time, in the driving transistor T1, the data voltage Dm is transmitted to the output side terminal due to the initialization voltage (VINT) applied to the gate electrode 155.

The third transistor T3 is also turned on by the low voltage of the first scan signal GW(n) so that the voltage of the output side terminal of the driving transistor T1 is transmitted to the gate electrode 155 of the driving transistor T1 through the third transistor T3. As a result, when the voltage of the gate electrode 155 of the driving transistor T1 gradually increases, and then the voltage that is lower than the voltage of the input side terminal of the driving transistor T1, e.g., the data voltage Dm, by a threshold voltage of the driving transistor T1, the driving transistor T1 is turned off. At this time, the voltage that is lower than the data voltage Dm by the threshold voltage of the driving transistor T1 is stored in the storage capacitor Cst.

Figure 9:
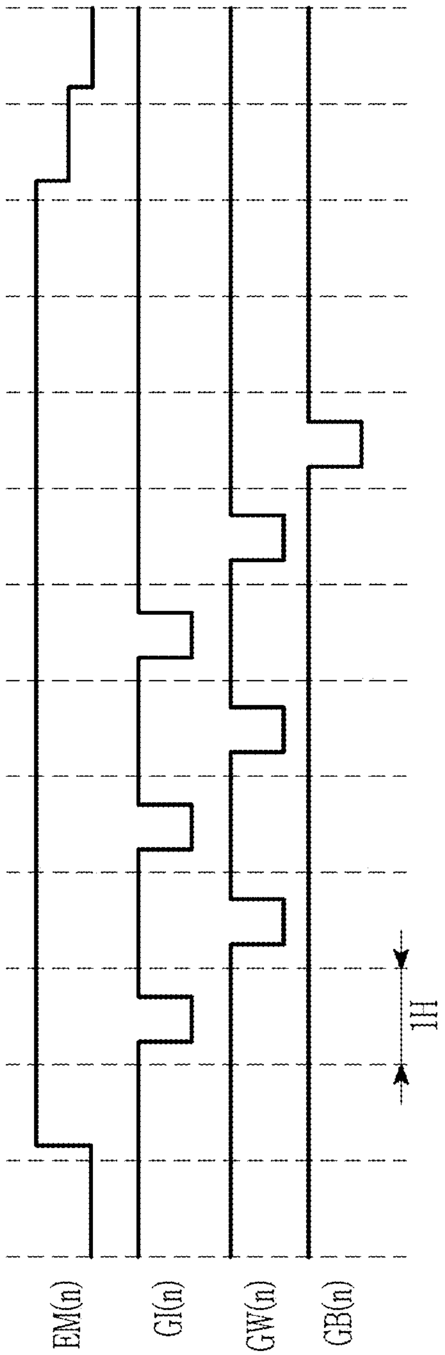
FIG. 9 is a waveform diagram of signals applied to the pixel of FIG. 8 according to an embodiment.

In the embodiment described in association with FIG. 9, the first initialization period and the writing period are repeated 3 times, and among the data voltages Dm applied in the writing period, the data voltage Dm applied in the third writing period is the data voltage for the pixel circuit unit PXC, and the data voltage before that is the data voltage of the preceding pixel circuit unit PXC. Applying the preceding data voltage first is a driving method to reduce a length of the writing period (a period of 1H) through the pre-charging.

When the third writing period ends, the second initialization period proceeds. For example, in the second initialization period, the bypass signal GB(n) is applied as a low voltage, and as a result, the seventh transistor T7 is turned on to change the anode voltage of the light emitting diode (LED) to the initialization voltage $V_{INT}$.

After that, as the light emission control signal EM(n) is changed to the low voltage again, the light emission period proceeds. For example, when the fifth transistor T5 is turned on, the driving voltage ELVDD is applied to the input side terminal of the driving transistor T1, and the output current is generated based on the difference from the voltage of the gate electrode 155 of the driving transistor T1. Here, the voltage of the gate electrode 155 of the driving transistor T1 has the voltage that is lower than the data voltage Dm by the threshold voltage of the driving transistor T1, and the threshold voltage is used to turn on the driving transistor T1, and the output current is generated based on the difference of the driving voltage ELVDD and the data voltage Dm. This driving method has a characteristic of compensating for the characteristic of each driving transistor T1 even if the threshold voltage of the driving transistor T1 is different for each pixel circuit unit PXC.

As described above, the output current generated from the driving transistor T1 passes through the sixth transistor T6 that is turned on by the low voltage of the light emission control signal EM(n) and is transmitted to the anode of the light emitting diode (LED) via the diode connection part LDE and the anode corresponding pad LDA1 and LDA2. The degree of the light emission of the light emitting diode (LED) is adjusted according to the magnitude of the transmitted output current.

In FIG. 8, a capacitor (Cled) for the light emitting diode (LED) with electrodes respectively connected to the anode and the cathode of the light emitting diode (LED) is further included. The capacitor Cled for the light emitting diode (LED) may be a capacitor formed by overlapping the anode corresponding pads LDA1 and LDA2 or the diode connection part LDE, and the cathode corresponding pads LDC1 and LDC2 and a function that the output current output from the pixel circuit unit PXC is stored to the capacitor Cled for the light emitting diode (LED) and is maintained may be performed. The capacitor Cled for the light emitting diode (LED) may be omitted according to an embodiment.

The embodiment described in association with FIG. 8 also includes the pixel output test unit PXCT.

The pixel output test unit PXCT is a part for checking whether the unit light emitting diode (LED) LDU is defective by checking whether the pixel circuit unit PXC properly generates the output current before the unit light emitting diode (LED) LDU is attached, and may not be included according to an embodiment.

The pixel output test unit PXCT further includes an eighth transistor T8 and a test signal line 157 for controlling the eighth transistor T8.

The eighth transistor T8 includes a semiconductor layer having a channel, and a first region and a second region positioned on both sides of the channel, and a gate electrode, and may have a dual gate structure like the third transistor T3 and the fourth transistor T4. For example, in the two eighth transistor T8, the channel is formed at the part where the test signal line 157 and the semiconductor layer 130 meet, and the part where the test signal line 157 and the semiconductor layer 130 meet is formed in two places. In this case, the gate electrode of the eighth transistor T8 may be a part of the test signal line 157. The input side terminal of the eighth transistor T8 having a dual gate structure is connected to the anode corresponding pads LDA1 and LDA2 or diode connection part LDE, and the output side terminal is connected to the cathode corresponding pads LDC1 and LDC2. As a result, if the low voltage is applied to the test signal line 157, the output current of the pixel circuit unit PXC is input to the input side terminal of the eighth transistor T8 and then is output to the output side terminal. For instance, it may be checked whether the pixel circuit unit PXC normally generates the output current based on the output current flowing through the eighth transistor T8.

Figure 10A:
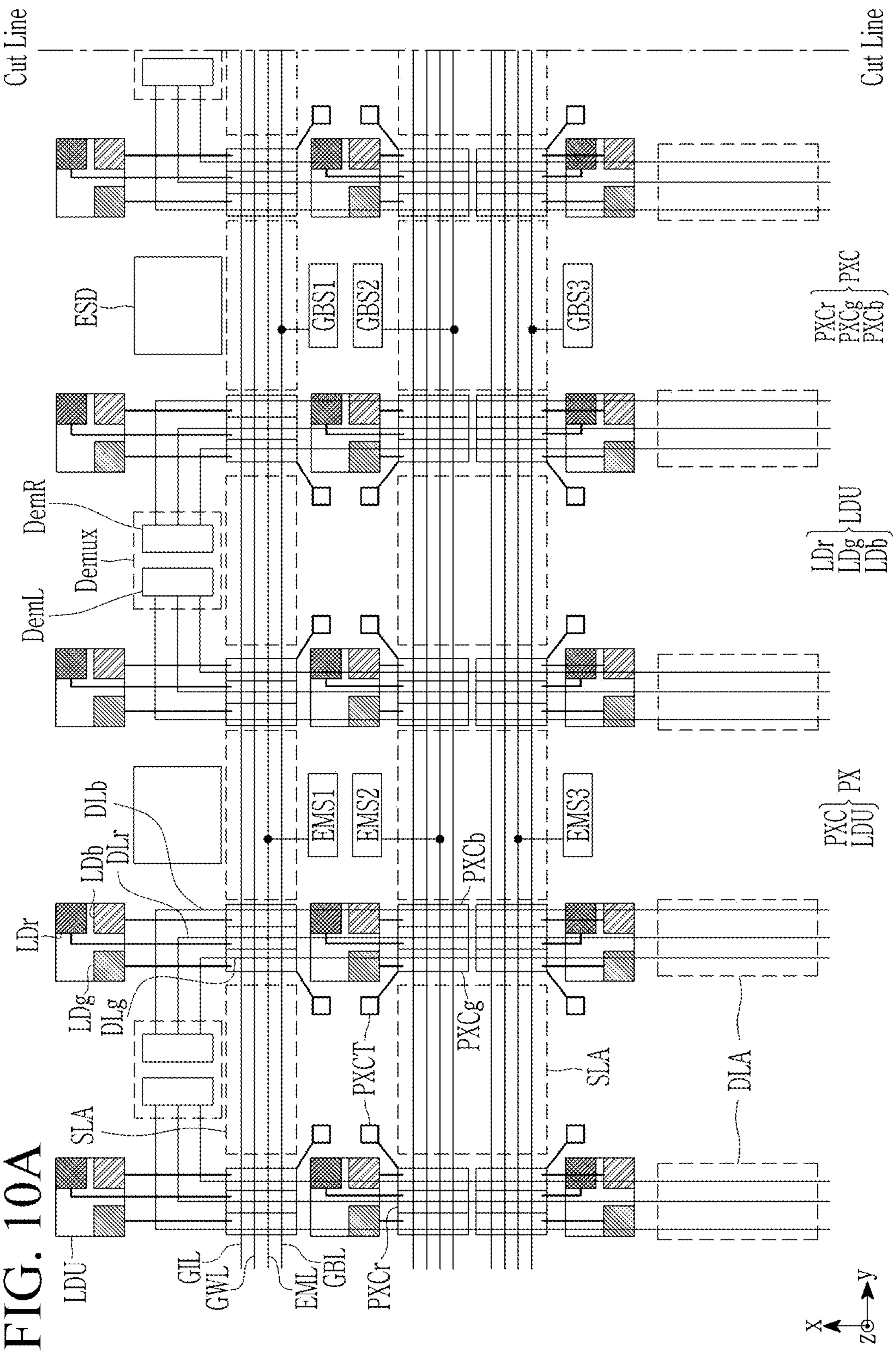
FIGS. 10A and 10B are upper layout views of a driving region of a light emitting display device according to various embodiments.
Figure 10B:
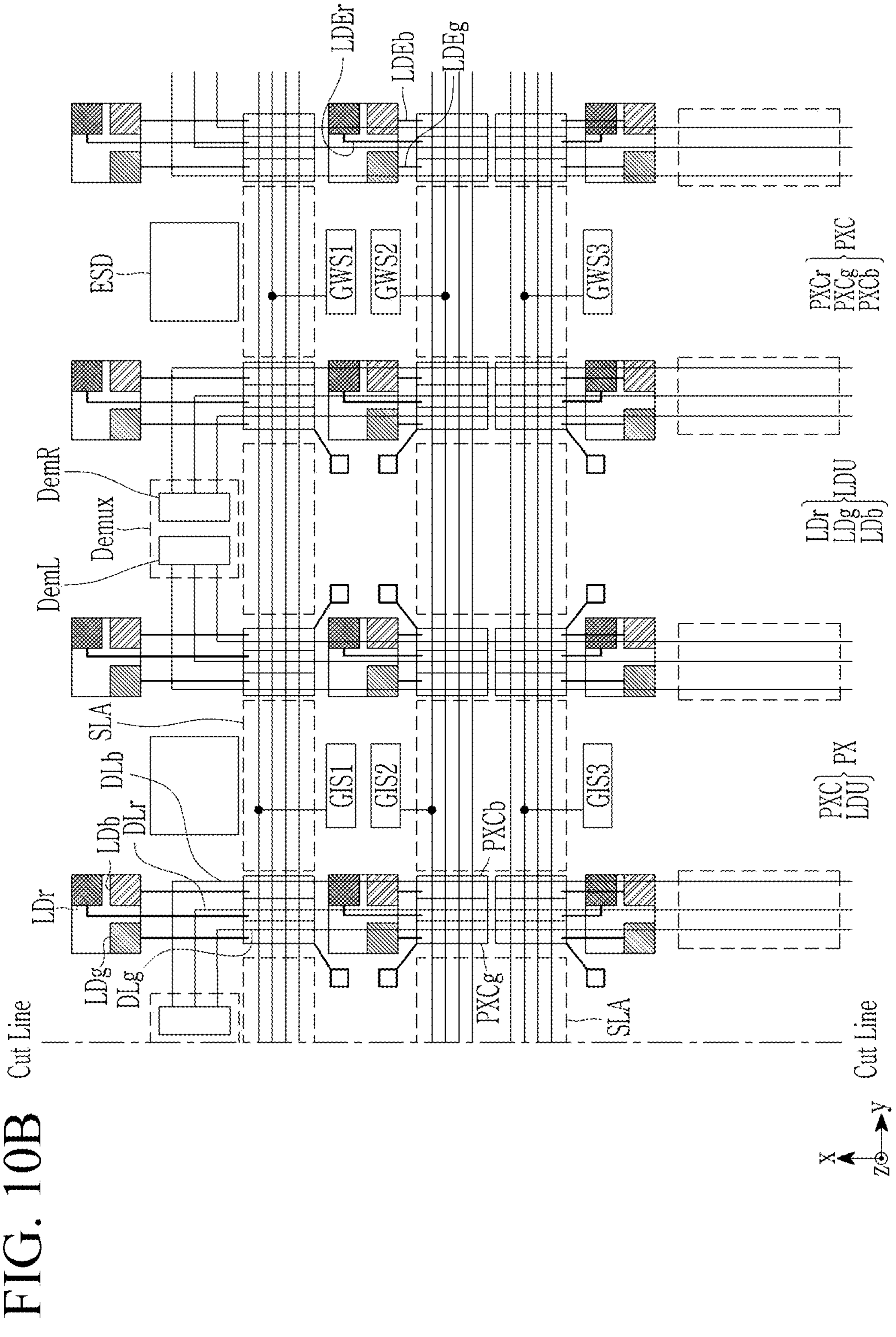

The light emitting display device 10 including such a pixel output test unit PXCT may have a different structure from that of FIGS. 2 to 4, and the light emitting display device 10 including the pixel output test unit PXCT is described through FIGS. 10A and 10B.

FIGS. 10A and 10B are upper layout views of a driving region of a light emitting display device according to an embodiment.

FIGS. 10A and 10B are to be cut at a Cut Line, and when being connected based on the Cut Line of the two drawings, show the upper layout view of the driving region of the light emitting display device.

In FIGS. 10A and 10B as compared with FIG. 3, the pixel output test unit PXCT is positioned between two unit light emitting diodes (LED) LDU adjacent in the second direction (the y-axis direction), thereby overlapping the position where a plurality of signal generating units are formed in FIG. 3. As a result, to dispose all four types of the stages EMS, GBS, GIS, and GWS, twice the rows are used as compared with FIG. 3.

Also, the pixel output test unit PXCT and a plurality of signal generating units are alternately arranged. For example, in the left region 10-2 or the right region 10-3, one stage for the signal among the pixel output test unit PXCT and a plurality of signal generating units is alternately disposed between two unit light emitting diodes (LED) LDU adjacent in the second direction (the y-axis direction). In more detail, the pixel output test unit PXCT is positioned between the first column unit light emitting diode (LED) LDU and the second column unit light emitting diode (LED) LDU, the stages EMS1, EMS2, and EMS3 for the light emission signal are positioned between the second column unit light emitting diode (LED) LDU and the third column unit light emitting diode (LED) LDU, the pixel output test unit PXCT is positioned between the third column unit light emitting diode (LED) LDU and the fourth column unit light emitting diode (LED) LDU, the stages GBS1, GBS2, and GBS3 for the bypass signal are positioned between the fourth column unit light emitting diode (LED) LDU and the fifth column unit light emitting diode (LED) LDU, the pixel output test unit PXCT is positioned between the fifth column unit light emitting diode (LED) LDU and the sixth column unit light emitting diode (LED) LDU, the stages GIS1, GIS2, and GIS3 for the second scan signal are positioned between the sixth column unit light emitting diode (LED) LDU and the seventh column unit light emitting diode (LED) LDU, the pixel output test unit PXCT is positioned between the seventh column unit light emitting diode (LED) LDU and the eighth column unit light emitting diode (LED) LDU, and the stages GWS1, GWS2, and GWS3 for the first scan signal are positioned between the eighth column unit light emitting diode (LED) LDU and the ninth column unit light emitting diode (LED) LDU.

The central region 10-1 is positioned after the ninth column unit light emitting diode (LED) LDU, and from FIG. 2, the pixel output test unit PXCT may be additionally formed between the unit light emitting diodes (LED) LDU. The pixel output test units PXCT, as shown in FIG. 10A, may be sparsely formed.

In FIGS. 10A and 10B, although it is shown that there is a space where the pixel output test unit PXCT may be formed together in the region where four types of the stages EMS, GBS, GIS, and GWS are formed, according to an embodiment, to form more dense unit light emitting diodes (LED) LDU, the pixel output test unit PXCT may not be able to be positioned between the adjacent unit light emitting diodes (LED) LDU with one of four types of the stages EMS, GBS, GIS, and GWS. However, according to an embodiment, if there is space, the pixel output test unit PXCT and one of four types of stages EMS, GBS, GIS, and GWS may be positioned between the adjacent unit light emitting diodes (LED) LDU and may be formed together.

Hereinafter, as an embodiment, the position of the opening forming region 60A where the dummy opening 60 may be positioned will be described with reference to FIG. 11.

Figure 11:
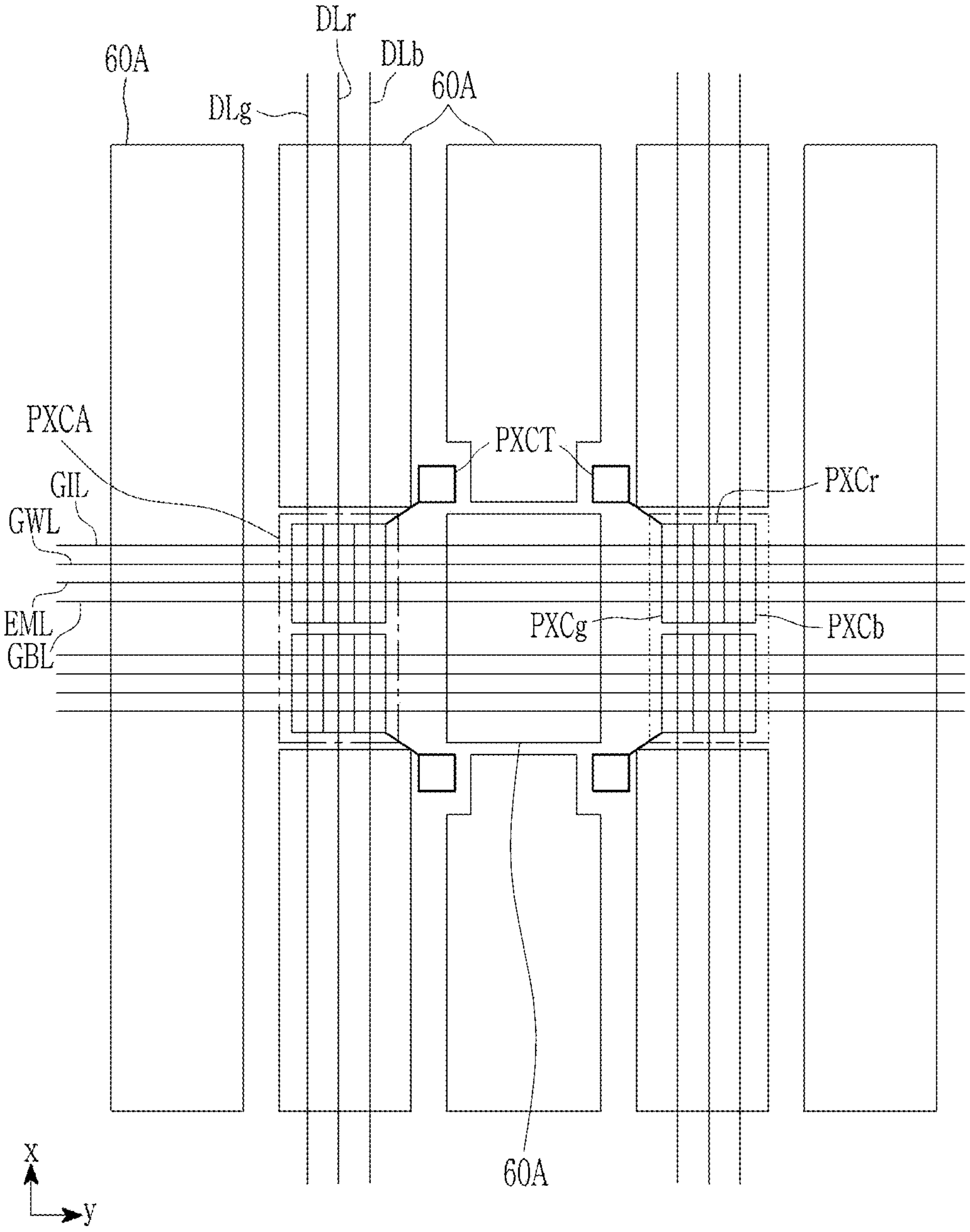
FIG. 11 is a view showing a region where an opening may be positioned in a light emitting display device according to an embodiment.

FIG. 11 is a view showing a region where an opening may be positioned in a light emitting display device according to an embodiment.

In an embodiment described in association with FIG. 11, the central region 10-1 of the light emitting display device 10 is shown, and the pixel circuit unit forming region PXCA and the pixel output test unit PXCT are shown. The pixel circuit unit forming region PXCA may represent the region where six pixel circuit units PXC are formed, and the pixel output test unit PXCT includes the eighth transistor T8 corresponding to three pixel circuit units PXC, thereby one pixel output test unit PXCT may include three eighth transistors T8.

According to FIG. 11, it is shown that the opening forming region 60A in which the dummy opening 60 may be formed may be formed except for the pixel circuit unit forming region PXCA in which the pixel circuit unit PXC is formed and the region where the pixel output test unit PXCT is formed. Therefore, the dummy opening 60 may also be formed in the region (referring to LDUA of FIG. 12) to which the unit light emitting diode (LED) LDU is attached, the data line extending region DLA, and the signal line extending region SLA. In addition, the dummy opening 60 may be formed even in a portion where nothing is formed. Here, the part where nothing is formed means a region where only the insulating layer is formed, and the dummy opening 60 may be formed in the insulating layer.

The dummy opening 60 may be formed in all opening forming regions 60A, but the dummy opening 60 may be formed only in at least one of the opening forming regions 60A shown in FIG. 11.

In the left region 10-2 and the right region 10-3 of the light emitting display device 10 according to the embodiment described in association with FIG. 11, the dummy opening 60 may not be formed in the region where the signal generating unit is positioned. For instance, in the region where each stage EMS, GBS, GIS, and GWS is not positioned, the opening forming region 60A may not be positioned.

Also, in the upper region 10-4 and the lower region 10-5 of the light emitting display device 10 according to the embodiment described in association with FIG. 11, the dummy opening 60 may not be formed in the data distribution unit including the demuxer Demux and the region where the static electricity prevention unit ESD is positioned, thereby the opening forming region 60A may not be positioned.

For the dummy opening 60 positioned in the opening forming region 60A, as shown in FIG. 5, the dummy opening 60 of a certain size may be formed according to the matrix, and the dummy opening 60 may be formed using a mask used in a specific pattern as shown in FIGS. 27 to 29. In addition, the dummy opening 60 may be formed in various sizes and densities.

Hereinafter, an embodiment for forming a dummy pattern is described with reference to FIG. 12.

Figure 12:
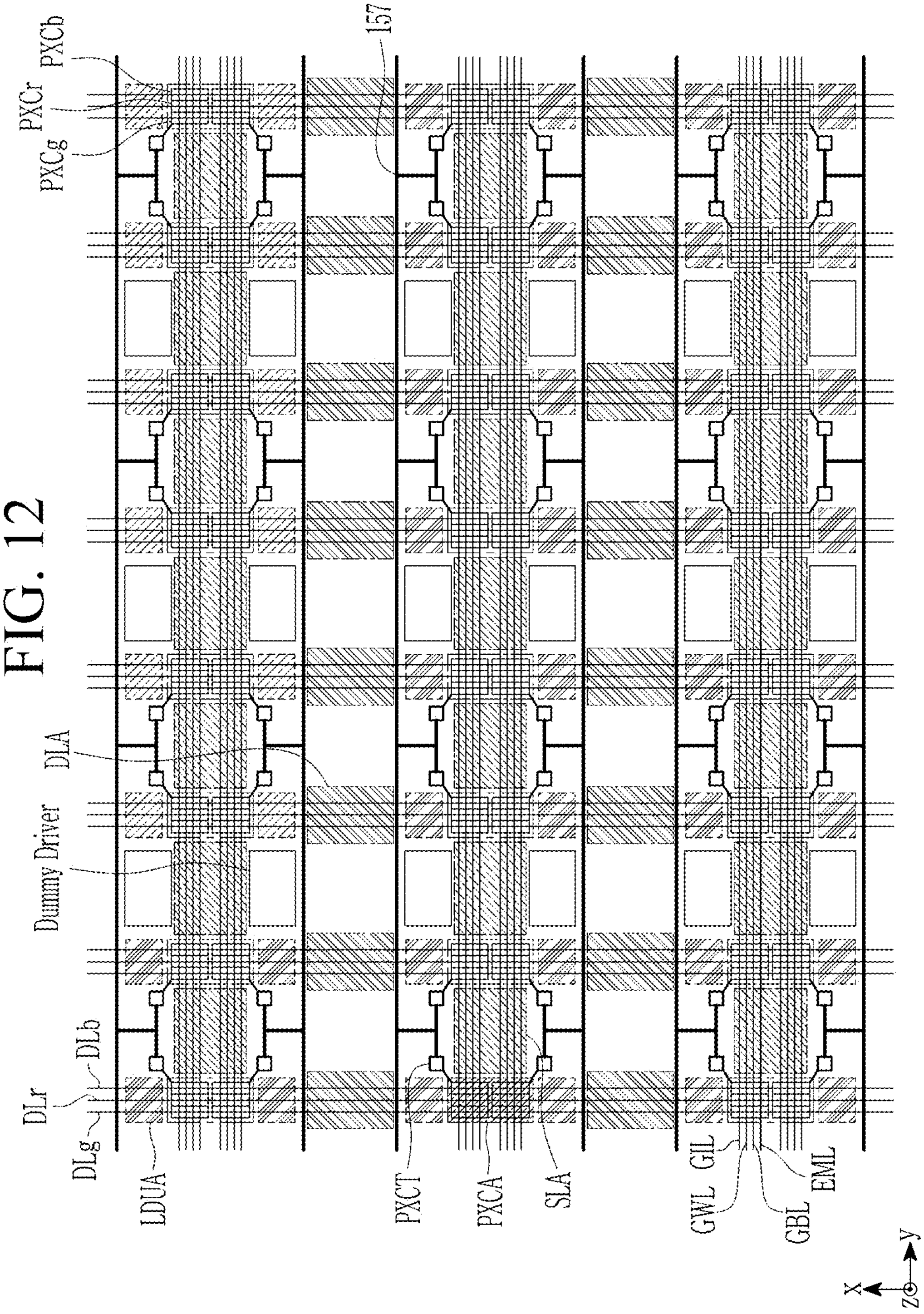
FIG. 12 is a view showing a light emitting display device including a dummy driver according to an embodiment.

FIG. 12 is a view showing a light emitting display device including a dummy driver according to an embodiment.

In the embodiment described in association with FIG. 12, the central region 10-1 of the light emitting display device 10 is shown, and FIG. 12 shows a state that the unit light emitting diode (LED) LDU is not attached in a region (a light emitting diode (LED) attachment region LDUA) to which the unit light emitting diode (LED) LDU is attached.

As shown in FIG. 12, the pixel circuit unit forming region PXCA where the pixel circuit unit PXC is formed, the data line extending region DLA where the data line connected to the pixel circuit unit PXC extends, the signal line extending region SLA where the signal line connected to the pixel circuit unit PXC extends, and the pixel output test unit PXCT are also formed. Particularly, the test signal line 157 connected to the gate electrode of the eighth transistor T8 included in the pixel output test unit PXCT is also formed.

In the central region 10-1 in which these constituent elements are arranged, in the left region 10-2 and the right region 10-3, a dummy driver having the same pattern and dummy opening as the stage for the signal may be formed in the region where the stage for the signal included in a plurality of signal generating units is positioned. For instance, the same pattern is formed using the same mask as one of the stages EMS, GBS, GIS, and GWS, and the dummy opening (referring to 60 in FIG. 27 and FIG. 28) may be included. The dummy driver has the same pattern as the actual stages EMS, GBS, GIS, and GWS, but has a structure that does not operate because no external signal or voltage is applied.

According to an embodiment, the dummy driver may include only some of the patterns of each stage EMS, GBS, GIS, and GWS, and in this case, may include a dummy opening.

Among the central region 10-1, in the region adjacent to the left region 10-2, at the position where the dummy driver is formed from the leftmost column toward the center according to the arrangement of each stage EMS, GBS, GIS, and GWS of the left region 10-2, the stage EMS for the light emission signal of the light emission signal generating unit, the stage GBS for the bypass signal of the bypass signal generating unit, the stage GIS for the second scan signal of the second scan signal generating unit, and the stage GWS for the first scan signal of the first scan signal generating unit may be formed in order. Also, the same stage may be arranged along the first direction (the x-axis direction).

Among the central region 10-1, in the region adjacent to the right region 10-3, from the rightmost column toward the center according to the arrangement of each stage EMS, GBS, GIS, and GWS of the right region 10-3, the stage EMS for the light emission signal of the light emission signal generating unit, the stage GBS for the bypass signal of the bypass signal generating unit, the stage GIS for the second scan signal of the second scan signal generating unit, and the stage GWS for the first scan signal of the first scan signal generating unit may be formed in order. Also, the same stages may be arranged along the first direction (the x-axis direction).

A dummy opening 60 may be additionally formed in a region other than the region where the dummy driver is positioned, except for the pixel circuit unit forming region PXCA and the pixel output test unit PXCT. For instance, a dummy opening 60 may be further formed in the data line extending region DLA, the data line extending region DLA, the light emitting diode (LED) attachment region LDUA, and the region where nothing is formed.

As shown in FIG. 5, a dummy opening 60 of a constant size may be formed according to the matrix, and as shown in FIGS. 27 to 29, it is also possible to form the dummy opening 60 using a mask used in a specific pattern. In addition, the dummy opening 60 may be formed in various sizes and densities.

Hereinafter, each stage EMS, GBS, GIS, and GWS included in a plurality of signal generating unit, the demuxer Demux included in the data distribution unit, and the signals applied to them are described in more detail with reference to FIGS. 13 to 22.

First, the stage EMS for the light emission signal included in a plurality of signal generating unit will be described with reference to FIGS. 13 to 15 and 22.

The circuit structure of the stage EMS for the light emission signal will be described with reference to FIG. 13.

Figure 13:
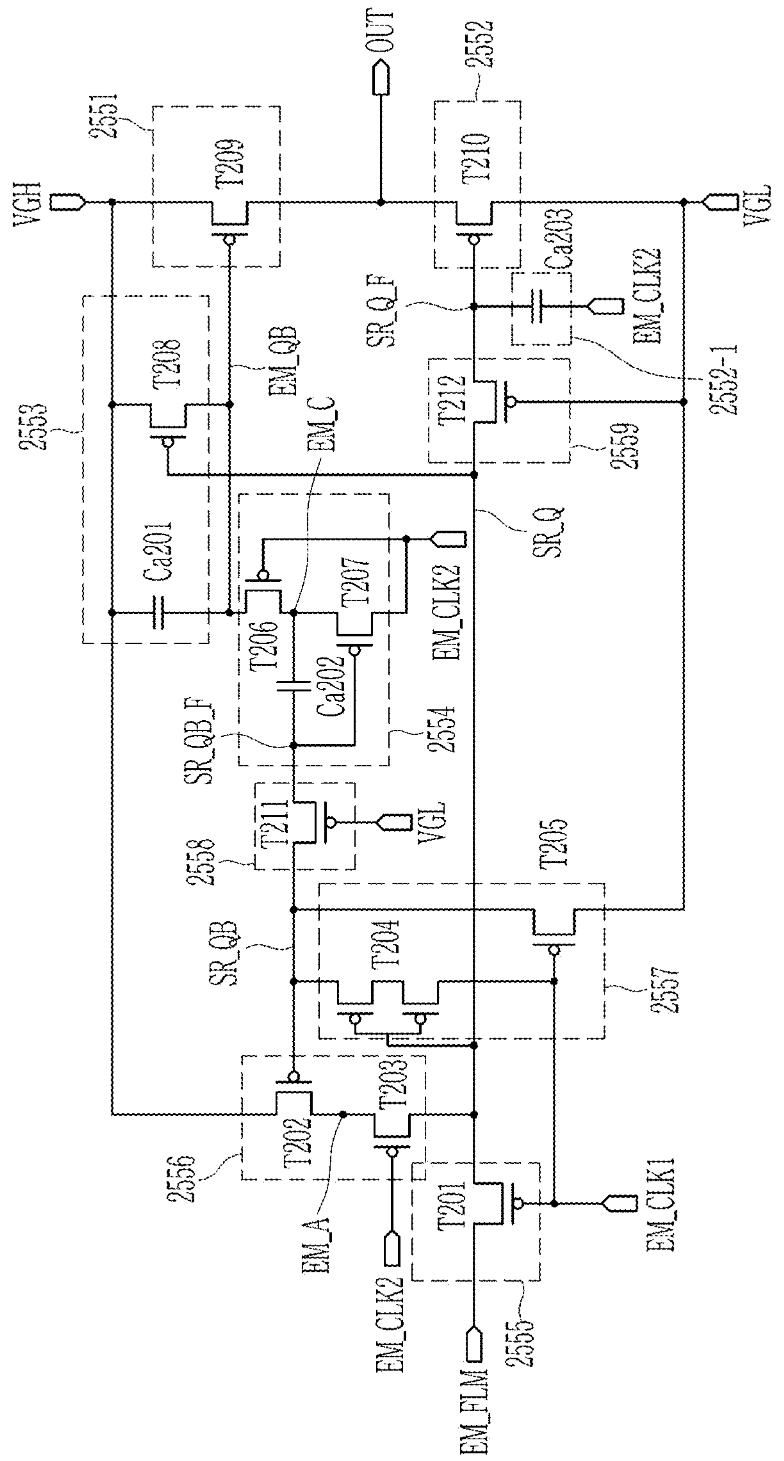
FIG. 13 is a circuit diagram of a stage configured to output a light emission signal according to an embodiment.

FIG. 13 is a circuit diagram of a stage for a light emission signal according to an embodiment.

The stage for each light emission signal according to an embodiment includes a high level output unit 2551, a low level output unit 2552, a first node first controller 2553, a first node second controller 2554, a second node first controller 2555, a second node second controller 2556, a third node controller 2557, a first connection part 2558, a second connection part 2559, and a 2-1 node storage unit 2552-1.

The core structure of the stage for each light emission signal is described as follows.

The high level output unit 2551 is a part outputting a high voltage VGH of the light emission signal, and the low level output unit 2552 is a part outputting a low voltage VGL of the light emission signal. The high level output unit 2551 and the low level output unit 2552 are connected to the output terminal OUT, and when the high voltage VGH is output from the high level output unit 2551, the low level output unit 2552 is not output, while when the low voltage VGL is output from the low level output unit 2552, the high level output unit 2551 is not output.

The high level output unit 2551 is controlled according to the voltage of the first node EM_QB, and the voltage of the first node EM_QB is controlled by the first node first controller 2553 and the first node second controller 2554.

The low level output unit 2552 is controlled according to the voltage of the second node SR_Q, and the voltage of the second node SR_Q is controlled by the second node first controller 2555. For instance, the low level output unit 2552 is connected to the second node SR_Q by the second connection part 2559, thereby being controlled according to the voltage of the 2-1 node SR_Q_F. However, since the 212 transistor T212 included in the second connection part 2559 receives a low voltage VGL as the control terminal and the turned on state is maintained, the low level output unit 2552 is actually controlled according to the voltage of the second node SR_Q.

The first node second controller 2554 is controlled by the voltage of the third node SR_QB, and the voltage of the third node SR_QB is controlled by the third node controller 2557. For example, the first node second controller 2554 is connected to the third node SR_QB by the first connection part 2558 and is controlled according to the voltage of the third-1 node SR_QB_F. However, since the 211 transistor T211 included in the first connection part 2558 receives the low voltage VGL as a control terminal and the turned on state, actually, the first node second controller 2554 is controlled according to the voltage of the third node SR_QB.

The stage for the light emission signal of FIG. 13 receives two clock signals EM_CLK1 and EM_CLK2, and the stage for the light emission signal in the next row is connected so that two clock signals are exchanged and input. Also, the stage for the light emission signal is shown to receive the FLM signal (hereinafter, also referred to as a start signal) through the input terminal, but if there is a stage for the preceding light emission signal (a previous stage for the light emission signal), the output of the stage for the light emission signal may be input to the input stage.

Each part of the stage of each light emission signal is described in more detail as follows.

The high level output unit 2551 includes a 209 transistor T209, the gate electrode of the 209 transistor T209 is connected to the first node EM_QB, the input side terminal is connected to the high voltage VGH terminal, and the output side terminal is connected to the output terminal OUT. As a result, when the voltage of the first node EM_QB is the low voltage, the high voltage VGH is output to the output terminal OUT, and when the voltage of the first node EM_QB is the high voltage, the 209 transistor T209 is turned off and then no output occurs.

The low level output unit 2552 includes a 210 transistor T210, the gate electrode of the 210 transistor T210 is connected to the 2-1 node SR_Q_F, the input side terminal is connected to the low voltage VGL terminal, and the output side terminal is connected to the output terminal OUT. As a result, when the voltage of the 2-1 node SR_Q_F is the low voltage, the low voltage VGL is output to the output terminal OUT, and when the voltage of the 2-1 node SR_Q_F is high, the 210 transistor T210 does not produce any output. Since the 212 transistor T212 included in the second connection part 2559 receives a low voltage VGL as a control terminal and the turned on state is maintained, the voltage of the 2-1 node SR_Q_F has substantially the same voltage as the voltage of the second node SR_Q. Therefore, the low level output unit 2552 is controlled by the second node SR_Q.

The first node first controller 2553 and the first node second controller 2554 controlling the voltage of the first node EM_QB will now be described.

The first node first controller 2553 includes one transistor (a 208 transistor T208) and one capacitor (a 201 capacitor Ca201). The gate electrode of the 208 transistor T208 is connected to the second node SR_Q, the input side terminal is connected to the high voltage VGH, and the output side terminal is connected to the first node EM_QB. The 208 transistor T208 transmits the high voltage VGH to the first node EM_QB when the second node SR_Q has the low voltage. Therefore, the first node first controller 2553 serves to change the voltage of the first node EM_QB to the high voltage VGH. Two electrodes of the 201 capacitor Ca201 are respectively connected to the input side terminal and the output side terminal of the 208 transistor T208, thereby the 201 capacitor Ca201 is connected between the first node EM_QB and the high voltage VGH terminal. Therefore, the 201 capacitor Ca201 serves to store and maintain the voltage of the first node EM_QB.

In an embodiment, the first node second controller 2554 includes two transistors (206 transistor T206 and 207 transistor T207) and one capacitor (202 capacitor Ca202). The gate electrode of the 206 transistor T206 is connected to the first clock input terminal (an input terminal to which EM_CLK2 is applied in FIG. 13), the output side terminal is connected to the first node EM_QB, and the input side terminal is connected to the fourth node EM_C. The gate electrode of the 207 transistor T207 is connected to the 3-1 node SR_QB_F, the output side terminal is connected to the fourth node EM_C, and the input side terminal is connected to the first clock input terminal (an input terminal to which EM_CLK2 is applied in FIG. 13). Since the 211 transistor T211 included in the first connection part 2558 receives the low voltage VGL and the turned on stage is maintained, the voltage of the 3-1 node SR_QB_F has substantially the same voltage as the voltage of the third node SR_QB. Therefore, the 207 transistor T207 is controlled by the third node SR_QB. Therefore, the first node second controller 2554 has a function of changing the voltage of the first node EM_QB to the low voltage of the clock signal EM_CLK2 when the voltage of the third node SR_QB and the clock signal EM_CLK2 input to the first clock input terminal have the low voltage. The 202 capacitor Ca202 is connected between the 3-1 node SR_QB_F and the fourth node EM_C, and the voltage change at both terminals may be reduced by using the voltage difference between the two nodes.

The second node first controller 2555 controlling the voltage of the second node SR_Q, the second node second controller 2556, and the 2-1 node storage unit 2552-1 will now be described.

The second node first controller 2555 consists of one transistor (a 201 transistor T201). The gate electrode of the 201 transistor T201 is connected to the second clock input terminal (an input terminal to which EM_CLK1 is applied in FIG. 13), the input side terminal is connected to the start signal input terminal (an input terminal to which a start signal FLM is applied or to which the output of the stage for the previous light emission signal is input), and the output side terminal is connected to the second node SR_Q. The 201 transistor T201 changes the voltage of the second node SR_Q to the voltage of the start signal FLM or the output signal of the stage for the previous light emission signal when the clock signal EM_CLK1 applied to the second clock input terminal (an input terminal to which EM_CLK1 is applied in FIG. 13) is the low voltage. For example, the second node first controller 2555 has a function of changing the voltage of the second node SR_Q to a carry signal (a start signal FLM or the output signal of the stage for the previous light emission signal) according to the clock signal EM_CLK1.

The 212 transistor T212 included in the second connection part 2559 receives the low voltage VGL as the control terminal and the turned on stage is maintained, and the voltage of the 2-1 node SR_Q_F has the same voltage as the voltage of the second node SR_Q.

Since the voltage of the 2-1 node SR_Q_F is the voltage controlling the 210 transistor T210 of the low level output unit 2552, the voltage of the 2-1 node SR_Q_F is stored and stabilized through the 2-1 node storage unit 2552-1. For instance, the 2-1 node storage unit 2552-1 includes a 203 capacitor Ca203, and the 203 capacitor Ca203 is connected between the first clock input terminal (an input terminal to which EM_CLK2 is applied in FIG. 13) and the 2-1 node SR_Q_F. Since the 201 transistor T201 included in the second node first controller 2555 is operated only when EM_CLK1 is the low voltage, in the case of the high voltage, the second node SR_Q and the 2-1 node SR_Q_F may be floated so that the 203 capacitor Ca203 has a function of maintaining the voltage of the 2-1 node SR_Q_ Flower by using the low voltage of the EM_CLK1 and the EM_CLK2 having the inversion signal.

The second node second controller 2556 includes two transistors (a 202 transistor T202 and a 203 transistor T203). The gate electrode of the 202 transistor T202 is connected to the third node SR_QB, the input side terminal is connected to the high voltage VGH terminal, and the output side terminal is connected to the fifth node EM_A. The gate electrode of the 203 transistor T203 is connected to the first clock input terminal (an input terminal to which the EM_CLK2 is applied in FIG. 13), the input side terminal is connected to the fifth node EM_A, and the output side terminal is connected to the second node SR_Q. The second node second controller 2556 serves to change the second node SR_Q to the high voltage when both EM_CLK2 and third node SR_QB have the low voltage.

The third node controller 2557 controlling the voltage of the third node SR_QB will now be described.

The third node controller 2557 includes two transistors (a 204 transistor T204 and a 205 transistor T205). The control terminal of the 204 transistor T204 is connected to the second node SR_Q, the input terminal is connected to the second clock input terminal (an input terminal to which the EM_CLK1 is applied in FIG. 13), and the output side terminal is connected to the third node SR_QB. According to FIG. 13, the 204 transistor T204 includes two transistors and each control terminal thereof is connected to the second node SR_Q to be equally operated, and has a structure in which the input terminal of one transistor and the output side terminal of the other transistor are connected to each other. The control terminal of the 205 transistor T205 is connected to the second clock input terminal (an input terminal to which the EM_CLK1 is applied in FIG. 13), the input terminal is connected to the low voltage VGL terminal, and the output side terminal is connected to the third node SR_QB. The 205 transistor T205 serves to make the voltage of the third node SR_QB the low voltage VGL, and the 204 transistor T204 serves to change the voltage of the third node SR_QB to the voltage of the clock signal EM_CLK1 when the second node SR_Q has a low voltage.

Unlike as described above, the input side terminal and the output side terminal may be named inversely according to the magnitude of the voltage to be connected.

The operation of the stage for light emission signal having such a configuration is determined according to the signal applied to two clock input terminals to which the two clock signals are respectively applied and the signal applied to the start signal input terminal. The signal applied to the stage for the light emission signal is included and shown in FIG. 22, and the operation of the stage for the light emission signal using EM_CLK1, EM_CLK2, EM_FLM, and EM 1 is as follows in FIG. 22.

Figure 22:
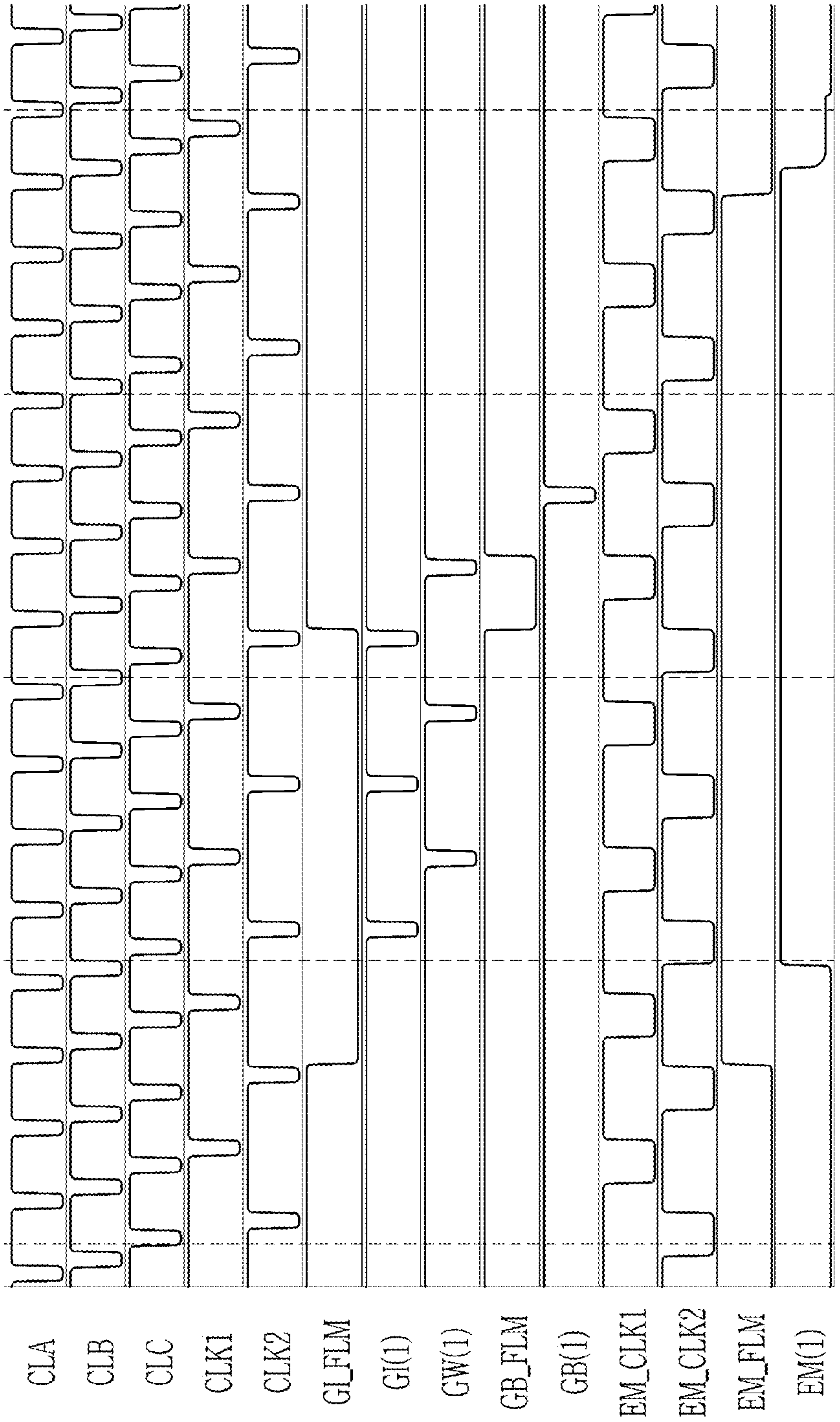
FIG. 22 is a waveform diagram of a signal applied to a stage configured to output light emission signal, a stage configured to output a scan signal, a data distribution unit, and an output signal thereof according to an embodiment.

FIG. 22 shows two clock signals EM_CLK1 and EM_CLK2 and the start signal EM_FLM, and an EM(1) as an output signal according thereto is also shown. For example, the stage for the light emission signal outputs a signal delayed by 1H from the input start signal EM_FLM. The light emission control signal output from the stage for the light emission signal is not only applied to the light emission control line 153, but is also applied to the stage for the light emission signal in the next row as the start signal EM_FLM.

The operation of the stage for the light emission signal of FIG. 13 based on the signal of FIG. 22 is described as follows.

Hereinafter, the stage for light emission signal is broadly classified into when the start signal EM_FLM has a high voltage and when it has a low voltage, and the operation according to the change of the voltage level of the clock signal in each classification is described.

First, as a case that the high voltage is applied to the start signal input terminal of the stage for the light emission signal, the operation of a case (hereinafter, referring to a first case) in which the clock signal EM_CLK2 input to the first clock input terminal has the high voltage and the clock signal EM_CLK1 input to the second clock input terminal has the low voltage is described.

The 206 transistor T206 is turned off due to the clock signal EM_CLK2 of the high voltage, the first node EM_QB is not changed into the low voltage, and the 203 transistor T203 also maintains the turned off state, thereby the second node second controller 2556 is not operated and the second node SR_Q is not changed into the high voltage.

The 201 transistor T201 and the 205 transistor T205 are turned on due to the low voltage of the clock signal EM_CLK1.

The start signal EM_FLM of the high voltage input to the start signal input terminal is applied to the second node SR_Q and the 2-1 node SR_Q_F through the 201 transistor T201, thereby the second node SR_Q and the 2-1 node SR_Q_F are changed into the high voltage. Due to the high voltage of the 2-1 node SR_Q_F, the 210 transistor T210 is turned off. Also, the 208 transistor T208 and the 204 transistor T204 are turned off due to the high voltage of the second node SR_Q.

Since the 205 transistor T205 is turned on, the low voltage VGL is applied to the third node SR_QB and the 3-1 node SR_QB_F. In this case, the 204 transistor T204 is turned off as the second node SR_Q has the high voltage, thereby the voltage of the third node SR_QB and the 3-1 node SR_QB_F is controlled by the 205 transistor T205 and is changed into the low voltage VGL.

The 202 transistor T202 is turned on due to the low voltage of the third node SR_QB so that the high voltage VGH is applied to the fifth node EM_A; however, since the 203 transistor T203 is turned off by the clock signal EM_CLK2 of the high voltage, the second node SR_Q is not changed into the high voltage.

The 207 transistor T207 is turned on by the low voltage of the 3-1 node SR_QB_F. As the 207 transistor T207 is turned on, the clock signal EM_CLK2 of the high voltage is applied to the fourth node EM_C. As a result, the high voltage (the fourth node EM_C) and the low voltage (the 3-1 node SR_QB_F) are applied to both terminals of the 202 capacitor Ca202. Also, the 207 transistor T207 is turned on;

however, since the 206 transistor T206 is turned off by the clock signal EM_CLK2 of the high voltage, the voltage of the first node EM_QB is not changed. Also, since the 208 transistor T208 is turned off, the voltage of the first node EM_QB does not change even with the high voltage VGH and maintains the existing voltage level.

For instance, when the stage for the light emission signal is the first, the voltage of the first node EM_QB is not changed and the existing voltage level is maintained. For example, when the stage for the light emission signal is outputting the high voltage VGH through the 209 transistor T209, it may continuously output the high voltage VGH. At this time, since the second node SR_Q and the 2-1 node SR_Q_F have the high voltage, the low voltage is not output through the 210 transistor T210.

A second case of the stage for the light emission signal will now be described. That is, as a case (hereinafter, referring to the second case) that the high voltage is applied to the start signal input terminal for the stage for the light emission signal, the operation of the case in which the clock signal EM_CLK2 input to the first clock input terminal has the low voltage and the clock signal EM_CLK1 input to the second clock input terminal has the high voltage will be described.

First, the 201 transistor T201 and the 205 transistor T205 are turned off by the clock signal EM_CLK1 of the high voltage.

The 201 transistor T201 is turned off, and then the voltage of the second node SR_Q and the 2-1 node SR_Q_F is not changed. Also, the voltage of the third node SR_QB and the 3-1 node SR_QB_F is not changed as the 205 transistor T205 is turned off.

The 206 transistor T206 is turned on due to the low voltage clock signal EM_CLK2. At this time, the 207 transistor T207 is turned on by the voltage of the 3-1 node SR_QB_F, e.g., the voltage stored in the 202 capacitor Ca202. As a result, the clock signal EM_CLK2 of the low voltage is applied to the first node EM_QB, and then the voltage of the first node EM_QB is changed to the low voltage. Therefore, when the stage for the light emission signal is the second case, the voltage of the first node EM_QB is changed into the low voltage and then the output of the high voltage VGH starts through the 209 transistor T209.

In some embodiments, the second node SR_Q and the 2-1 node SR_Q_F are changed to the high voltage by the second node second controller 2556. For example, the 203 transistor T203 is turned on due to the clock signal EM_CLK2 of the low voltage and the 202 transistor T202 is also turned on by the voltage of the third node SR_QB, e.g., the voltage of the 3-1 node SR_QB_F stored to the 202 capacitor Ca202, and then the high voltage VGH is transmitted to the second node SR_Q. As a result, the 210 transistor T210 is turned off and then the low voltage is not output.

A third case of the stage for the light emission signal will now be described. That is, as a case in which the low voltage is applied to the start signal input terminal of the stage for the light emission signal, the operation of a case in which the clock signal EM_CLK2 input to the first clock input terminal has the high voltage and the clock signal EM_CLK1 input to the second clock input terminal has the low voltage (hereinafter, referred to as a third case) will now be described.

Due to the high voltage clock signal EM_CLK2, the 206th transistor T206 is turned off so that the first node EM_QB does not change to the low voltage, and the 203rd transistor T203 is also turned off so that the second node SR_Q also has a high voltage.

The 201-th transistor T201 and the 205-th transistor T205 are turned on due to the low voltage clock signal EM_CLK1.

The start signal EM_FLM of a low voltage input to the start signal input terminal through the 201 transistor T201 is applied to the second node SR_Q and the 2-1 node SR_Q_F, and then the second node SR_Q and the 2-1 node SR_Q_F are changed to the low voltage. Due to the low voltage of the 2-1 node SR_Q_F, the 210 transistor T210 is turned on and starts to output the low voltage VGL.

Also, the 208 transistor T208 and the 204 transistor T204 are turned on due to the low voltage of the second node SR_Q. Among them, the 208 transistor T208 is turned on, so the first node EM_QB is changed to the high voltage VGH and the 209 transistor T209 is turned off.

Since the 205 transistor T205 is turned on, the low voltage VGL is applied to the third node SR_QB and the 3-1 node SR_QB_F. At this time, the 204 transistor T204 is also turned on by the low voltage of the second node SR_Q, and the voltage of the third node SR_QB and the 3-1 node SR_QB_F are controlled by the 205 transistor T205 and the 204 transistor T204 and is changed to the low voltage VGL.

The 202 transistor T202 is turned on due to the low voltage of the third node SR_QB), but the 203 transistor T203 is turned off due to the high voltage clock signal EM_CLK2, and the second node SR_Q is not changed to the high voltage.

Due to the low voltage of the 3-1 node SR_QB_F, the 207 transistor T207 is turned on. However, since the 206 transistor T205 is turned off due to the high voltage clock signal EM_CLK2, the voltage of the first node EM_QB is not changed.

For instance, when the stage for the light emission signal is the third case, the voltage of the first node EM_QB is changed to the high voltage VGH so that the 209 transistor T209 does not operate, and the second node SR_Q and the 2-1 node SR_Q_F are changed to the low voltage, and the low voltage VHL starts to be output through the 210 transistor T210.

A fourth case of the stage for the light emission signal will now be described. That is, as a case in which the low voltage is applied to the start signal input terminal of the stage for the light emission signal, the operation of a case in which the clock signal EM_CLK2 input to the first clock input terminal has the low voltage, and the clock signal EM_CLK1 input to the second clock input terminal has the high voltage (hereinafter referred to as the fourth case), will now be described.

First, the 201 transistor T201 and the 205 transistor T205 are turned off due to the high voltage clock signal EM_CLK1.

The 201 transistor T201 is turned off and the voltage of the second node SR_Q and the 2-1 node SR_Q_F is not changed. Also, the voltage of the third node SR_QB and the 3-1 node SR_QB_F is not changed as the 205 transistor T205 is turned off.

The 206 transistor T206 is turned on due to the low voltage clock signal EM_CLK2. At this time, the 207 transistor T207 may be turned on by the voltage of the 3-1 node SR_QB_F, e.g., the voltage stored in the 202 capacitor Ca202. As a result, the clock signal EM_CLK2 of the low voltage may be applied, but due to the low voltage of the second node SR_Q, the 208 transistor T208 maintains the turned on state so the first node EM_QB is continuously applied with the high voltage VGH and the voltage is not changed.

Therefore, when the stage for the light emission signal is the fourth case, the voltage of the first node EM_QB is maintained as the high voltage and then the 209 transistor T209 is not operated, and since the second node SR_Q and the 2-1 node SR_Q_F may maintain the existing stored low voltage, the 210 transistor T210 continues the previous operation thereof and outputs the low voltage.

Through the basic operation as described above, the start signal EM_FLM input to the input terminal is delayed by 1H and may be output as a light emission control signal. The output light emission control signal is not only applied to the light emission control line 153, but is also applied to the stage for the light emission signal in the next row as the start signal EM_FLM.

In the stage for the light emission signal of a next row, the clock signal EM_CLK1 is applied to the first clock input terminal to which the clock signal EM_CLK2 was applied, and the clock signal EM_CLK2 is applied to the second clock input terminal to which the clock signal EM_CLK1 was applied.

Hereinafter, a more detailed structure of the stage for the light emission signal according to an embodiment will be described with reference to FIGS. 14 and 15.

Figure 14:
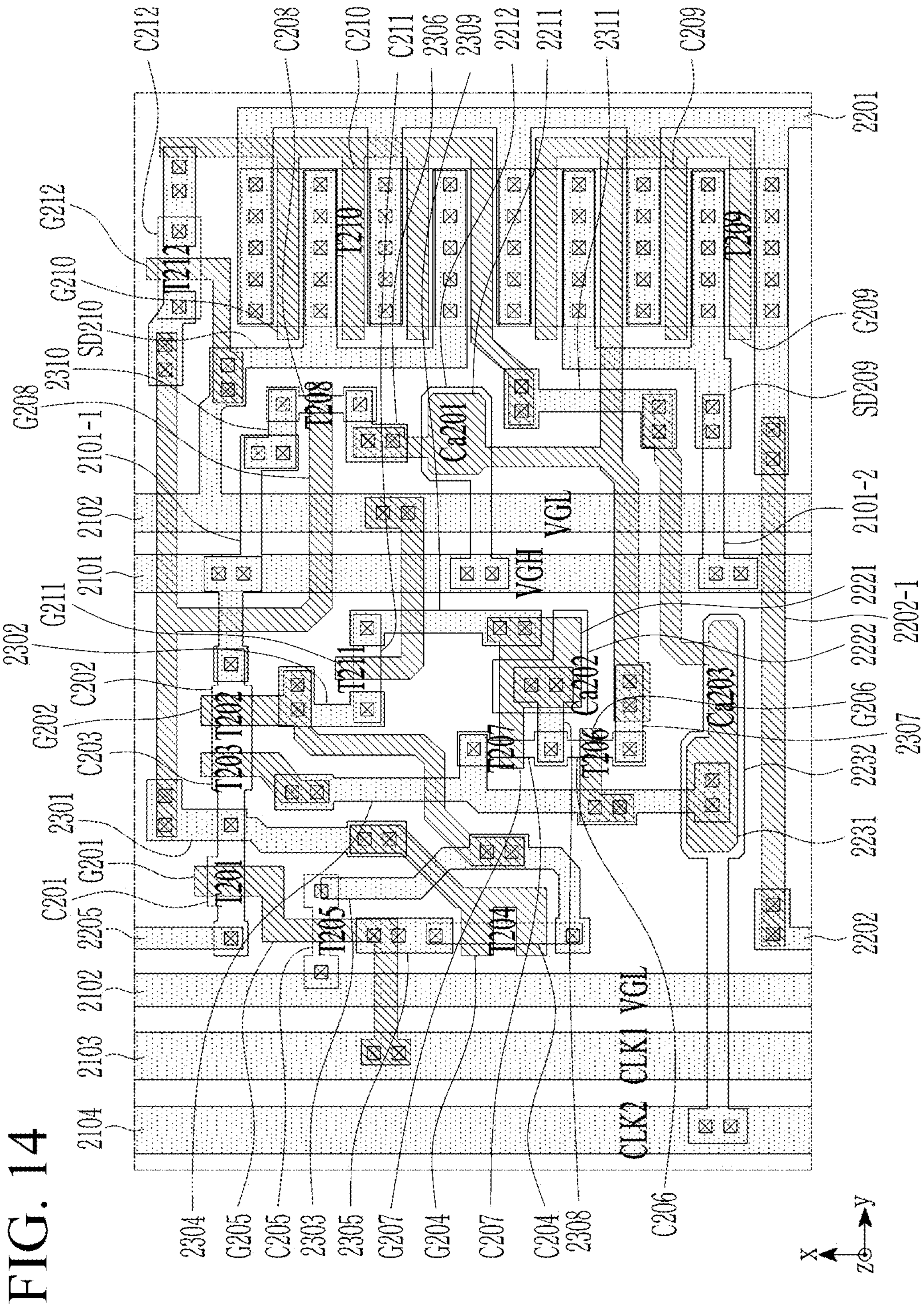
FIG. 14 is a layout view of a stage configured to output a light emission signal according to an embodiment.

FIG. 14 is a layout view of a stage for a light emission signal according to an embodiment. FIG. 15 is a cross-sectional view of a stage for a light emission signal according to an embodiment.

In FIG. 14, the mark represented by an x in the square indicates the opening positioned on the insulating layer, and allows the upper conductive layer and the lower conductive layer to be electrically connected to each other.

The cross-sectional structure of the transistor and the capacitor included in the stage for the light emission signal is the same.

Figure 15:
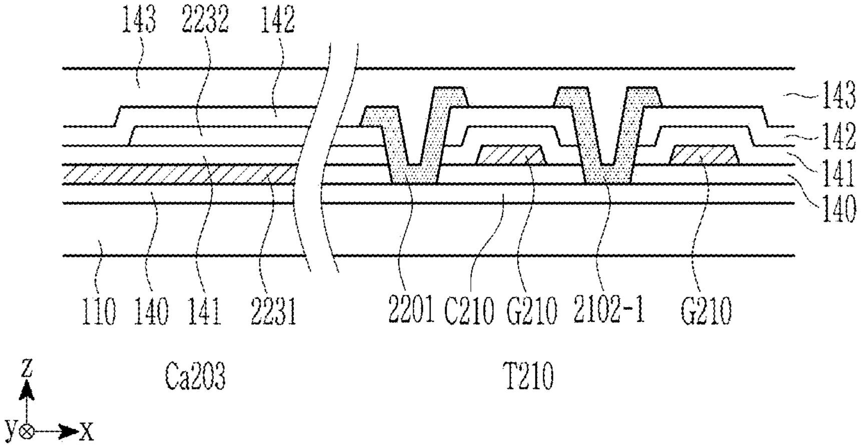
FIG. 15 is a cross-sectional view of a stage configured to output a light emission signal according to an embodiment.

Each transistor included in the stage for the light emission signal, like the 210-transistor shown in FIG. 15, includes the semiconductor layer C210, the first insulating layer 140, and the gate electrode positioned on the substrate 110, the channel is positioned at the part where the semiconductor layer C210 and the gate electrode overlap each other, and the source and drain regions, which are plasma-treated or doped and made into conductors, are positioned on both sides of the channel among the semiconductor layer. The layered structure is formed of the substrate 110, the semiconductor layer, the first insulating layer 140, the first gate conductive layer, the second insulating layer 141, the second gate conductive layer, the third insulating layer 142, the first data conductive layer, and the fourth insulating layer 143. The first gate conductive layer includes the gate electrodes of all transistors.

The gate electrode G201 of the 201 transistor T201 extends and is electrically connected to the second clock wiring 2103 to which the Clock signal CLK1 is applied. The semiconductor layer C201 includes the channel, the source region, and the drain region. One side of the semiconductor layer C201 is electrically connected to a connection line 2205 to which the start signal EM_FLM signal or the output of the stage for the previous light emission signal is transmitted, and the other side is connected to the connection part 2301 that is electrically connected to the gate electrode G204 of the 204 transistor T204. The connection part 2301 is positioned in the first data conductive layer. The 201 transistor T201 is connected to the 208 transistor T208 and the 212 transistor T212 by the connection part 2301, and the semiconductor layer C201 extends directly and is also connected to the 203 transistor T203.

The gate electrode G202 of the 202 transistor T202 extends and is electrically connected to the connection part 2302 for connecting the 204 transistor T204 and the 211 transistor T211. One side of the semiconductor layer C202 is electrically connected to high voltage wiring 2101 to which the high voltage VGH is applied, and the other side is directly connected to the semiconductor layer C203 of the 203 transistor T203. The gate electrode G202 is further extended and electrically connected to the connection part 2303, and is also electrically connected to the 204 transistor T204 and the 205 transistor T205. The connection parts 2302 and 2303 are positioned in the first data conductive layer.

The gate electrode G203 of the 203 transistor T203 is extended and electrically connected to the 206 transistor T206, the 207 transistor T207, and the 203 capacitor Ca203 through the connection part 2304. One side of the semiconductor layer C203 is connected to the connection part 2301, the 201 transistor T201 and the semiconductor layer are directly extended to be connected, and the other side of the semiconductor layer C203 is extended and directly connected to the semiconductor layer of the 202 transistor T202. The connection part 2304 is positioned in the first data conductive layer.

The gate electrode G204 of the 204 transistor T204 consists of two parts, is connected to one side of the 201 transistor T201 while being electrically connected to the connection part 2301, and is additionally extended to be electrically connected to the gate electrode G208 of the 208 transistor T208 and one side of the 212 transistor T212. One side of the semiconductor layer C204 is connected to the connection part 2303 to be connected to one side of the 205 transistor T205, and is also additionally connected to the gate electrode G202 of the 202 transistor T202 and one side of the 211 transistor T211. The other side of the semiconductor layer C204 is electrically connected to one terminal of the 205 transistor T205 and the second clock wiring 2103 to which the clock signal CLK1 is applied through the connection part 2305. The connection part 2305 is positioned in the first data conductive layer.

The gate electrode G205 of the 205 transistor T205 is extended to be electrically connected to the second clock wiring 2103 to which the clock signal CLK1 is applied and is additionally extended to the gate electrode G201 of the 201 transistor T201. One side of the semiconductor layer C205 is electrically connected to the low voltage wiring 2102 to which the low voltage VGL is applied, and the other side is electrically connected to the 204 transistor T204, the gate electrode G202 of the 202 transistor T202, and one terminal of the 211 transistor T211 through the connection part 2303.

The gate electrode G206 of the 206 transistor T206 is electrically connected to the connection part 2304, is electrically connected to the first clock wiring 2104 to which the CLK2 clock signal is applied through the 203 capacitor Ca203, and is electrically connected to the gate electrode G203 of the 203 transistor T203 and one terminal of the 207 transistor T207 through the connection part 2304. One side of the semiconductor layer C206 is connected to the connection part 2307 to be connected to the 201 capacitor Ca201, one side of the 208 transistor T208, and the gate electrode G209 of the 209 transistor T209, and the other side is directly extended to be connected to one side of the 207 transistor T207 and electrically connected to the 202 capacitor Ca202 by the connection part 2308. The connection parts 2307 and 2308 are positioned in the first data conductive layer.

The gate electrode G207 of the 207 transistor T207 is extended to form one electrode of the 202 capacitor Ca202 and is connected to the connection part 2309 to be connected to one end of the 211 transistor T211. One side of the semiconductor layer C207 is connected to the connection part 2304 to be connected to the gate electrode G206 of the 206 transistor T206 and the gate electrode G203 of the 203 transistor T203, and is electrically connected to the first clock wiring 2104 to which the CLK2 clock signal is applied through the 203 capacitor Ca203. The other side is directly extended to be connected to one side of the 206 transistor T206 and is connected to the connection part 2308 to be electrically connected to the other electrode of the 202 capacitor Ca202.

The gate electrode G208 of the 208 transistor T208 is extended to be connected to one side of the 212 transistor T212, and is electrically connected to one side of the 201 transistor T201 and the gate electrode G204 of the 204 transistor T204 through the connection part 2301. One side of the semiconductor layer C208 is connected to the connection part 2306 to be connected to the 201 capacitor Ca201 and one side of the 206 transistor T206, and the other side is connected to the connection part 2310 and the connection part 2101-1 to be electrically connected to the high voltage wiring 2101 to which the high voltage VGH is applied and is extended to one terminal of the 202 transistor T202. The connection parts 2306 and 2310 are positioned in the first data conductive layer, and the connection part 2101-1 is positioned in the second gate conductive layer.

The gate electrode G209 of the 209 transistor T209 is divided into a plurality thereof (composed of four gate electrodes in FIG. 14), is extended to be connected to the 201 capacitor Ca201, and is connected to one side of the 206 transistor T206 through the connection part 2307. One side of the semiconductor layer C209 is electrically connected to the high voltage wiring 2101 through the input side electrode SD209 and the connection part 2101-2, and the other side is connected to the output wiring 2201. The input side electrode SD209 is positioned in the first data conductive layer, and the connection part 2101-2 is positioned in the second gate conductive layer.

The gate electrode G210 of the 210 transistor T210 is divided into a plurality thereof (composed of four gate electrodes in FIG. 14), and is connected to the 203 capacitor Ca203 by the connection part 2311, and is extended to the other side to be connected to one terminal of the 212 transistor T212. One side of the semiconductor layer C210 is electrically connected to the low voltage wiring 2102 through the input side electrode SD210, and the other side is connected to the output wiring 2201. The input side electrode SD210 is positioned in the first data conductive layer.

The output wiring 2201 is electrically connected to the light emission signal line 153 through the extending connection line 2202 and a connection part 2202-1, the connection part 2202-1 is positioned in the first gate conductive layer, and the connection line 2202 is positioned in the first data conductive layer.

The gate electrode G211 of the 211 transistor T211 is extended to be electrically connected to the low voltage wiring 2102, one side of the semiconductor layer C211 is connected to the connection part 2309 to be connected to the 202 capacitor Ca202 and one terminal of the 207 transistor T207, and the other side is connected to the gate electrode G202 of the 202 transistor T202, one terminal of the 204 transistor T204, and one terminal of the 205 transistor T205 through the connection part 2302.

The gate electrode G212 of the 212 transistor T212 is extended to be electrically connected to the low voltage wiring 2102, one side of the semiconductor layer C212 is electrically connected to the gate electrode G210 of the 210 transistor T210, and the other side is electrically connected to one side of the 201 transistor T201, one side of the 203 transistor T203, the gate electrode G204 of the 204 transistor T204, and the gate electrode of the 208 transistor T208.

The capacitors Ca201, Ca202, and Ca203, like the 203 capacitor Ca203 as shown in FIG. 15, have a cross-sectional structure including the first gate conductive layer and the second gate conductive layer as two electrodes and the second insulating layer 141 positioned therebetween as the dielectric material.

In the 201 capacitor Ca201, one electrode 2212 is connected to the high voltage wiring 2101, and the other electrode 2211 is extended to be connected to the gate electrode G209 of the 209 transistor T209, one terminal of the 206 transistor T206, and one terminal of the 208 transistor T208.

In the 202 capacitor Ca202, one electrode 2222 is connected to one terminal of the 206 transistor T206 and one terminal of the 207 transistor T207 by the connection part 2308, and the other electrode 2221 is extended to be connected to the gate electrode G207 of the 207 transistor T207 and is connected to one terminal of the 211 transistor T211 by the connection part 2309.

In the 203 capacitor Ca203, one electrode 2232 is electrically connected to the gate electrode G203 of the 203 transistor T203, the gate electrode G206 of the 206 transistor T206, one terminal 207 of the transistor T207, and the first clock wiring 2104 to which the CLK2 clock signal is applied by the connection part 2304, and the other electrode 2231 is connected to the gate electrode G210 of the 210 transistor T210 through the connection part 2311.

Hereinafter, the stage for the scan signal included in a plurality of signal generating units will be described with reference to FIGS. 16 to 18 and 22. The stage for the scan signal may be used commonly for the stage for the first scan signal GWS, the stage for the second scan signal GIS, and the stage GBS for the bypass signal, and is the same stage, but the input clock signal and the start signal are different to produce different outputs.

For instance, in FIG. 22, when the stage for the scan signal is used as the stage for the second scan signal GIS, CLK1 and CLK2 are applied as the clock signals, and GI_FLM is applied as the start signal.

On the other hand, in FIG. 22, when the stage for the scan signal is used as the stage for the first scan signal GWS, CLK1, and CLK2 may be applied as the clock signals, and the signal later than GI_FLM by 1H may be applied as the start signal. This is because the first scan signal GW(1) is a later signal than the second scan signal GI(1) by 1H.

Also, in FIG. 22, when the stage for the scan signal is used as the stage GBS for the bypass signal, CLK1 and CLK2 are applied as the clock signals, and GB_FLM is applied as the start signal.

On the other hand, when the stage for the scan signal is used as the stage for the first scan signal GWS, the stage for the second scan signal GIS, and the stage GBS for the bypass signal, the input terminal to which the clock signal is input may be exchanged. For example, in the stage for the scan signal of the current row, if the clock signal CLK1 is applied to the first input terminal, the clock signal CLK2 is applied to the second input terminal; however, in the stage for the scan signal of the next row, the clock signal CLK2 is applied to the first input terminal, and the clock signal CLK1 is applied to the second input terminal.

Hereinafter, the circuit structure of the stage for the scan signal will be described with reference to FIG. 16.

Figure 16:
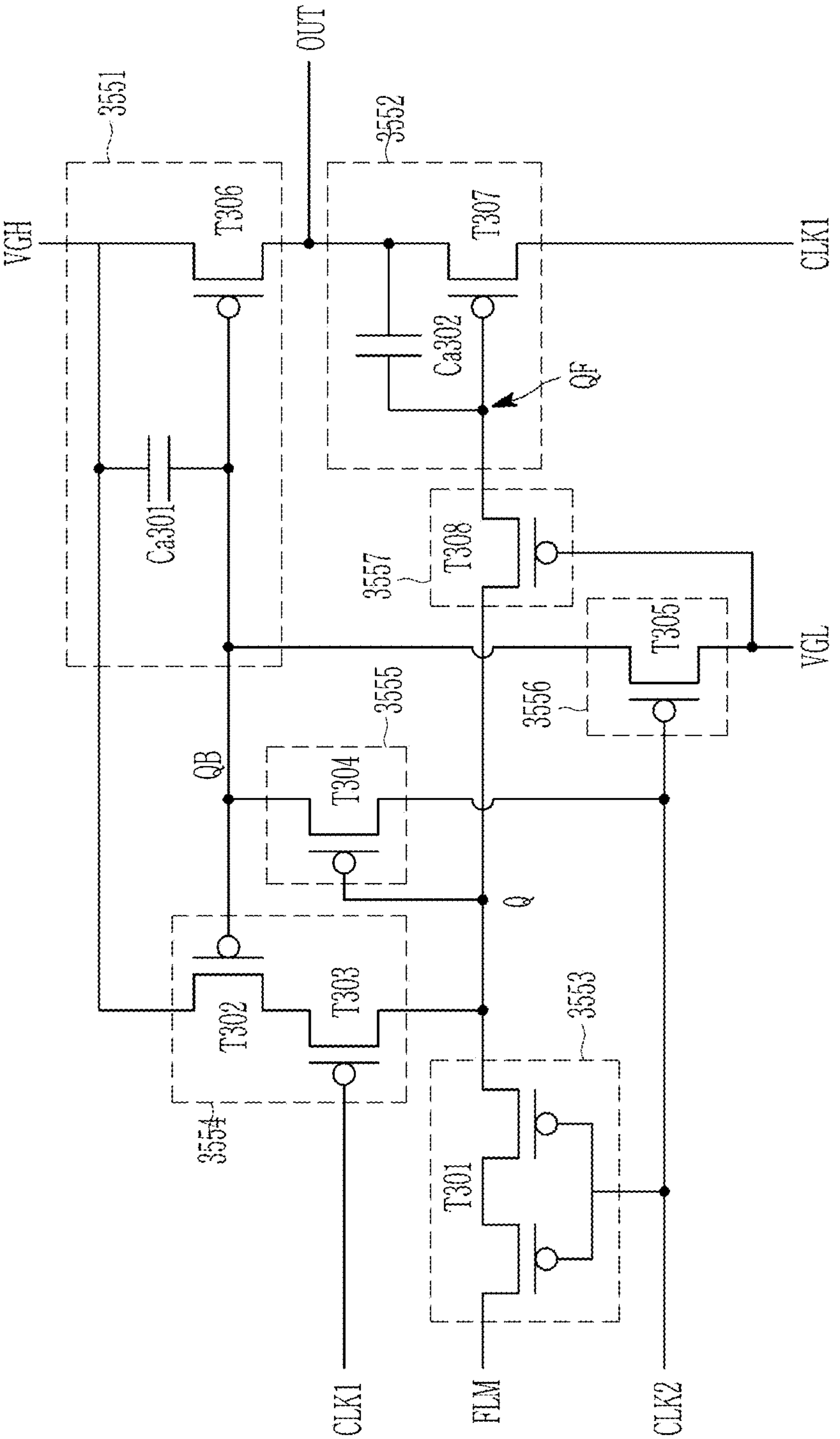
FIG. 16 is a circuit diagram of a stage configured to output a scan signal according to an embodiment.

FIG. 16 is a circuit diagram of a stage for a scan signal according to an embodiment.

The stage for each scan signal according to the present embodiment includes a high level output unit 3551, a low level output unit 3552, a first node first controller 3555, a first node second controller 3556, a second node first controller 3553, a second node second controller 3554, and a first connection part 3557.

The core structure of the stage for each scan signal is described as follows.

The high level output unit 3551 is a part that outputs the high voltage VGH of the scan signal, and the low level output unit 3552 is a part that outputs the low voltage VGL of the scan signal. The high level output unit 3551 and the low level output unit 3552 are connected to the output terminal OUT, and when the high voltage VGH is output from the high level output unit 3551, the low level output unit 3552 is output, while when the low voltage VGL is output from the low level output unit 3552, the high level output unit 3551 is not output.

The high level output unit 3551 is controlled according to the voltage of the first node QB, and the voltage of the first node QB is controlled by the first node first controller 3555 and the first node second controller 3556.

The low level output unit 3552 is controlled by the voltage of the second node Q, and the voltage of the second node Q is controlled by the second node first controller 3553 and the second node second controller 3554. For example, the low level output unit 2552 is connected to the second node Q by the first connection part 3557, so it is controlled according to the voltage of the 2-1 node QF. However, since the 308 transistor T308 included in the first connection part 3557 receives the low voltage VGL as the control terminal, the turn on state is maintained, so the low level output unit 3552 is actually controlled according to the voltage of the second node Q.

The stage for the scan signal of FIG. 16 receives two clock signals CLK1 and CLK2, and the stage for the scan signal in the next row is connected so that two clock signals are exchanged and input. Also, the stage for the scan signal of FIG. 16 is shown as receiving the start signal FLM signal through the input terminal, but when there is the previous stage for the scan signal (the stage for the previous scan signal), the output of the previous stage for the scan signal may be input to the input terminal.

A more detailed look at each part of the stage for the scan signal is described as follows.

The high level output unit 3551 includes a 306 transistor T306 and a 301 capacitor Ca301. The gate electrode of the 306 transistor T306 is connected to the first node QB, the input side terminal is connected to the high voltage VGH terminal, and the output side terminal is connected to the output terminal OUT. As a result, when the voltage of the first node QB is the low voltage, the high voltage VGH is output to the output terminal OUT, and when the voltage of the first node QB is the high voltage, the 306 transistor T306 is turned off and no output occurs. The high voltage VGH is applied to one terminal of the 301 capacitor Ca301, and the other terminal is connected to the first node QB to serve to maintain the voltage of the first node QB.

The low level output unit 3552 includes a 307 transistor T307 and a 302 capacitor Ca302. The gate electrode of the 307 transistor T307 is connected to the 2-1 node QF, the input side terminal is connected to the first input terminal to which the first clock signal CLK1 is applied, and the output side terminal is connected to the output terminal OUT. As a result, when the voltage of the 2-1 node QF is the low voltage, the voltage of the first clock signal CLK1 is output to the output terminal OUT, and when the voltage of the 2-1 node QF is the high voltage, the 307 transistor T307 does not produce any output. Here, in order for the 2-1 node QF to be a low voltage, the second node Q must be applied with the low voltage as the start signal FLM, and the low voltage applied to the 2-1 node QF is stored in the 302 capacitor Ca302, and at this time, the voltage of the first clock signal CLK1 is output to the output terminal OUT. The 308 transistor T308 included in the first connection part 3557 receives the low voltage VGL from the control terminal, and the turn on state is maintained, so the voltage of the 2-1 node QF has substantially the same voltage as the voltage of the second node Q. Therefore, the low level output unit 3552 is controlled by the second node SR_Q. One terminal of the 302 capacitor Ca302 is connected to the output terminal OUT, and the other terminal is connected to the 2-1 node QF, thereby serving to store and maintain the voltage of the 2-1 node QF.

The first node first controller 3555 and the first node second controller 3556 for controlling the voltage of the first node QB will now be described.

The first node first controller 3555 includes a 304 transistor T304. The gate electrode of the 304 transistor T304 is connected to the second node Q, the input side terminal is connected to the first input terminal to which the second clock signal CLK2 is applied, and the output side terminal is connected to the first node QB. As a result, the voltage of the first node QB is controlled according to the voltage of the second node Q, and in some embodiments, the voltage of the first node QB is changed to the high voltage of the clock signal.

The first node second controller 3556 includes a 305 transistor T305. The gate electrode of the 305 transistor T305 is connected to the first input terminal to which the second clock signal CLK2 is applied, the input side terminal receives the low voltage VGL, and the output side terminal is connected to the first node QB. As a result, according to the second clock signal CLK2 input to the first input terminal, the voltage of the first node QB is changed to the low voltage VGL.

The second node first controller 3553 and the second node second controller 3554 for controlling the voltage of the second node Q will now be described.

The second node first controller 3553 includes a 301 transistor T301. The gate electrode of the 301 transistor T301 is connected to the first input terminal to which the second clock signal CLK2 is applied, the input side terminal is connected to the start signal input terminal (an input terminal to which the start signal FLM signal or the output of the stage for the previous scan signal is input), and the output side terminal is connected to the second node Q. The 301 transistor T301 may be composed of two transistors, the gate electrodes are connected to the first input terminal in the same way, the input side terminal of one transistor is connected to the start signal input terminal, and the output side terminal of the other transistor is connected to the second node Q, and the output side terminal of one transistor and the input side terminal of the other transistor may be connected to each other. As a result, according to the second clock signal CLK2 input to the first input terminal, the voltage of second node Q is changed to the voltage input to the start signal input terminal.

The second node second controller 3554 includes a 302 transistor T302 and a 303 transistor T303. The gate electrode of the 302 transistor T302 is connected to the first node QB), the input side terminal receives the high voltage VGH, and the output side terminal is connected to the input side terminal of the 303 transistor T303. The gate electrode of the 303 transistor T303 is connected to the second input terminal to which the first clock signal CLK1 is applied, the input side terminal is connected to the output side terminal of the 302 transistor T302, and the output side terminal is connected to the second node Q. As a result, when the first node QB has a low voltage and the first clock signal CLK1 has a low voltage, the second node Q is changed to the high voltage VGH. Accordingly, when the first node QB has the low voltage VGL and the first clock signal CLK1 has the low voltage, the voltage of the second node Q has the high voltage VGH.

Unlike as described above, the input side terminal and the output side terminal may be named inversely according to the magnitude of the voltage to be connected.

The operation of the stage for the scan signal having such a configuration is determined according to the signals applied to two clock input terminals to which two clock signals are respectively applied and the start signal input terminal.

When the stage for the scan signal is used as the stage for the first scan signal GWS, the stage for the second scan signal GIS, and the stage GBS for the bypass signal, CLK1 and CLK2 are used as the clock signals shown in FIG. 22, and the different start signals are additionally applied as the start signal. For instance, FIG. 22 shows GI_FLM as the start signal applied in the case that it is used as the stage for the second scan signal GIS and GB_FLM as the start signal applied in the case that it is used as the stage GBS for the bypass signal. Meanwhile, when it is used as the stage for the first scan signal GWS, a signal later than GI_FLM by 1H is applied as the start signal.

Since there is no difference in the operation, the case being used as the stage for the second scan signal GIS among three stages is focused on and described by using CLK1, CLK2, and GI_FLM of FIG. 22.

The output of the output terminal OUT of the stage for the scan signal is output according to the operation of the 306 transistor T306 and the 307 transistor T307.

When the 305 transistor T305 is turned on, since the first node QB has the low voltage VGL, the 306 transistor T306 outputting the high voltage VGH outputs the high voltage VGH to the output terminal OUT. The turn on of the 305 transistor T305 only occurs when the second clock signal CLK2 applied to the first input terminal has the low voltage. Therefore, if the second clock signal CLK2 applied to the first input terminal has the low voltage, the stage for the scan signal outputs the high voltage VGH.

When the second clock signal CLK2 is the low voltage, the 301 transistor T301 is also turned on and the start signal FLM or the output of the previous stage for the scan signal is transmitted to the second node Q and the 2-1 node QF and is stored to the 302 capacitor Ca302. At this time, if the start signal FLM or the output of the previous stage for the scan signal has a high voltage, the 307 transistor T307 does not turn on and does not operate. However, when the start signal FLM or the output of the previous stage for the scan signal has the low voltage, the 307 transistor T307 is turned on to output the first clock signal CLK1. If the second clock signal CLK2 has the low voltage, the first clock signal CLK1 has the high voltage, so the output terminal OUT of the stage for the scan signal outputs the high voltage. However, when the second clock signal CLK2 has the high voltage, the 307 transistor T307 is turned on by the low voltage stored in the 302 capacitor Ca302 at this time, and the first clock signal CLK1 at that time, that is, the low voltage is output.

Therefore, in the stage for the scan signal, the start signal FLM or the output of the previous stage for the scan signal is stored to the 302 capacitor Ca302 when the second clock signal CLK2 has the low voltage, and then the first clock signal CLK1 of the low voltage is output through the 307 transistor T307 when the second clock signal CLK2 has the high voltage. Therefore, there is a difference between the input and the output by one clock signal, and a signal delayed by one clock signal width 1H is output.

Referring to FIG. 22, the GI_FLM start signal has a difference in the waveform from the output second scan signal GI 1, however since the GI_FLM start signal actually used in the operation of the stage for the scan signal is only the voltage when the second clock signal CLK2 has the low voltage, either GI_FLM is applied as the start signal or the second scan signal GI(n) of the previous stage is applied, and the same output is generated.

Also, in some embodiments, three low voltages exist in one frame for the first scan signal GW(n) and the second scan signal GI(n), but only one low voltage exists in one frame for the bypass signal GB(n). However, according to an embodiment, only one low voltage may exist in all of the first scan signal GW(n), the second scan signal GI(n), and the bypass signal GB(n) in one frame.

Hereinafter, a structure of the stage for the scan signal is described with reference to FIGS. 17 and 18.

Figure 17:
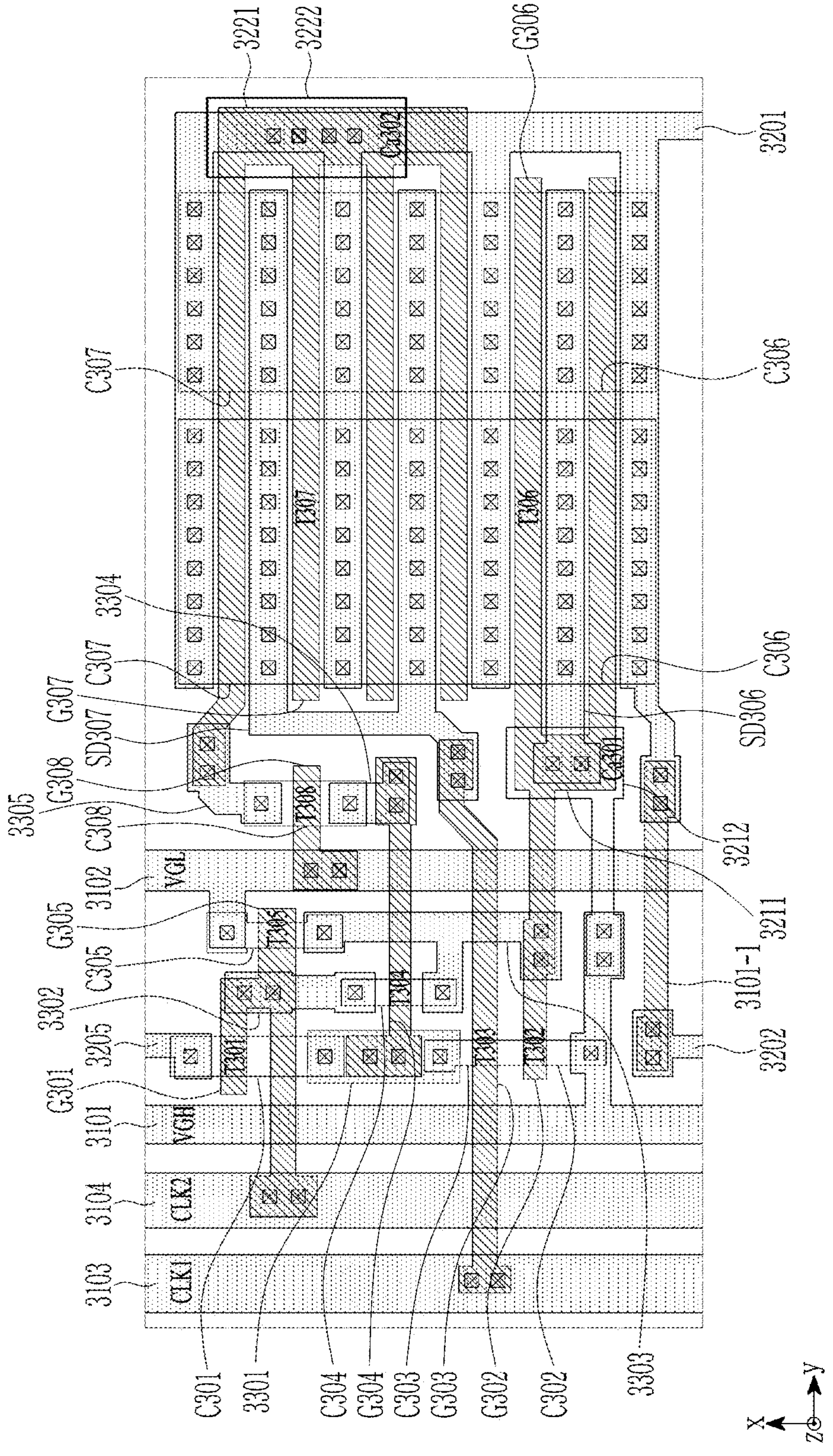
FIG. 17 is a layout view of a stage configured to output a scan signal according to an embodiment.

FIG. 17 is a layout view of a stage for a scan signal according to an embodiment. FIG. 18 is a cross-sectional view of a stage for a scan signal according to an embodiment.

In FIG. 17, the mark represented by an x in the square indicates the opening positioned in the insulating layer so that the upper conductive layer and the lower conductive layer are electrically connected to each other.

Figure 18:
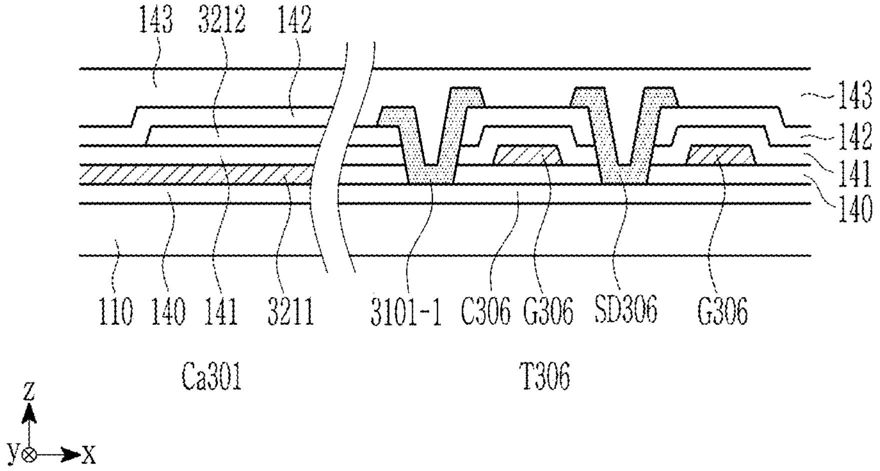
FIG. 18 is a cross-sectional view of a stage configured to output a scan signal according to an embodiment.

Each transistor included in the stage for the scan signal, like the 306 transistor T306 shown in FIG. 18, includes the semiconductor layer, the first insulating layer 140, and the gate electrode positioned on the substrate 110, the channel is positioned at the part where the semiconductor layer and the gate electrode overlap, and the source and drain regions that are plasma-treated or doped and made into conductors are positioned on both sides of the channel in the semiconductor layer.

The gate electrode G301 of the 301 transistor T301 consists of two parts, is extended on one side to the gate electrode G305 of the 305 transistor T305, and is extended on the other side to be electrically connected to the first clock wiring 2104 to which the CLK2 clock signal is applied. In addition, the gate electrode G301 is connected to one side of the 304 transistor T304 by the connection part 3302. One side of the semiconductor layer C301 is electrically connected to the connection line 3205 to which the start signal FLM signal or the output of the previous stage for the scan signal is transmitted, and the other side is connected to the gate electrode G304 of the 304 transistor T304, one side of the 308 transistor T308, and the connection part 3301 electrically connected to one side of the 303 transistor T303. The connection parts 3301 and 3302 are positioned in the first data conductive layer.

The gate electrode G302 of the 302 transistor T302 is extended to the 306 transistor T306 and one electrode 3211 of the 301 capacitor Ca301. It is also connected to the connection part 3303 to be electrically connected to one side of the 304 transistor T304 and one side of the 305 transistor T305. One side of the semiconductor layer C302 is electrically connected to high voltage wiring 3101 to which the high voltage VGH is applied, and the other side is directly connected to one side of the 303 transistor T303 with the semiconductor layer. For instance, the semiconductor layer C302 is extended and integrated with the semiconductor layer C303 of the 303 transistor T303. The connection part 3303 is positioned in the first data conductive layer.

The gate electrode G303 of the 303 transistor T303 is extended to one side to be electrically connected to the second clock wiring 3103 to which the clock signal CLK1 is applied, and is extended to the other side to be connected to one side of the 307 transistor T307. One side of the semiconductor layer C303 is connected to one side of the 301 transistor T301 through the connection part 3301, and the semiconductor layer C303 is extended to be directly connected to one side of the 302 transistor T302 with the semiconductor layer.

The gate electrode G304 of the 304 transistor T304 is extended to one side to be connected to the 301 transistor T301 and the 303 transistor T303 through the connection part 3301, and is extended to the other side to be connected to one side of the 308 transistor T308 through the connection part 3304. One side of the semiconductor layer C304 is connected to the gate electrode G301 of the 301 transistor T301 through the connection part 3302, and the other side is electrically connected to the gate electrode G302 of the 302 transistor T302, the gate electrode G306 of the 306 transistor T306 and one side of the of the 305 transistor T305 through the connection part 3303. The connection part 3304 is positioned in the first data conductive layer.

The gate electrode G305 of the 305 transistor T305 is extended to be connected to the gate electrode G301 of the 301 transistor T301, and is electrically connected to the first clock wiring 2104 to which the CLK2 clock signal is applied. One side of the semiconductor layer C305 is electrically connected to the low voltage wiring 3102 to which the low voltage VGL is applied, and the other side is electrically connected to the gate electrode G302 of the 302 transistor T302, the gate electrode G306 of the 306 transistor T306, and one side of the 304 transistor T304 through the connection part 3303.

The gate electrode G306 of the 306 transistor T306 is divided into a plurality thereof (consisting of two gate electrodes in FIG. 17), and is extended to be connected to one electrode 3211 of the 301 capacitor Ca301 and the gate electrode G302 of the 302 transistor T302. One side of the semiconductor layer C306 is connected to one electrode 3212 of the 301 capacitor Ca301 by the connection electrode SD306, and is electrically connected to the high voltage wiring 3101 via the 301 capacitor Ca301. The other side of the semiconductor layer C306 is connected to the output wiring 3201. The connection electrode SD306 is positioned in the first data conductive layer.

The gate electrode G307 of the 307 transistor T307 is divided into a plurality thereof (consisting of four gate electrodes in FIG. 17), and a part forms one electrode 3221 of the 302 capacitor Ca302, and is extended to be connected to one terminal of the 308 transistor T308 by the connection part 3305. One side of the semiconductor layer C307 is electrically connected to the gate electrode G303 of the 303 transistor T303 by the connection electrode SD307, and is also connected to the second clock wiring 2103 to which the clock signal CLK1 is applied through the gate electrode G303 of the 303 transistor T303. The other side of the semiconductor layer C307 is connected to the output wiring 3201. The connection electrode SD307 is positioned in the first data conductive layer.

The output wiring 3201 is electrically connected to the signal line by the connection part 3101-1 and the connection line 3202, the output wiring 3201 and the connection line 3202 are positioned in the first data conductive layer, and the connection part 3101-1 is positioned in the first gate conductive layer. When the stage for the scan signal is the stage for the first scan signal GWS, the signal line is the first scan line 151, and when it is the stage for the second scan signal GIS, the signal line is the second scan line 152, while when it is the stage for the bypass signal stage GBS, the signal line is the bypass signal line 158.

The gate electrode G308 of the 308 transistor T308 is extended and electrically connected to the low voltage wiring 3102 to which the low voltage VGL is applied. One side of the semiconductor layer C308 is electrically connected to the gate electrode G307 of the 307 transistor T307 by the connection part 3305, and the other side is electrically connected to the gate electrode G304 of the 304 transistor T304 by the connection part 3304.

The capacitors Ca301 and Ca302 have a cross-sectional structure including the first gate conductive layer and the second gate conductive layer as two electrodes, and the second insulating layer 141 positioned between them as a dielectric material.

As for the 301 capacitor Ca301, one electrode 3212 is extended to be connected to the high voltage wiring 3101, and the other electrode 3211 is positioned at a part of the gate electrode G306 of the 306 transistor T306.

As for the 302 capacitor Ca302, one electrode 3222 is electrically connected to the output wiring 3201, and the other electrode 3221 is positioned at a part of the gate electrode G307 of the 307 transistor T307.

Hereinafter, the demuxer Demux included in the data distribution unit will now be described with reference to FIGS. 19 to 22.

First, the circuit structure of the demuxer Demux is described with reference to FIG. 19.

Figure 19:
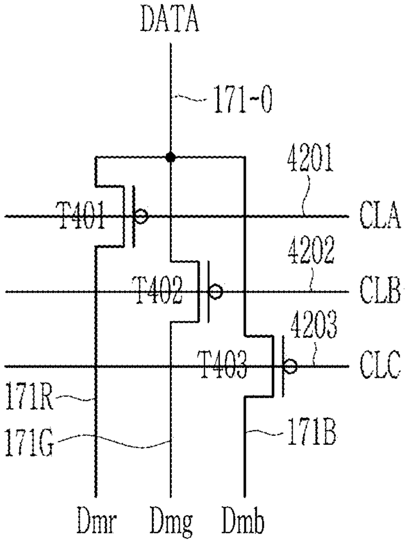
FIG. 19 is a circuit diagram of a data distribution unit according to an embodiment.

FIG. 19 is a circuit diagram of a data distribution unit according to an embodiment.

The demuxer Demux has one input side terminal and three output side terminals, and the signal input to the input side terminal is output to the output side terminal selected by the selection signals CLA, CLB, and CLC.

The demuxer Demux includes three transistors T401, T402, and T403, the input side terminal is connected to the main data line 170-0 to input the main data voltage DATA, and each data line 171R, 171G, and 171B is connected to the output side terminal.

In the 401 transistor T401, the gate electrode is connected to the first selective line 4201, the input side terminal is connected to the main data line 170-0, and the output side terminal is connected to the red data line 171R. The 401 transistor T401 selects a portion of the main data voltage DATA by the CLA selection signal applied to the first selective line 4201 and applies it to the red data line 171R as the data voltage Dmr.

The 402 transistor T402 includes the gate electrode connected to the second selective line 4202, the input side terminal connected to the main data line 170-0, and the output side terminal connected to the green data line 171G. The 402 transistor T402 selects a part of the main data voltage DATA by the CLB selection signal applied to the second selective line 4202 to be applied to the green data line 171G as the data voltage Dmg.

The 403 transistor T403 has the gate electrode connected to the third selective line 4203, the input side terminal connected to the main data line 170-0, and the output side terminal connected to the blue data line 171B. The 403 transistor T403 selects a part of the main data voltage DATA by the CLC selection signal applied to the third selective line 4203 to be applied to the blue data line 171B as the data voltage Dmb.

As a result, if the main data voltage DATA is input, the demuxer Demux applies the data voltages Dmr, Dmg, and Dmb divided by the selection signal CLA, CLB, and CLC to each data line 171R, 171G, and 171B. The selection signals CLA, CLB, and CLC according to the present embodiment are shown in FIG. 22, and the low voltages do not overlap each other. As a result, the data voltages Dmr, Dmg, and Dmb applied to each data line 171R, 171G, and 171B through the Demux do not overlap in time. Also, according to FIG. 22, all three selection signals CLA, CLB, the CLC are applied within a period of 1H.

Hereinafter, a structure of the demuxer Demux is described with reference to FIGS. 20 and 21.

Figure 20:
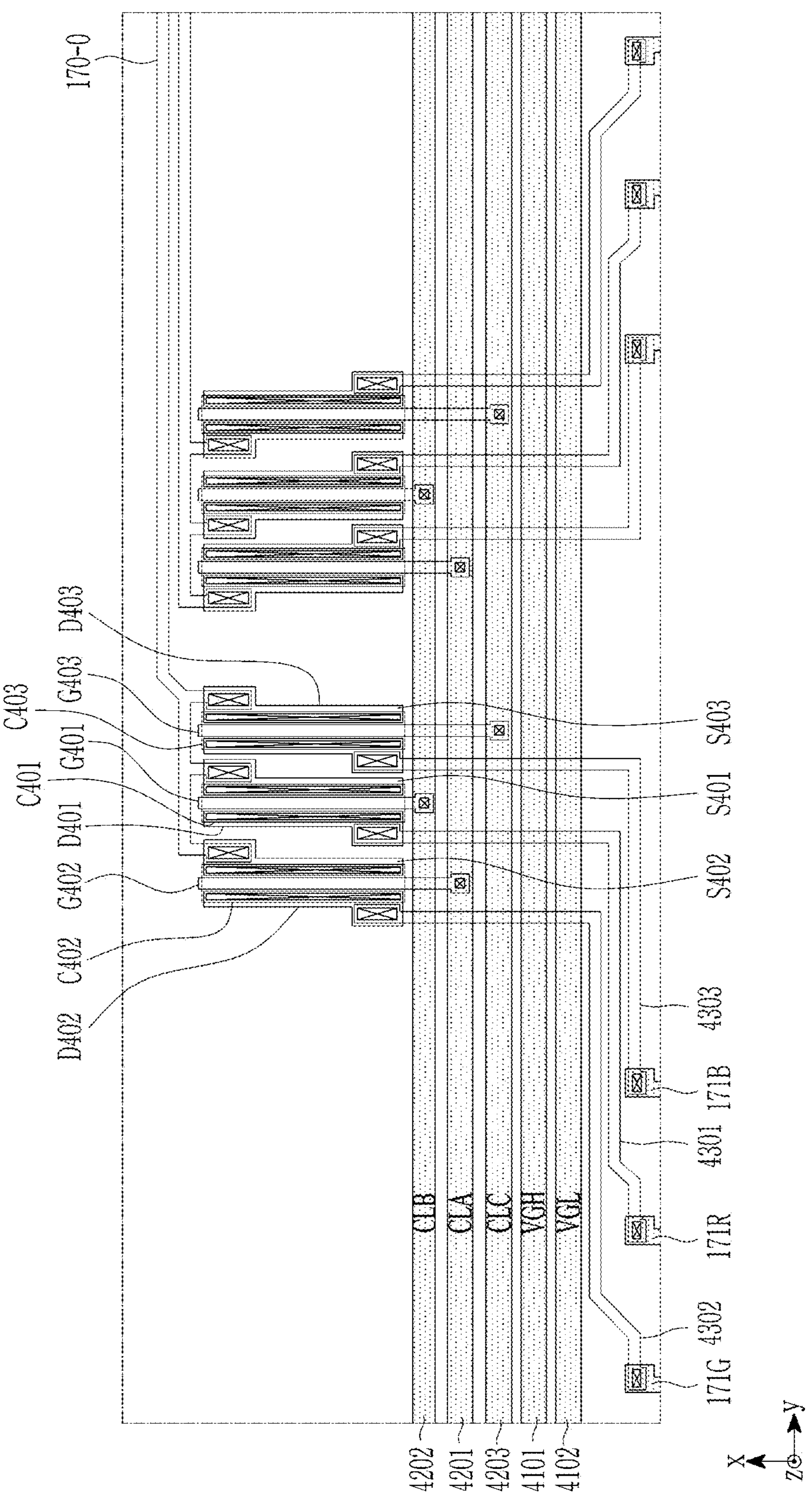
FIG. 20 is a layout view of a data distribution unit according to an embodiment.

FIG. 20 is a layout view of a data distribution unit according to an embodiment. FIG. 21 is a cross-sectional view of a data distribution unit according to an embodiment.

In FIG. 20, the mark represented by x in the square indicates the opening positioned in the insulating layer, so that the upper conductive layer and the lower conductive layer are electrically connected to each other.

Figure 21:
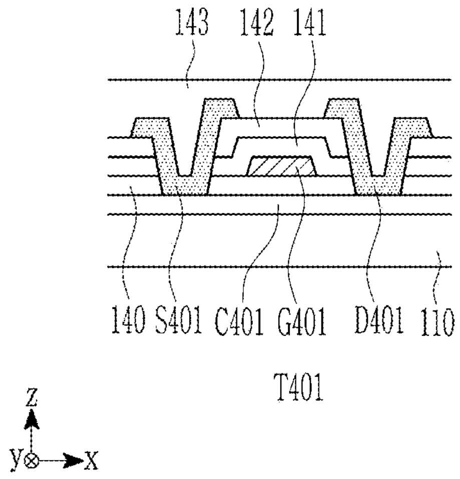
FIG. 21 is a cross-sectional view of a data distribution unit according to an embodiment.

Each transistor included in the demuxer Demux, like the 401 transistor T401 shown in FIG. 21, includes the semiconductor layer C401, the first insulating layer 140, and the gate electrode G401 positioned on the substrate 110, the channel is positioned at the part where the semiconductor layer C401 and the gate electrode G401 overlap, and the source and drain regions that are plasma-treated or doped and made into conductors are positioned on both sides of the channel in the semiconductor layer C401.

The gate electrode G401 of the 401 transistor T401 is extended in a straight line along the extending direction of the data lines 171R, 171G, and 171B, to be electrically connected to the first selective line 4201. The semiconductor layer C401 extends along the gate electrode G401 and is wider than the gate electrode G401. The input side electrode S401 is electrically connected to the main data line 170-0, and the output side electrode D401 is electrically connected to the red data line 171R by the connection part 4301.

The gate electrode G402 of the 402 transistor T402 is extended in a straight line along the extending direction of the data lines 171R, 171G, and 171B to be electrically connected to the second selective line 4202. The semiconductor layer C402 extends along the gate electrode G402 and is wider than the gate electrode G402. The input side electrode S402 is electrically connected to the main data line 170-0, and the output side electrode D402 is electrically connected to the green data line 171G by the connection part 4302.

The gate electrode G403 of the 403 transistor T403 is extended in a straight line along the extending direction of the data lines 171R, 171G, and 171B to be electrically connected to the third selective line 4203. The semiconductor layer C403 extends along the gate electrode G403 and is wider than the width of the gate electrode G403. The input side electrode S403 is electrically connected to the main data line 170-0, and the output side electrode D403 is electrically connected to the blue data line 171B by the connection part 4303.

The selective lines 4201, 4202, and 4203 are formed in the first data conductive layer, and the main data line 170-0 and the connection parts 4301, 4302, and 4303 are formed in the first gate conductive layer.

On the other hand, in the upper region 10-4 of the light emitting display device 10, on the same layer (the first data conductive layer) as the selective lines 4201, 4202, and 4203, the high voltage wiring 4101 to which the high voltage VGH is applied and the low voltage wiring 4102 to which the low voltage VGL is applied are also formed. The high voltage wiring 4101 and the low voltage wiring 4102 extend in parallel direction to the selective lines 4201, 4202, and 4203. The high voltage wiring 4101 and the low voltage wiring 4102 may be connected to the stage for the light emission signal or the stage for the scan signal to apply the high voltage VGH and the low voltage VGL. Also, according to an embodiment, the high voltage wiring 4101 and low voltage wiring 4102 may be wiring that applies the driving voltage ELVDD or the driving low voltage ELVSS applied to the pixel circuit unit PXC or the unit light emitting diode (LED) LDU.

FIG. 22 shows the signal applied to the data distribution unit and each signal generating unit and the output signal.

FIG. 22 is a waveform diagram of signals applied to a stage for a light emission signal, a stage for a scan signal, and a data distribution unit, and output signals thereto according to an embodiment.

The overall operation of the light emitting display device 10 is described as follows with reference to FIG. 22.

In the stage for the light emission signal EMS, while outputting the light emission control signal Em(n) having the high voltage, the first scan signal GW(n) and the second scan signal GI(n) having the low voltage of three times are output in the stage for the scan signal used as the stage for the first scan signal GWS and the stage for the second scan signal GIS, the bypass signal GB(n) having the low voltage of one time is output in the stage for the scan signal used as the stage GBS for the bypass signal.

The first scan signal GW(n) of the low voltage is applied after 1H in which the low voltage second scan signal GI(n) is applied, and the bypass signal GB(n) of the low voltage is applied after 1H in which the first scan signal GW(n) of the third low voltage is applied.

For three selection signals CLA, CLB, and CLC applied to the demuxer Demux, the selection signal of the low voltage is applied every 1H, and all three selection signals CLA, CLB, and CLC are sequentially applied within a period of 1H. The low voltage periods of three selection signals CLA, CLB, and CLC do not overlap each other.

As a result, if the data voltages Dmr, Dmg, and Dmb are applied to each of the three data lines 171R, 171G, and 171B within 1H by three selection signals CLA, CLB, and CLC, and when the first scan signal GW(n) of the low voltage is applied, they are accepted into the pixel circuit unit PXC. For example, the second transistor T2 of the pixel circuit unit PXC is turned on by the first scan signal GW(n), and the corresponding data voltages Dmr, Dmg, and Dmb are input to the pixel circuit unit PXC. The data voltages Dmr, Dmg, and Dmb applied to the data lines 171R, 171G, and 171B when the first scan signal GW(n) of the third low voltage is applied are the data voltages Dmr, Dmg, and Dmb of the corresponding pixel circuit unit PXC, and if the light emission control signal Em(n) is changed into the low voltage, the output current is generated depending on the data voltages Dmr, Dmg, and Dmb to be output to the unit light emitting diode (LED) LDU.

Hereinafter, the display quality according to a presence or absence of the dummy opening 60 is compared and examined with reference to FIGS. 23 and 24.

Figure 23:
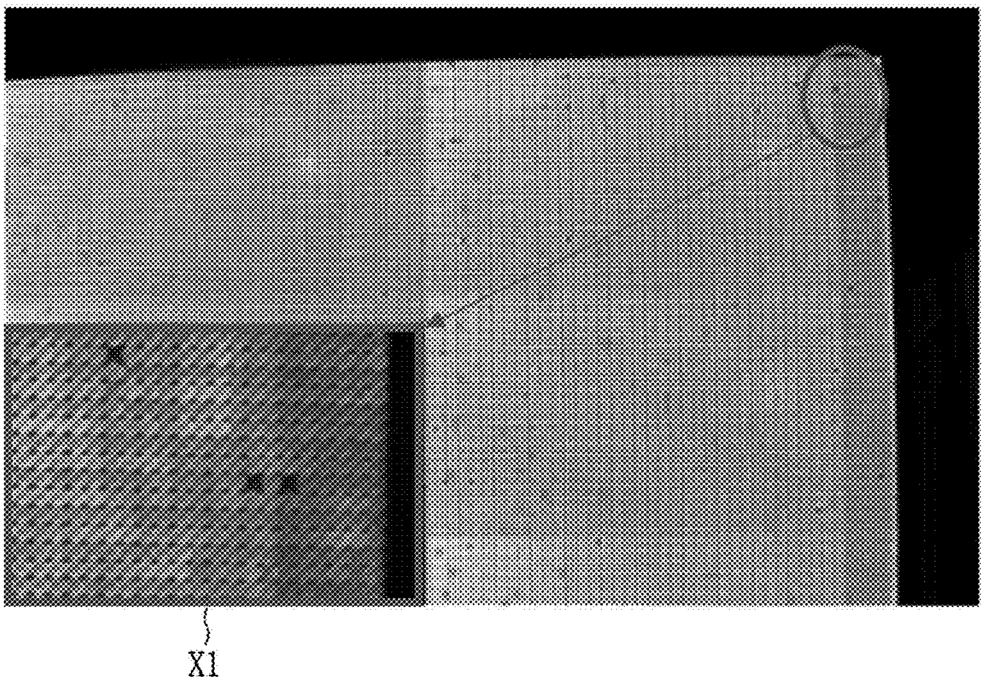
FIG. 23 is a view showing a display luminance difference of a light emitting display device according to a comparative example.

FIG. 23 is a view showing a display luminance difference of a light emitting display device according to a comparative example. FIG. 24 is a view showing that a display luminance of a light emitting display device is uniform according to an embodiment.

Figure 24:
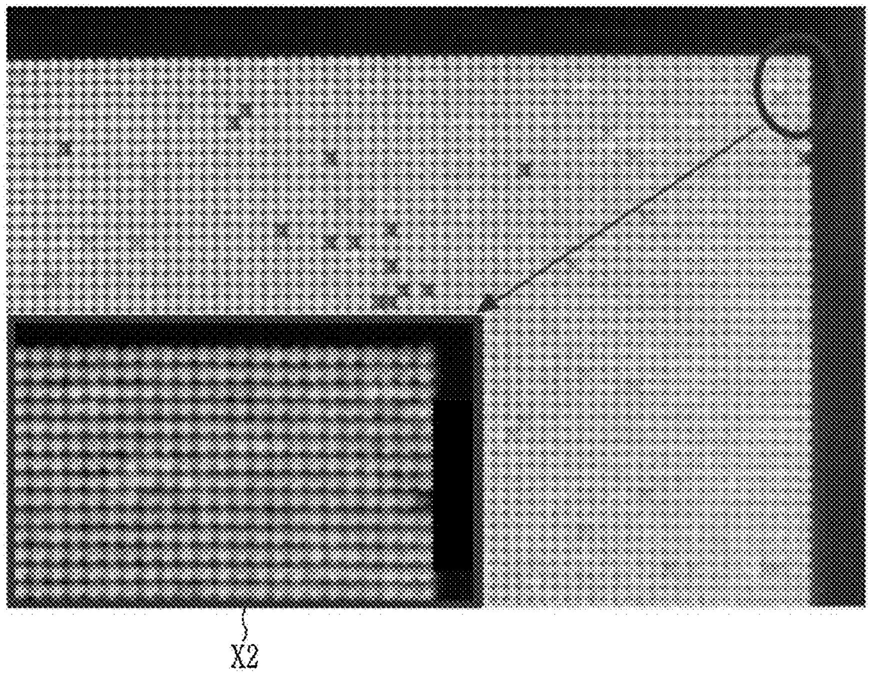
FIG. 24 is a view showing a display luminance of a light emitting display device is uniform according to an embodiment.

First, the comparative example of FIG. 23 is a light emitting display device in which the dummy opening 60 is not formed in the structure of FIG. 10, and the embodiment of FIG. 24 is an embodiment in which the dummy opening 60 is formed as shown in FIG. 5 as the embodiment of FIG. 10.

FIG. 23 shows a picture taken on the right side of the light emitting display device according to the comparative example and a part X1 with an enlarged picture of the right-upper side corner part. As confirmed in FIG. 23, it may be seen that there are parts with different colors or luminance along the right side in the comparative example although the data voltage was applied to display the same color or luminance. In FIG. 23, the part with the different color or luminance is the right region 10-3 in which a plurality of signal generating unit is positioned, compared with the central region 10-1, and as a plurality of signal generating units are further formed, display defects due to hydrogen accumulated in the semiconductor layer in the pixel circuit unit PXC are more easily recognized.

In FIG. 24, a picture taken on the right side of the light emitting display device 10 according to an embodiment and a part X2 with an enlarged picture of the right-upper side corner are shown. In FIG. 24, compared with FIG. 23, it may be confirmed that the part with different color and luminance does appear. That is, in the embodiment, since the dummy opening 60 is formed, and hydrogen does not accumulate in the semiconductor layer, even if a plurality of signal generating units are positioned adjacent to the pixel circuit unit PXC in the right region 10-3 of the light emitting display device 10, the pixel circuit unit PXC is not affected, so that a constant output current may be generated. As a result, the display does not deteriorate.

In the light emitting display device 10 as described above, as confirmed in FIGS. 2 to 4, the unit light emitting diode (LED) LDU is positioned on the outermost side of the light emitting display device 10. For instance, the unit light emitting diode (LED) LDU is positioned outside a plurality of signal generating units, the static electricity prevention unit ESD, and the demuxer Demux so it may be seen that the non-display area is very narrow. Accordingly, even if a large-size display device is formed by attaching a plurality of the light emitting display device 10 of the some embodiments, the image may be continuously displayed without the non-display area in the portion to which the light emitting display device 10 is attached.

Hereinafter, the large-size display device formed by attaching a plurality of light emitting display devices 10 is described with reference to FIG. 25.

Figure 25:
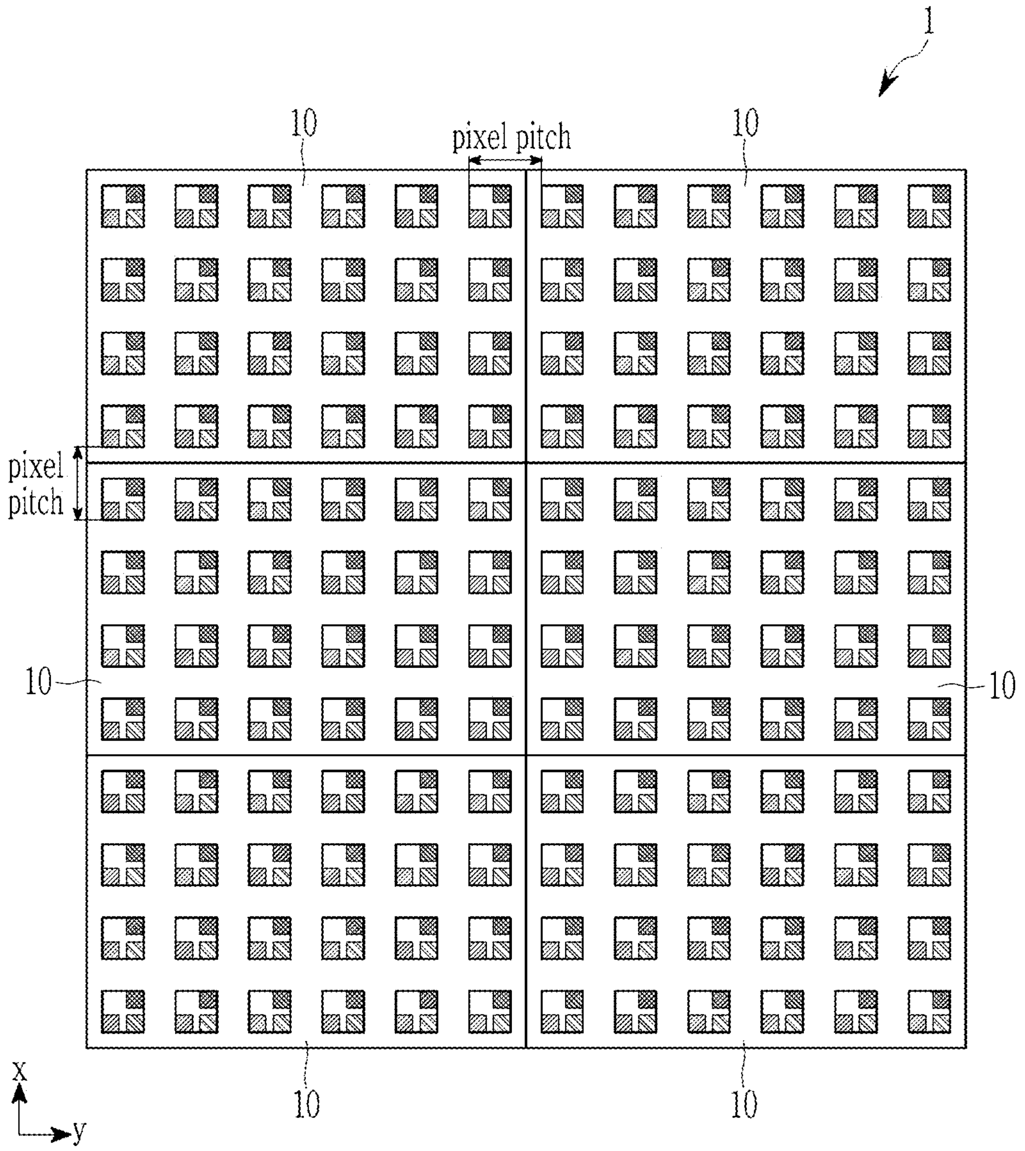
FIG. 25 is a schematic view of a large-sized display device according to an embodiment.

FIG. 25 is a schematic view of a large-sized display device according to an embodiment.

As shown in FIG. 25, the large-size display device 1 is formed by attaching a plurality of light emitting display devices 10. In the embodiment of FIG. 25, six light emitting display devices 10 are attached. However, according to an embodiment, two or more light emitting display devices 10 may be attached to form the large-size display device 1.

In the light emitting display device 10 according to the embodiment of FIGS. 1 to 22, as shown in FIGS. 3 and 4, the unit light emitting diode (LED) LDU of the first row and the unit light emitting diode (LED) LDU of the final row are positioned outside the driver unit (the static electricity prevention unit ESD and/or the demuxer Demux), so the non-display area may not exist.

Also, referring to FIG. 2, in the left region 10-2, in the leftmost column at the outermost, the unit light emitting diode (LED) LDU is positioned, and a plurality of signal generating units EMS, GBS, GIS, and GWS are positioned between the unit light emitting diodes (LEDs) LDU. As a result, there is almost no non-display area in the left region 10-2, and almost no non-display area exists in the right region 10-3, which is symmetrical to this.

Therefore, even if a plurality of light emitting display devices 10 according to some embodiments are attached to any side of the top/bottom/left/right sides, there is no (or substantially no) non-display area positioned between the two light emitting display devices 10, so the images may be continuously displayed.

In addition, if the interval between the unit light emitting diode (LED) LDU arranged in the light emitting display device 10 and the end of the substrate 110 is set to be equal to half the interval of the arranged unit light emitting diodes (LEDs) LDU, and even if a plurality of unit light emitting diode (LED) LDUs are attached, the interval between the unit light emitting diodes (LEDs) LDU may be constant. At this time, the interval between the unit light emitting diode (LED) LDU and the end of the substrate 110 may be narrower than half the interval between the unit light emitting diodes (LEDs) LDU, thereby the unit light emitting diodes (LED) LDU may be spaced evenly by considering a thickness of an attachment material used for attaching the unit light emitting diode (LED). As a result, it is difficult for the user to recognize that a plurality of light emitting display devices 10 are attached.

Hereinafter, the shape and positioned of the dummy opening 60 to be formed according to some embodiments are described with reference to FIGS. 26 to 28.

FIGS. 26 to 28 are views showing various arrangements of a dummy opening according to some embodiments.

The dummy opening 60 shown in FIG. 26 is a dummy opening 60 pattern formed by using the mask that forms the opening positioned on the pixel circuit unit PXC of FIG. 7 as it is.

The dummy opening 60 shown in FIG. 27 is a dummy opening 60 pattern formed by using the mask that forms the opening positioned on the stage for the light emission signal of FIG. 14 as it is.

The dummy opening 60 shown in FIG. 28 is a dummy opening 60 pattern formed by using the mask that forms the opening positioned on the stage for the scan signal of FIG. 17 as it is.

The dummy opening 60 pattern positioned in FIGS. 26 to 28 may be formed except for the pixel circuit unit forming region PXCA in which the pixel circuit unit PXC is formed and the region in which the pixel output test unit PXCT is formed. Therefore, the dummy opening 60 may be formed in the region where the unit light emitting diode (LED) LDU is attached (referring to LDUA in FIG. 12), the data line extending region DLA, and the signal line extending region SLA, and the dummy opening 60 pattern may be formed even in areas where nothing is formed. Here, the part where nothing is formed means a region where only the insulating layer is formed and the dummy opening 60 may be formed in the insulating layer. The dummy opening 60 pattern may be formed in at least one of the above regions.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A light emitting display device comprising:
- a pixel circuit unit configured to generate an output current;
- a data distribution unit configured to apply a data voltage to the pixel circuit unit through a data line;
- a plurality of signal generating units respectively configured to apply a scan signal and a light emission control signal to the pixel circuit unit through a plurality of signal lines;
- a unit light emitting diode configured to receive the output current of the pixel circuit unit and electrically connected to the pixel circuit unit; and
- a dummy opening formed between the pixel circuit unit and the unit light emitting diode.

2. The light emitting display device of claim 1, further comprising:
- a signal line extending region where a plurality of signal lines extend in a second direction, the second direction crossing a first direction in which the data line extends,
- wherein the pixel circuit unit and the signal line extending region are formed to be repeated along the second direction; and
- wherein the plurality of signal lines comprise a first scan line, a second scan line, a bypass control line, and a light emission signal line;
- wherein the plurality of signal generating units comprise:
- a first stage configured to transmit a first scan signal to the first scan line;
- a second stage configured to transmit a second scan signal to the second scan line;
- a third stage configured to transmit a bypass signal to the bypass control line; and
- a fourth stage configured to transmit a light emission signal to the light emission signal line;
- each of the first to fourth stages is positioned between two adjacent unit light emitting diodes; and
- a same stage for each of the first scan signal, the second scan signal, the bypass signal, and the light emission signal is arranged along the first direction and is positioned in a left region or a right region of the light emitting display device.

3. The light emitting display device of claim 2, wherein:
- the unit light emitting diode comprises a red light emitting diode, a green light emitting diode, and a blue light emitting diode; and
- the pixel circuit unit comprises:
- a red pixel circuit unit, a green pixel circuit unit, and a blue pixel circuit unit;
- a red diode connection part electrically connecting the red light emitting diode and the red pixel circuit unit;
- a green diode connection part electrically connecting the green light emitting diode and the green pixel circuit unit; and
- a blue diode connection part electrically connecting the blue light emitting diode and the blue pixel circuit unit.

4. The light emitting display device of claim 3, wherein:
- the red diode connection part, the green diode connection part, and the blue diode connection part respectively comprise a red anode corresponding pad, a green anode corresponding pad, and a blue anode corresponding pad.

5. The light emitting display device of claim 2, wherein:
- the pixel circuit unit and the unit light emitting diode have a unit pixel arrangement structure; and
- the unit pixel arrangement structure comprises:
- the pixel circuit units being arranged in two rows; and
- the unit light emitting diode electrically connected to the pixel circuit unit in one row being positioned one row by one row on both sides of the pixel circuit units in two rows.

6. The light emitting display device of claim 5, further comprising:
- a data line extending region where the data line extends in the first direction,
- wherein the unit light emitting diode, the pixel circuit unit, a pixel circuit unit of a next row, a unit light emitting diode of the next row, and the data line extending region are sequentially positioned along the first direction.

7. The light emitting display device of claim 2, wherein:
- among the first to fourth stages positioned in the left region or the right region, the fourth stage is positioned in an outermost side region; and
- the third stage, the second stage, and the first stage are sequentially positioned toward an inside region with respect to the outermost side region.

8. The light emitting display device of claim 2, further comprising:
- a pixel output test unit positioned between two unit light emitting diodes adjacent in the second direction,
- wherein the pixel output test unit comprises an eighth transistor, the pixel output test unit being positioned in an oblique direction in a pixel circuit unit forming region where the pixel circuit unit is positioned.

9. The light emitting display device of claim 8, wherein:
- in the left region or the right region, the pixel output test unit and at least one of the first to fourth stages are alternately positioned between two of the unit light emitting diodes adjacent in the second direction.

10. The light emitting display device of claim 9, wherein:
- in a central region between the left region and the right region, a dummy driver having a same pattern and dummy opening as at least one of the first to fourth stages is positioned in the region where the at least one of the first to fourth stages is positioned.

11. The light emitting display device of claim 9, wherein:
- the region where the dummy opening is formed is positioned in the region where the unit light emitting diode is attached, and where the data line extending region, the signal line extending region, and the region where nothing is formed except at least one insulating layer.

12. The light emitting display device of claim 11, wherein:
- the dummy opening is one of a plurality of dummy openings, each of the plurality of dummy openings being of a constant size; and
- the plurality of dummy openings is formed in the region where the pixel circuit unit, the data distribution unit, and a plurality of signal generating units are not positioned according to a matrix, or the dummy opening is formed using a mask used to form the pixel circuit unit or the plurality of signal generating units.

13. The light emitting display device of claim 11, wherein:

the data distribution unit comprises a plurality of demuxers;

the light emitting display device further comprises a static electricity prevention unit positioned adjacent to the plurality of demuxers; and in a plan view, the dummy openings are spaced apart from the plurality of demuxers and the static electricity prevention unit.

* * * * *